US008275897B2

(12) United States Patent
Fallon

(10) Patent No.: US 8,275,897 B2
(45) Date of Patent: *Sep. 25, 2012

(54) SYSTEM AND METHODS FOR ACCELERATED DATA STORAGE AND RETRIEVAL

(75) Inventor: James J. Fallon, Armonk, NY (US)

(73) Assignee: Realtime Data, LLC, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/400,008

(22) Filed: Apr. 8, 2006

(65) Prior Publication Data

US 2006/0195601 A1 Aug. 31, 2006

Related U.S. Application Data

(63) Continuation of application No. 11/230,953, filed on Sep. 19, 2005, now abandoned, which is a continuation of application No. 10/628,801, filed on Jul. 28, 2003, now abandoned, which is a continuation of application No. 09/481,243, filed on Jan. 11, 2000, now Pat. No. 6,604,158, which is a continuation-in-part of application No. 09/266,394, filed on Mar. 11, 1999, now Pat. No. 6,601,104.

(51) Int. Cl.
*G06F 15/173* (2006.01)

(52) U.S. Cl. ...................................................... 709/231

(58) Field of Classification Search .................. 709/231, 709/233
See application file for complete search history.

(56) References Cited

U.S. PATENT DOCUMENTS 3,394,352 A 7/1968 Wernikoff et al.
(Continued)

FOREIGN PATENT DOCUMENTS

DE 4127518 2/1992
(Continued)

OTHER PUBLICATIONS

"Operating System Platform Abstraction Method", IBM Technical Disclosure Bulletin, Feb. 1995, vol. 38, Issue No. 2, pp. 343-344.

(Continued)

*Primary Examiner* — David Eng
(74) *Attorney, Agent, or Firm* — Sterne, Kessler, Goldstein & Fox PLLC

(57) ABSTRACT

Systems and methods for providing accelerated data storage and retrieval utilizing lossless and/or lossy data compression and decompression. A data storage accelerator includes one or a plurality of high speed data compression encoders that are configured to simultaneously or sequentially losslessly or lossy compress data at a rate equivalent to or faster than the transmission rate of an input data stream. The compressed data is subsequently stored in a target memory or other storage device whose input data storage bandwidth is lower than the original input data stream bandwidth. Similarly, a data retrieval accelerator includes one or a plurality of high speed data decompression decoders that are configured to simultaneously or sequentially losslessly or lossy decompress data at a rate equivalent to or faster than the input data stream from the target memory or storage device. The decompressed data is then output at rate data that is greater than the output rate from the target memory or data storage device. The data storage and retrieval accelerator method and system may employed: in a disk storage adapter to reduce the time required to store and retrieve data from computer to disk; in conjunction with random access memory to reduce the time required to store and retrieve data from random access memory; in a display controller to reduce the time required to send display data to the display controller or processor; and/ or in an input/output controller to reduce the time required to store, retrieve, or transmit data.

46 Claims, 20 Drawing Sheets

U.S. PATENT DOCUMENTS

| | | |
|---|---|---|
| 3,490,690 A | 1/1970 | Apple et al. |
| 4,021,782 A | 5/1977 | Hoerning |
| 4,032,893 A | 6/1977 | Moran |
| 4,054,951 A | 10/1977 | Jackson et al. |
| 4,127,518 A | 11/1978 | Coy et al. |
| 4,302,775 A | 11/1981 | Widergren et al. |
| 4,325,085 A | 4/1982 | Gooch |
| 4,360,840 A | 11/1982 | Wolfrum et al. |
| 4,386,416 A | 5/1983 | Giltner et al. |
| 4,394,774 A | 7/1983 | Widergren et al. |
| 4,464,650 A | 8/1984 | Eastman et al. |
| 4,494,108 A | 1/1985 | Langdon, Jr. et al. |
| 4,499,499 A | 2/1985 | Brickman et al. |
| 4,574,351 A | 3/1986 | Dang et al. |
| 4,593,324 A | 6/1986 | Ohkubo et al. |
| 4,626,829 A | 12/1986 | Hauck |
| 4,646,061 A | 2/1987 | Bledsoe |
| 4,682,150 A | 7/1987 | Mathes et al. |
| 4,701,745 A | 10/1987 | Waterworth |
| 4,729,020 A | 3/1988 | Schaphorst et al. |
| 4,730,348 A | 3/1988 | MacCrisken |
| 4,745,559 A | 5/1988 | Willis et al. |
| 4,748,638 A | 5/1988 | Friedman et al. |
| 4,750,135 A | 6/1988 | Boilen |
| 4,804,959 A | 2/1989 | Makansi et al. |
| 4,813,040 A | 3/1989 | Futato |
| 4,814,746 A | 3/1989 | Miller et al. |
| 4,862,167 A | 8/1989 | Copeland, III |
| 4,866,601 A | 9/1989 | DuLac et al. |
| 4,870,415 A | 9/1989 | Van Maren et al. |
| 4,872,009 A | 10/1989 | Tsukiyama et al. |
| 4,876,541 A | 10/1989 | Storer |
| 4,888,812 A | 12/1989 | Dinan et al. |
| 4,890,282 A | 12/1989 | Lambert et al. |
| 4,897,717 A | 1/1990 | Hamilton et al. |
| 4,906,991 A | 3/1990 | Fiala et al. |
| 4,906,995 A | 3/1990 | Swanson |
| 4,929,946 A | 5/1990 | O'Brien et al. |
| 4,956,808 A | 9/1990 | Aakre et al. |
| 4,965,675 A | 10/1990 | Hori et al. |
| 4,988,998 A | 1/1991 | O'Brien |
| 5,003,307 A | 3/1991 | Whiting et al. |
| 5,016,009 A | 5/1991 | Whiting et al. |
| 5,027,376 A | 6/1991 | Friedman et al. |
| 5,028,922 A | 7/1991 | Huang |
| 5,045,848 A | 9/1991 | Fascenda |
| 5,045,852 A | 9/1991 | Mitchell et al. |
| 5,046,027 A | 9/1991 | Taaffe et al. |
| 5,049,881 A | 9/1991 | Gibson et al. |
| 5,079,630 A | 1/1992 | Golin |
| 5,091,782 A | 2/1992 | Krause et al. |
| 5,097,261 A | 3/1992 | Langdon, Jr. et al. |
| 5,103,306 A | 4/1992 | Weiman |
| 5,109,226 A | 4/1992 | MacLean, Jr. et al. |
| 5,109,433 A | 4/1992 | Notenboom |
| 5,113,522 A | 5/1992 | Dinwiddie, Jr. et al. |
| 5,115,309 A | 5/1992 | Hang |
| 5,121,342 A | 6/1992 | Szymborski |
| 5,126,739 A | 6/1992 | Whiting et al. |
| 5,128,963 A | 7/1992 | Akagiri |
| 5,132,992 A | 7/1992 | Yurt et al. |
| 5,146,221 A | 9/1992 | Whiting et al. |
| 5,150,430 A | 9/1992 | Chu |
| 5,155,484 A | 10/1992 | Chambers, IV |
| 5,159,336 A | 10/1992 | Rabin et al. |
| 5,167,034 A | 11/1992 | MacLean, Jr. et al. |
| 5,175,543 A | 12/1992 | Lantz |
| 5,179,651 A | 1/1993 | Taaffe et al. |
| 5,187,793 A | 2/1993 | Keith et al. |
| 5,191,431 A | 3/1993 | Hasegawa et al. |
| 5,204,756 A | 4/1993 | Chevion et al. |
| 5,209,220 A | 5/1993 | Hiyama et al. |
| 5,212,742 A | 5/1993 | Normile et al. |
| 5,226,176 A | 7/1993 | Westaway et al. |
| 5,227,893 A | 7/1993 | Ett |
| 5,231,492 A | 7/1993 | Dangi et al. |
| 5,237,460 A | 8/1993 | Miller et al. |
| 5,237,675 A | 8/1993 | Hannon, Jr. |
| 5,243,341 A | 9/1993 | Seroussi et al. |
| 5,243,348 A | 9/1993 | Jackson |
| 5,247,638 A | 9/1993 | O'Brien et al. |
| 5,247,646 A | 9/1993 | Osterlund et al. |
| 5,249,053 A | 9/1993 | Jain |
| 5,263,168 A | 11/1993 | Toms et al. |
| 5,267,333 A | 11/1993 | Aono et al. |
| 5,270,832 A | 12/1993 | Balkanski et al. |
| 5,280,600 A | 1/1994 | Van Maren et al. |
| 5,287,420 A | 2/1994 | Barrett |
| 5,289,580 A | 2/1994 | Latif et al. |
| 5,293,379 A | 3/1994 | Carr |
| 5,293,576 A | 3/1994 | Mihm, Jr. et al. |
| 5,307,497 A | 4/1994 | Feigenbaum et al. |
| 5,309,555 A | 5/1994 | Akins et al. |
| 5,319,682 A | 6/1994 | Clark |
| 5,331,425 A | 7/1994 | Ozaki et al. |
| 5,341,440 A | 8/1994 | Earl et al. |
| 5,347,600 A | 9/1994 | Barnsley et al. |
| 5,353,132 A | 10/1994 | Katsuma |
| 5,354,315 A * | 10/1994 | Armstrong ................ 607/4 |
| 5,355,498 A | 10/1994 | Provino et al. |
| 5,357,614 A | 10/1994 | Pattisam et al. |
| 5,367,629 A | 11/1994 | Chu et al. |
| 5,373,290 A | 12/1994 | Lempel et al. |
| 5,379,036 A | 1/1995 | Storer |
| 5,379,757 A | 1/1995 | Hiyama et al. |
| 5,381,145 A | 1/1995 | Allen et al. |
| 5,389,922 A | 2/1995 | Seroussi et al. |
| 5,394,534 A | 2/1995 | Kulakowski et al. |
| 5,396,228 A | 3/1995 | Garahi |
| 5,400,401 A | 3/1995 | Wasilewski et al. |
| 5,403,639 A | 4/1995 | Belsan et al. |
| 5,406,278 A | 4/1995 | Graybill et al. |
| 5,406,279 A | 4/1995 | Anderson et al. |
| 5,410,671 A | 4/1995 | Elgamal et al. |
| 5,412,384 A | 5/1995 | Chang et al. |
| 5,414,850 A | 5/1995 | Whiting |
| 5,420,639 A | 5/1995 | Perkins |
| 5,434,983 A | 7/1995 | Yaso et al. |
| 5,437,020 A | 7/1995 | Wells et al. |
| 5,452,287 A | 9/1995 | DiCecco |
| 5,454,079 A | 9/1995 | Roper et al. |
| 5,454,107 A | 9/1995 | Lehman et al. |
| 5,455,576 A | 10/1995 | Clark, II et al. |
| 5,455,578 A | 10/1995 | Bhandari |
| 5,455,680 A | 10/1995 | Shin |
| 5,461,679 A | 10/1995 | Normile et al. |
| 5,463,390 A | 10/1995 | Whiting et al. |
| 5,467,087 A | 11/1995 | Chu |
| 5,471,206 A | 11/1995 | Allen et al. |
| 5,475,388 A | 12/1995 | Gormish et al. |
| 5,479,587 A | 12/1995 | Campbell et al. |
| 5,479,633 A | 12/1995 | Wells et al. |
| 5,483,470 A | 1/1996 | Alur et al. |
| 5,486,826 A | 1/1996 | Remillard |
| 5,488,364 A | 1/1996 | Cole |
| 5,488,365 A | 1/1996 | Seroussi et al. |
| 5,495,244 A | 2/1996 | Jeong et al. |
| 5,504,842 A | 4/1996 | Gentile |
| 5,506,844 A | 4/1996 | Rao |
| 5,506,872 A | 4/1996 | Mohler |
| 5,506,944 A | 4/1996 | Gentile |
| 5,521,940 A | 5/1996 | Lane et al. |
| 5,528,628 A | 6/1996 | Park et al. |
| 5,530,845 A | 6/1996 | Hiatt |
| 5,533,051 A | 7/1996 | James |
| 5,535,311 A | 7/1996 | Zimmerman |
| 5,535,356 A | 7/1996 | Kim et al. |
| 5,535,369 A | 7/1996 | Wells et al. |
| 5,537,658 A | 7/1996 | Bakke et al. |
| 5,539,865 A | 7/1996 | Gentile |
| 5,542,031 A | 7/1996 | Douglass et al. |
| 5,544,290 A | 8/1996 | Gentile |
| 5,546,395 A | 8/1996 | Sharma et al. |
| 5,546,475 A | 8/1996 | Bolle et al. |
| 5,553,160 A | 9/1996 | Dawson |
| 5,557,551 A | 9/1996 | Craft |
| 5,557,668 A | 9/1996 | Brady |

| | | |
|---|---|---|
| 5,557,749 A | 9/1996 | Norris |
| 5,561,421 A | 10/1996 | Smith et al. |
| 5,561,824 A | 10/1996 | Carreiro et al. |
| 5,563,961 A | 10/1996 | Rynderman et al. |
| 5,574,952 A | 11/1996 | Brady et al. |
| 5,574,953 A | 11/1996 | Rust et al. |
| 5,576,953 A | 11/1996 | Hugentobler |
| 5,577,248 A | 11/1996 | Chambers, IV |
| 5,581,715 A | 12/1996 | Verinsky et al. |
| 5,583,500 A | 12/1996 | Allen et al. |
| 5,586,264 A | 12/1996 | Belknap et al. |
| 5,586,285 A | 12/1996 | Hasbun et al. |
| 5,590,306 A | 12/1996 | Watanabe et al. |
| 5,596,674 A | 1/1997 | Bhandari et al. |
| 5,598,388 A | 1/1997 | Van Maren et al. |
| 5,604,824 A | 2/1997 | Chui et al. |
| 5,606,706 A | 2/1997 | Takamoto et al. |
| 5,610,657 A | 3/1997 | Zhang |
| 5,611,024 A | 3/1997 | Campbell et al. |
| 5,612,788 A | 3/1997 | Stone |
| 5,613,069 A | 3/1997 | Walker |
| 5,615,017 A | 3/1997 | Choi et al. |
| 5,615,287 A | 3/1997 | Fu et al. |
| 5,619,995 A | 4/1997 | Lobodzinski |
| 5,621,820 A | 4/1997 | Rynderman et al. |
| 5,623,623 A | 4/1997 | Kim et al. |
| 5,623,701 A | 4/1997 | Bakke et al. |
| 5,627,534 A | 5/1997 | Craft |
| 5,627,995 A | 5/1997 | Miller et al. |
| 5,629,732 A | 5/1997 | Moskowitz et al. |
| 5,630,092 A | 5/1997 | Carreiro et al. |
| 5,635,632 A | 6/1997 | Fay et al. |
| 5,635,932 A | 6/1997 | Shinagawa et al. |
| 5,638,498 A | 6/1997 | Tyler et al. |
| 5,640,158 A | 6/1997 | Okayama et al. |
| 5,642,506 A | 6/1997 | Lee |
| 5,649,032 A | 7/1997 | Burt et al. |
| 5,652,795 A | 7/1997 | Dillon et al. |
| 5,652,857 A | 7/1997 | Shimoi et al. |
| 5,652,917 A | 7/1997 | Maupin et al. |
| 5,654,703 A | 8/1997 | Clark, II |
| 5,655,138 A | 8/1997 | Kikinis |
| 5,666,560 A | 9/1997 | Moertl et al. |
| 5,668,737 A | 9/1997 | Iler |
| 5,671,355 A | 9/1997 | Collins |
| 5,671,389 A | 9/1997 | Saliba |
| 5,671,413 A | 9/1997 | Shipman et al. |
| 5,673,370 A | 9/1997 | Laney |
| 5,675,333 A | 10/1997 | Boursier et al. |
| 5,675,789 A | 10/1997 | Ishii et al. |
| 5,686,916 A | 11/1997 | Bakhmutsky |
| 5,692,159 A | 11/1997 | Shand |
| 5,694,619 A | 12/1997 | Konno |
| 5,696,927 A | 12/1997 | MacDonald et al. |
| 5,703,793 A | 12/1997 | Wise et al. |
| 5,708,511 A | 1/1998 | Gandhi et al. |
| 5,715,477 A | 2/1998 | Kikinis |
| 5,717,393 A | 2/1998 | Nakano et al. |
| 5,717,394 A * | 2/1998 | Schwartz et al. ............... 341/51 |
| 5,719,862 A | 2/1998 | Lee et al. |
| 5,721,958 A | 2/1998 | Kikinis |
| 5,724,475 A | 3/1998 | Kirsten |
| 5,729,228 A | 3/1998 | Franaszek et al. |
| 5,740,395 A | 4/1998 | Wells et al. |
| 5,742,773 A | 4/1998 | Blomfield-Brown et al. |
| 5,748,904 A | 5/1998 | Huang et al. |
| 5,757,852 A | 5/1998 | Kericevic et al. |
| 5,764,774 A | 6/1998 | Liu |
| 5,765,027 A | 6/1998 | Wang et al. |
| 5,767,898 A | 6/1998 | Urano et al. |
| 5,768,445 A | 6/1998 | Troeller et al. |
| 5,768,525 A | 6/1998 | Kralowetz et al. |
| 5,771,340 A | 6/1998 | Nakazato et al. |
| 5,774,715 A | 6/1998 | Madany et al. |
| 5,778,411 A | 7/1998 | DeMoss et al. |
| 5,781,767 A | 7/1998 | Inoue et al. |
| 5,784,572 A | 7/1998 | Rostoker et al. |
| 5,787,487 A | 7/1998 | Hashimoto et al. |
| 5,794,229 A | 8/1998 | French et al. |
| 5,796,864 A | 8/1998 | Callahan |
| 5,799,110 A | 8/1998 | Israelsen et al. |
| 5,805,834 A | 9/1998 | McKinley et al. |
| 5,805,932 A | 9/1998 | Kawashima et al. |
| 5,808,660 A | 9/1998 | Sekine et al. |
| 5,809,176 A | 9/1998 | Yajima |
| 5,809,299 A | 9/1998 | Cloutier et al. |
| 5,809,337 A | 9/1998 | Hannah et al. |
| 5,812,195 A | 9/1998 | Zhang |
| 5,812,789 A | 9/1998 | Diaz |
| 5,818,368 A | 10/1998 | Langley |
| 5,818,369 A | 10/1998 | Withers |
| 5,818,530 A | 10/1998 | Canfield et al. |
| 5,819,215 A | 10/1998 | Dobson et al. |
| 5,822,781 A | 10/1998 | Wells et al. |
| 5,825,424 A | 10/1998 | Canfield et al. |
| 5,825,830 A | 10/1998 | Kopf |
| 5,832,037 A | 11/1998 | Park |
| 5,832,126 A | 11/1998 | Tanaka |
| 5,832,443 A | 11/1998 | Kolesnik et al. |
| 5,835,788 A | 11/1998 | Blumer et al. |
| 5,836,003 A | 11/1998 | Sadeh |
| 5,838,821 A | 11/1998 | Matsubara |
| 5,838,996 A | 11/1998 | deCarmo |
| 5,839,100 A | 11/1998 | Wegener |
| 5,841,979 A | 11/1998 | Schulhof et al. |
| 8,385,927 | 11/1998 | Gillon |
| 5,847,762 A | 12/1998 | Canfield et al. |
| 5,850,565 A | 12/1998 | Wightman |
| 5,861,824 A | 1/1999 | Ryu et al. |
| 5,861,920 A | 1/1999 | Mead et al. |
| 5,864,342 A * | 1/1999 | Kajiya et al. ............... 345/418 |
| 5,864,678 A | 1/1999 | Riddle |
| 5,867,167 A | 2/1999 | Deering |
| 5,867,602 A * | 2/1999 | Zandi et al. ............... 382/248 |
| 5,870,036 A | 2/1999 | Franaszek et al. |
| 5,870,087 A | 2/1999 | Chau |
| 5,872,530 A | 2/1999 | Domyo et al. |
| 5,874,907 A | 2/1999 | Craft |
| 5,883,975 A | 3/1999 | Narita et al. |
| 5,884,269 A | 3/1999 | Cellier et al. |
| 5,886,655 A | 3/1999 | Rust |
| 5,887,165 A | 3/1999 | Martel et al. |
| 5,889,961 A | 3/1999 | Dobbek |
| 5,892,847 A | 4/1999 | Johnson |
| 5,907,801 A | 5/1999 | Albert et al. |
| 5,909,557 A | 6/1999 | Betker et al. |
| 5,909,559 A | 6/1999 | So |
| 5,915,079 A | 6/1999 | Vondran, Jr. et al. |
| 5,917,438 A | 6/1999 | Ando |
| 5,918,068 A | 6/1999 | Shafe' |
| 5,918,225 A | 6/1999 | White et al. |
| 5,920,326 A | 7/1999 | Rentschler et al. |
| 5,923,860 A | 7/1999 | Olarig |
| 5,930,358 A | 7/1999 | Rao |
| 5,936,616 A | 8/1999 | Torborg, Jr. et al. |
| 5,938,737 A | 8/1999 | Smallcomb et al. |
| 5,943,692 A | 8/1999 | Marberg et al. |
| 5,945,933 A | 8/1999 | Kalkstein |
| 5,949,355 A | 9/1999 | Panaoussis |
| 5,949,968 A | 9/1999 | Gentile |
| 5,951,623 A | 9/1999 | Reynar et al. |
| 5,955,976 A | 9/1999 | Heath |
| 5,956,490 A | 9/1999 | Buchholz et al. |
| 5,960,465 A | 9/1999 | Adams |
| 5,964,842 A | 10/1999 | Packard |
| 5,968,149 A | 10/1999 | Jaquette et al. |
| 5,969,927 A | 10/1999 | Schirmer et al. |
| 5,973,630 A | 10/1999 | Heath |
| 5,974,235 A | 10/1999 | Nunally et al. |
| 5,974,387 A | 10/1999 | Kageyama |
| 5,974,471 A | 10/1999 | Belt |
| 5,978,483 A | 11/1999 | Thompson, Jr. et al. |
| 5,982,360 A | 11/1999 | Wu et al. |
| 5,982,723 A | 11/1999 | Kamatani |
| 5,982,937 A | 11/1999 | Accad |
| 5,987,022 A | 11/1999 | Geiger et al. |
| 5,987,432 A | 11/1999 | Zusman et al. |
| 5,987,590 A | 11/1999 | Wing So |

| | | | |
|---|---|---|---|
| 5,990,884 A | 11/1999 | Douma et al. | |
| 5,991,515 A | 11/1999 | Fall et al. | |
| 5,996,033 A | 11/1999 | Chiu-Hao | |
| 6,000,009 A | 12/1999 | Brady | |
| 6,002,411 A | 12/1999 | Dye | |
| 6,003,115 A | 12/1999 | Spear et al. | |
| 6,008,743 A | 12/1999 | Jaquette | |
| 6,011,901 A | 1/2000 | Kirsten | |
| 6,014,694 A | 1/2000 | Aharoni et al. | |
| 6,021,433 A | 2/2000 | Payne | |
| 6,023,755 A | 2/2000 | Casselman | |
| 6,026,217 A | 2/2000 | Adiletta | |
| 6,028,725 A | 2/2000 | Blumenau | |
| 6,031,939 A | 2/2000 | Gilbert et al. | |
| 6,032,148 A | 2/2000 | Wilkes | |
| 6,032,197 A | 2/2000 | Birdwell | |
| 6,038,346 A | 3/2000 | Ratnakar | |
| 6,058,459 A | 5/2000 | Owen et al. | |
| 6,061,398 A | 5/2000 | Satoh et al. | |
| 6,061,473 A | 5/2000 | Chen et al. | |
| 6,070,179 A | 5/2000 | Craft | |
| 6,073,232 A | 6/2000 | Kroeker et al. | |
| 6,075,470 A | 6/2000 | Little et al. | |
| 6,078,958 A | 6/2000 | Echeita et al. | |
| 6,091,777 A * | 7/2000 | Guetz et al. | 375/240.11 |
| 6,092,123 A | 7/2000 | Steffan et al. | |
| 6,094,634 A | 7/2000 | Yahagi et al. | |
| 6,097,520 A | 8/2000 | Kadnier | |
| 6,097,845 A | 8/2000 | Ng et al. | |
| 6,098,114 A | 8/2000 | McDonald et al. | |
| 6,104,389 A | 8/2000 | Ando | |
| 6,105,130 A | 8/2000 | Wu et al. | |
| 6,115,384 A | 9/2000 | Parzych | |
| 6,128,412 A | 10/2000 | Satoh | |
| 6,134,631 A | 10/2000 | Jennings, III | |
| 6,141,053 A | 10/2000 | Saukkonen | |
| 6,145,020 A | 11/2000 | Barnett | |
| 6,145,069 A | 11/2000 | Dye | |
| 6,169,241 B1 | 1/2001 | Shimizu | |
| 6,170,007 B1 | 1/2001 | Venkatraman et al. | |
| 6,170,047 B1 | 1/2001 | Dye | |
| 6,170,049 B1 | 1/2001 | So | |
| 6,172,936 B1 | 1/2001 | Kitazaki | |
| 6,173,381 B1 | 1/2001 | Dye | |
| 6,175,650 B1 | 1/2001 | Sindhu et al. | |
| 6,175,856 B1 | 1/2001 | Riddle | |
| 6,182,125 B1 | 1/2001 | Borella et al. | |
| 6,185,625 B1 | 2/2001 | Tso et al. | |
| 6,185,659 B1 | 2/2001 | Milillo et al. | |
| 6,192,082 B1 | 2/2001 | Moriarty et al. | |
| 6,192,155 B1 | 2/2001 | Fan | |
| 6,195,024 B1 | 2/2001 | Fallon | |
| 6,195,125 B1 | 2/2001 | Udagawa et al. | |
| 6,195,391 B1 | 2/2001 | Hancock et al. | |
| 6,195,465 B1 * | 2/2001 | Zandi et al. | 382/248 |
| 6,198,842 B1 | 3/2001 | Yeo | |
| 6,198,850 B1 | 3/2001 | Banton | |
| 6,208,273 B1 | 3/2001 | Dye et al. | |
| 6,215,904 B1 | 4/2001 | Lavallee | |
| 6,219,754 B1 | 4/2001 | Belt et al. | |
| 6,222,886 B1 | 4/2001 | Yogeshwar | |
| 6,225,922 B1 | 5/2001 | Norton | |
| 6,226,667 B1 | 5/2001 | Matthews et al. | |
| 6,226,740 B1 | 5/2001 | Iga | |
| 6,230,223 B1 | 5/2001 | Olarig | |
| 6,237,054 B1 | 5/2001 | Freitag, Jr. | |
| 6,243,829 B1 | 6/2001 | Chan | |
| 6,253,264 B1 | 6/2001 | Sebastian | |
| 6,272,178 B1 | 8/2001 | Nieweglowski et al. | |
| 6,272,627 B1 | 8/2001 | Mann | |
| 6,272,628 B1 | 8/2001 | Aguilar et al. | |
| 6,282,641 B1 | 8/2001 | Christensen | |
| 6,285,458 B1 | 9/2001 | Yada | |
| 6,298,408 B1 | 10/2001 | Park | |
| 6,308,311 B1 | 10/2001 | Carmichael et al. | |
| 6,309,424 B1 | 10/2001 | Fallon | |
| 6,310,563 B1 | 10/2001 | Har et al. | |
| 6,317,714 B1 | 11/2001 | Del Castillo et al. | |
| 6,317,818 B1 | 11/2001 | Zwiegincew et al. | |
| 6,330,622 B1 | 12/2001 | Schaefer | |
| 6,333,745 B1 | 12/2001 | Shimomura et al. | |
| 6,345,307 B1 | 2/2002 | Booth | |
| 6,356,589 B1 | 3/2002 | Gebler et al. | |
| 6,356,937 B1 | 3/2002 | Montville et al. | |
| 6,388,584 B1 | 5/2002 | Dorward et al. | |
| 6,392,567 B2 | 5/2002 | Satoh | |
| 6,404,931 B1 | 6/2002 | Chen et al. | |
| 6,421,387 B1 | 7/2002 | Rhee | |
| 6,434,168 B1 | 8/2002 | Kari | |
| 6,434,695 B1 | 8/2002 | Esfahani et al. | |
| 6,442,659 B1 | 8/2002 | Blumenau | |
| 6,449,658 B1 | 9/2002 | Lafe et al. | |
| 6,449,682 B1 | 9/2002 | Toorians | |
| 6,452,602 B1 | 9/2002 | Morein | |
| 6,452,933 B1 | 9/2002 | Duffield et al. | |
| 6,459,429 B1 | 10/2002 | Deering | |
| 6,463,509 B1 | 10/2002 | Teoman et al. | |
| 6,487,640 B1 | 11/2002 | Lipasti | |
| 6,489,902 B2 | 12/2002 | Heath | |
| 6,505,239 B1 | 1/2003 | Kobata | |
| 6,513,113 B1 | 1/2003 | Kobayashi | |
| 6,523,102 B1 | 2/2003 | Dye et al. | |
| 6,526,174 B1 | 2/2003 | Graffagnino | |
| 6,529,633 B1 | 3/2003 | Easwar et al. | |
| 6,532,121 B1 | 3/2003 | Rust et al. | |
| 6,539,438 B1 | 3/2003 | Ledzius et al. | |
| 6,539,456 B2 | 3/2003 | Stewart | |
| 6,542,644 B1 | 4/2003 | Satoh | |
| 6,577,254 B2 | 6/2003 | Rasmussen | |
| 6,590,609 B1 | 7/2003 | Kitade et al. | |
| 6,597,812 B1 | 7/2003 | Fallon et al. | |
| 6,601,104 B1 * | 7/2003 | Fallon | 709/231 |
| 6,604,040 B2 | 8/2003 | Kawasaki et al. | |
| 6,604,158 B1 * | 8/2003 | Fallon | 710/65 |
| 6,606,040 B2 | 8/2003 | Abdat | |
| 6,606,413 B1 | 8/2003 | Zeineh | |
| 6,609,223 B1 | 8/2003 | Wolfgang | |
| 6,618,728 B1 | 9/2003 | Rail | |
| 6,624,761 B2 | 9/2003 | Fallon | |
| 6,633,244 B2 | 10/2003 | Avery | |
| 6,633,968 B2 | 10/2003 | Zwiegincew et al. | |
| 6,650,261 B2 | 11/2003 | Nelson et al. | |
| 6,661,839 B1 | 12/2003 | Ishida et al. | |
| 6,661,845 B1 | 12/2003 | Herath | |
| 6,704,840 B2 | 3/2004 | Nalawadi et al. | |
| 6,708,220 B1 | 3/2004 | Olin | |
| 6,711,709 B1 | 3/2004 | York | |
| 6,717,534 B2 | 4/2004 | Yokose | |
| 6,731,814 B2 | 5/2004 | Zeck et al. | |
| 6,745,282 B2 | 6/2004 | Okada et al. | |
| 6,748,457 B2 | 6/2004 | Fallon et al. | |
| 6,756,922 B2 | 6/2004 | Ossia | |
| 6,768,749 B1 | 7/2004 | Osler et al. | |
| 6,792,151 B1 | 9/2004 | Barnes et al. | |
| 6,810,434 B2 | 10/2004 | Muthujumaraswathy et al. | |
| 6,813,689 B2 | 11/2004 | Baxter, III | |
| 6,819,271 B2 | 11/2004 | Geiger et al. | |
| 6,822,589 B1 | 11/2004 | Dye et al. | |
| 6,856,651 B2 | 2/2005 | Singh | |
| 6,862,278 B1 | 3/2005 | Chang et al. | |
| 6,879,266 B1 | 4/2005 | Dye et al. | |
| 6,885,316 B2 | 4/2005 | Mehring | |
| 6,885,319 B2 | 4/2005 | Geiger et al. | |
| 6,888,893 B2 | 5/2005 | Li et al. | |
| 6,909,383 B2 | 6/2005 | Shokrollahi et al. | |
| 6,909,745 B1 | 6/2005 | Puri et al. | |
| 6,944,740 B2 | 9/2005 | Abali et al. | |
| 6,952,409 B2 | 10/2005 | Jolitz | |
| 6,959,359 B1 | 10/2005 | Suzuki et al. | |
| 6,963,608 B1 | 11/2005 | Wu | |
| 6,990,247 B2 * | 1/2006 | Schwartz | 382/240 |
| 6,993,597 B2 | 1/2006 | Nakagawa et al. | |
| 7,007,099 B1 | 2/2006 | Donati et al. | |
| 7,024,460 B2 | 4/2006 | Koopmas | |
| 7,054,493 B2 | 5/2006 | Schwartz | |
| 7,069,342 B1 | 6/2006 | Biederman | |
| 7,089,391 B2 | 8/2006 | Geiger et al. | |
| 7,102,544 B1 | 9/2006 | Liu | |

| | | |
|---|---|---|
| 7,127,518 B2 | 10/2006 | Vange et al. |
| 7,129,860 B2 | 10/2006 | Alvarez, II et al. |
| 7,130,913 B2 * | 10/2006 | Fallon .......... 709/231 |
| 7,161,506 B2 | 1/2007 | Fallon |
| 7,181,608 B2 | 2/2007 | Fallon et al. |
| 7,190,284 B1 | 3/2007 | Dye et al. |
| 7,319,667 B1 | 1/2008 | Biederman |
| 7,321,937 B2 * | 1/2008 | Fallon .......... 709/231 |
| RE40,092 E | 2/2008 | Kang |
| 7,330,912 B1 | 2/2008 | Fox et al. |
| 7,352,300 B2 | 4/2008 | Fallon |
| 7,358,867 B2 | 4/2008 | Fallon |
| 7,376,772 B2 | 5/2008 | Fallon |
| 7,378,992 B2 | 5/2008 | Fallon |
| 7,386,046 B2 | 6/2008 | Fallon et al. |
| 7,395,345 B2 * | 7/2008 | Fallon .......... 709/231 |
| 7,400,274 B2 | 7/2008 | Fallon et al. |
| 7,415,530 B2 * | 8/2008 | Fallon .......... 709/231 |
| 7,417,568 B2 | 8/2008 | Fallon et al. |
| 7,552,069 B2 | 6/2009 | Kepecs |
| 7,565,441 B2 | 7/2009 | Romanik et al. |
| 7,714,747 B2 | 5/2010 | Fallon |
| 7,777,651 B2 | 8/2010 | Fallon et al. |
| 8,054,879 B2 | 11/2011 | Fallon et al. |
| 8,073,047 B2 | 12/2011 | Fallon et al. |
| 8,090,936 B2 | 1/2012 | Fallon et al. |
| 8,112,619 B2 | 2/2012 | Fallon et al. |
| 2001/0031092 A1 | 10/2001 | Zeck et al. |
| 2001/0032128 A1 | 10/2001 | Kepecs |
| 2001/0047473 A1 | 11/2001 | Fallon |
| 2001/0052038 A1 | 12/2001 | Fallon et al. |
| 2001/0054131 A1 | 12/2001 | Alvarez, II et al. |
| 2002/0037035 A1 | 3/2002 | Singh |
| 2002/0069354 A1 | 6/2002 | Fallon et al. |
| 2002/0080871 A1 | 6/2002 | Fallon et al. |
| 2002/0097172 A1 | 7/2002 | Fallon |
| 2002/0101367 A1 | 8/2002 | Geiger et al. |
| 2002/0104891 A1 | 8/2002 | Otto |
| 2002/0126755 A1 | 9/2002 | Li et al. |
| 2002/0191692 A1 | 12/2002 | Fallon et al. |
| 2003/0030575 A1 | 2/2003 | Frachtenberg et al. |
| 2003/0034905 A1 | 2/2003 | Anton et al. |
| 2003/0084238 A1 | 5/2003 | Okada et al. |
| 2003/0090397 A1 | 5/2003 | Rasmussen |
| 2003/0142874 A1 | 7/2003 | Schwartz |
| 2003/0191876 A1 | 10/2003 | Fallon |
| 2004/0042506 A1 | 3/2004 | Fallon et al. |
| 2004/0056783 A1 | 3/2004 | Fallon |
| 2004/0073710 A1 | 4/2004 | Fallon |
| 2004/0073746 A1 | 4/2004 | Fallon |
| 2006/0015650 A1 | 1/2006 | Fallon |
| 2006/0181441 A1 | 8/2006 | Fallon |
| 2006/0181442 A1 | 8/2006 | Fallon |
| 2006/0184687 A1 | 8/2006 | Fallon |
| 2006/0184696 A1 | 8/2006 | Fallon |
| 2006/0190644 A1 | 8/2006 | Fallon |
| 2006/0195601 A1 | 8/2006 | Fallon |
| 2007/0043939 A1 | 2/2007 | Fallon et al. |
| 2007/0050514 A1 | 3/2007 | Fallon |
| 2007/0050515 A1 | 3/2007 | Fallon |
| 2007/0067483 A1 | 3/2007 | Fallon |
| 2007/0083746 A1 | 4/2007 | Fallon et al. |
| 2007/0109154 A1 | 5/2007 | Fallon |
| 2007/0109155 A1 | 5/2007 | Fallon |
| 2007/0109156 A1 | 5/2007 | Fallon |
| 2007/0174209 A1 | 7/2007 | Fallon et al. |
| 2008/0232457 A1 | 9/2008 | Fallon et al. |
| 2009/0154545 A1 | 6/2009 | Fallon et al. |
| 2009/0287839 A1 | 11/2009 | Fallon et al. |
| 2010/0316114 A1 | 12/2010 | Fallon et al. |
| 2010/0318684 A1 | 12/2010 | Fallon |
| 2010/0332700 A1 | 12/2010 | Fallon |
| 2011/0037626 A1 | 2/2011 | Fallon |
| 2011/0199243 A1 | 8/2011 | Fallon et al. |
| 2011/0208833 A1 | 8/2011 | Fallon |
| 2011/0231642 A1 | 9/2011 | Fallon et al. |
| 2011/0235697 A1 | 9/2011 | Fallon et al. |
| 2011/0285559 A1 | 11/2011 | Fallon |

FOREIGN PATENT DOCUMENTS

| | | |
|---|---|---|
| EP | 0164677 | 12/1985 |
| EP | 0185098 | 6/1986 |
| EP | 0283798 | 9/1988 |
| EP | 0405572 A2 | 1/1991 |
| EP | 0405572 A3 | 3/1991 |
| EP | 0493130 | 7/1992 |
| EP | 0587437 | 3/1994 |
| EP | 0595406 | 5/1994 |
| EP | 0718751 A2 | 6/1996 |
| EP | 0718751 A3 | 2/1997 |
| EP | 0 928 070 A2 | 7/1999 |
| GB | 2162025 | 1/1986 |
| JP | 04-241681 | 8/1992 |
| JP | 6051989 | 2/1994 |
| JP | 9188009 | 7/1997 |
| JP | 11149376 | 6/1999 |
| WO | WO 9414273 | 6/1994 |
| WO | WO 9429852 | 12/1994 |
| WO | WO 9502873 | 1/1995 |
| WO | WO 95/29437 A1 | 11/1995 |
| WO | WO 9748212 | 12/1997 |
| WO | WO 98/39699 A2 | 9/1998 |
| WO | WO 9908186 A1 | 2/1999 |
| WO | WO 00/36754 A1 | 6/2000 |
| WO | WO 01/57642 | 8/2001 |
| WO | WO 01/57659 | 8/2001 |
| WO | WO 01/63772 | 8/2001 |
| WO | WO 02/39591 | 5/2002 |

OTHER PUBLICATIONS

Millman, Howard, "Image and video compression", Computerworld, vol. 33, Issue No. 3, Jan. 18, 1999, pp. 78.

"IBM boosts your memory", Geek.com [online], Jun. 26, 2000 [retrieved on Jul. 6, 2007], <URL: http://www.geek.com/ibm-boosts-your-memory/>.

"IBM Research Breakthrough Doubles Computer Memory Capacity", IBM Press Release [online], Jun. 26, 2000 [retrieved on Jul. 6, 2007], <URL: http://www-03.ibm.com/press/us/en/pressrelease/1653.wss>.

"ServerWorks to Deliver IBM's Memory eXpansion Technology in Next-Generation Core Logic for Servers", ServerWorks Press Release [online], Jun. 27, 2000 [retrieved on Jul. 14, 2000], <URL: http://www.serverworks.com/news/press/ 000627.html>.

Abali, B., et al., "Memory Expansion Technology (MXT) Software support and performance", IBM Journal of Research and Development, vol. 45, Issue No. 2, Mar. 2001, pp. 287-301.

Franaszek, P. A., et al., "Algorithms and data structures for compressed-memory machines", IBM Journal of Research and Development, vol. 45, Issue No. 2, Mar. 2001, pp. 245-258.

Franaszek, P. A., et al., "On internal organization in compressed random-access memories", IBM Journal of Research and Development, vol. 45, Issue No. 2, Mar. 2001, pp. 259-270.

Smith, T.B., et al., "Memory Expansion Technology (MXT) Competitive impact", IBM Journal of Research and Development, Vo. 45, Issue No. 2, Mar. 2001, pp. 303-309.

Tremaine, R. B., et al., "IBM Memory Expansion Technology (MXT)", IBM Journal of Research and Development, vol. 45, Issue No. 2, Mar. 2001, pp. 271-285.

Expand Networks Accelerator 4000 Series User's Guide.

Tridgell, Andrew; "Efficient Algorithms for Sorting and Synchronization"; A thesis submitted for the degree of Doctor of Philosophy at The Australian National University; Feb. 1999; pp. iii-106.

Jung, et al.; "Performance optimization of wireless local area networks through VLSI data compression"; Wireless Networks, vol. 4, 1998; pp. 27-39.

Jones, et al.; "Lossless data compression for short duration 3D frames in positron emission tomography", IEEE Conference Record Nuclear Science Symposium and Medical Imaging Conference; vol. 3; pp. 1831-1834.

Maier, Mark W.; "Algorithm Evaluation for the Synchronous Data Compression Standard"; University of Alabama; pp. 1-10.

Bassiouni, et al.; "A Scheme for Data Compression in Supercomputers"; IEEE; 1988; pp. 272-278.

Welch, Terry A.; "A Technique for High-Performance Data Compression"; IEEE; Jun. 1984; pp. 8-19.
ALDC: Adaptive Lossless Data Compression; IBM; 1994.
ALDC-Macro: Adaptive Lossless Data Compression; IBM Corporation; 1994.
ALDC1-20S: Adaptive Lossless Data Compression; IBM Corporation; 1994.
ALDC1-40S: Adaptive Lossless Data Compression; IBM Corporation; 1994.
ALDC1-5S: Adaptive Lossless Data Compression; IBM Corporation; 1994.
Craft, David J.; "Data Compression Choice No Easy Call"; Computer Technology Review; vol. XIV, No. 1; Jan. 1994.
Costlow, Terry; "Sony designs faster, denser tape drive"; Electronic Engineering Times; May 20, 1996, pp. 86-87.
Wilson, Ron; "IBM ups compression ante"; Electronic Engineering Times; Aug. 16, 1993; pp. 1-94.
"IBM Announces New Feature for 3480 Subsystem"; Tucson Today; vol. 12, No. 337, Jul. 25, 1989.
Syngress Media, Inc.; "CCA Citrix Certified Administrator for MetaFrame 1.8 Study Guide"; 2000.
International Telecommunication Union; "Data Compression Procedures for Data Circuit Terminating Equipment (DCE) Using Error Correction Procedures"; Geneva, 1990.
Cheng, et al.; "A fast, highly reliable data compression chip and algorithm for storage systems"; IBM J. Res. Develop.; vol. 40, No. 6, Nov. 1996; pp. 603-613.
Cisco Systems; "Cisco IOS Data Compression"; 1997; pp. 1-10.
Craft, D. J.; "A fast hardware data compression algorithm and some algorithmic extensions"; IBM J. Res. Develop.; vol. 42; No. 6; Nov. 6, 1998; pp. 733-746.
Rustici, Robert; "Enhanced CU-SeeMe"1995, Zero in Technologies, Inc.
White Pine Software; "CU-SeeMe Pro: Quick Start Guide"; Version 4.0 for Windows; 1999.
"CU-SeeMe Reflector"; www.geektimes.com/michael/CU-SeeMe/faqs/reflectors.html; accessed on Dec. 2, 2008.
Daniels, et al.; "Citrix WinFrame 1.6 Beta"; May 1, 1996; license.icopyright.net/user/downloadLicense.act?lic=3.7009-9123; accessed Dec. 2, 2008.
Held, et al.; "Data Compression"; Third Edition; John Wiley & Sons Ltd.; 1991.
Data Compression Applications and Innovations Workshop; Proceedings of a Workshop held in Conjunction with the IEEE Data Compression Conference; Snowbird, Utah; Mar. 31, 1995.
Britton, et al.; "Discovery Desktop Conferencing with NetMeeting 2.0"; IDG Books Worldwide, inc.; 1997.
Sattler, Michael; "Internet TV with CU-SeeMe"; Sams.Net Publishing; 1995; First Edition.
IBM Microelectronics Comdex Fall '93 Booth Location.
Disz, et al.; "Performance Model of the Argonne Voyager Multimedia Server"; IEEE; 1997; pp. 316-327.
"Downloading and Installing NetMeeting"; www.w4mq.com/help/h3.htm; accessed on Dec. 2, 2008.
Fox, et al.; "Adapting to Network and Client Variability via On-Demand Dynamic Distillation"; ASPLOS VII; Oct. 1996; pp. 160-170.
Fox, et al.; "Adapting to Network and Client Variation Using Infrastructural Proxies: Lessons and Perceptives"; IEEE Personal Communications, Aug. 1998; pp. 10-19.
Han, et al.; "CU-SeeMe VR Immersive Desktop Teleconferencing"; Department of Computer Science; Cornell University; To appear in ACM Multimedia 1996.
Howard, et al.; "Parallel Lossless Image Compression Using Huffman and Arithmetic Coding"; 1992; pp. 1-9.
Howard, Paul G.; "Text Image Compression Using Soft Pattern Matching"; The Computer Journal; vol. 40, No. 2/3; 1997; pp. 146-156.
Howard, et al.; "The Emerging JBIG2 Standard"; IEEE Transactions on Circuits and Systems for Video Technology, vol. 8, No. 7, Nov. 1998; pp. 838-848.
Craft, D. J.; "A fast hardware data compression algorithm and some algorithmic extensions"; Journal of Research and Development; vol. 42, No. 6, Nov. 1998; pp. 733-745.
"Direct Access Storage Device Compression and Decompression Data Flow"; IBM Technical Disclosure Bulletin; vol. 38, No. 11; Nov. 1995; pp. 291-295.
ICA Timeline, Sep. 24, 2007.
Converse, et al.; "Low Bandwidth X Extension"; Protocol Version 1.0; X Consortium; Dec. 21, 1996.
Magstar and IBM 3590 High Performance Tape Subsystem Technical Guide; Nov. 1996; IBM International Technical Support Organization.
MetaFrame Administration Student Workbook; Jun. 1998; Citrix Professional Courseware; Citrix Systems, Inc.
NCD WinCenter 3.1: Bringing Windows to Every Desktop; 1998.
Overview NetMeeting 2.1; Microsoft Tech Net; technet.microsoft.com/en-us/library/cc767141(printer).aspx; accessed Dec. 2, 2008.
NetMeeting 2.1 Resource Kit; Microsoft TechNet; technet.microsoft.com/en-us/library/cc767142(printer).aspx; accessed on Dec. 2, 2008.
Conferencing Standards: NetMeeeting 2.1 Resource Kit; Microsoft TechNet; technet.microsoft.com/en-us/library/cc767150(printer).aspx; accessed Dec. 2, 2008.
Summers, Bob; "Official Microsoft NetMeeting Book"; Microsoft Press; 1998.
Zebrose, Katherine L.; "Integrating Hardware Accelerators into Internetworking Switches"; Telco Systems.
Simpson, et al.; "A Multiple Processor Approach to Data Compression"; ACM; 1998; pp. 641-649.
"IBM Technology Products Introduces New Family of High-Performance Data Compression Products"; IBM; Aug. 16, 1993.
ReadMe; PowerQuest Drive Image Pro; Version 3.00; 1994-1999; PowerQuest Corporation; p. 1-6.
Schulzrinne, et al.; "RTP Profile for Audio and Video Conferences with Minimal Control"; Jan. 1996; www.ietf.org/rfc/rfc1890.txt; accessed on Dec. 3, 2008.
Zhu, C.; "RTP Payload Format for H.263 Video Streams"; Standards Track; Sep. 1997; pp. 1-12.
Simpson, W.; "The Point-To-Point Protocol (PPP)"; Standards Track; Jul. 1994; pp. i-52.
Reynolds, et al.; "Assigned Numbers"; Standards Track; Oct. 1994; pp. 1-230.
Deutsch, et al.; "ZLIB Compressed Data Format Specification version 3.3"; Informational; May 1996; p. 1-10.
Deutsch, P.; "Deflate Compressed Data Format Specification version 1.3"; Informational; May 1996; pp. 1-15.
Rand, D.; "The PPP Compression Control Protocol (CCP)"; Standards Track; Jun. 1996; pp. 1-9.
Schneider, et al.; "PPP LZS-DCP Compression Protocol (LZS-DCP)"; Informational; Aug. 1996; pp. 1-18.
Friend, et al.; "PPP Stac LZS Compression Protocol"; Informational; Aug. 1996; pp. 1-20.
Schneider, et al.; "PPP for Data Compression in Data Circuit-Terminating Equipment (DCE)"; Informational; Aug. 1996; pp. 1-10.
Atkins, et al.; "PGP Message Exchange Formats"; Informational; Aug. 1996; pp. 1-21.
Castineyra, et al.; "The Nimrod Routing Architecture"; Informational, Aug. 1996; pp. 1-27.
Freed, et al.; "Multipurpose Internet Mail Extensions (MIME) Part Four: Registration Procedures"; Best Current Practice; Nov. 1996; pp. 1-21.
Shacham, et al.; "IP Payload Compression Protocol (IPComp)"; Standards Track; Dec. 1998; pp. 1-10.
Sidewinder 50 Product Manual; Seagate Technology, Inc.; 1997.
IBM RAMAC Virtual Array; IBM; Jul. 1997.
Bruni, et al.; "DB2or OS/390 and Data Compression" IBM Corporation; Nov. 1998.
Smith, Mark; "Thin Client/Server Computing Works"; WindowsITPro; Nov. 1, 1998; pp. 1-13; license.icopyright.net/user/downloadLicense.act?lic=3.7009-8355; accessed Dec. 2, 2008.
International Telecommunication Union; "Information Technology—Digital Compression and Coding of Continuous-Tone Still Images-Requirements and Guidelines"; 1993.

International Telecommunications Union; "Information technology—Lossless and near-lossless compression of continuous-tone still images—Baseline"; 1999.
Davis, Andrew W.; "The Video Answering Machine: Intel ProShare's Next Step"; Advanced Imaging; vol. 12, No. 3; Mar. 1997; pp. 28, 30.
Abbott, III, Walter D.; "A Simple, Low Overhead Data Compression Algoithm for Converting Lossy Compression Processes to Lossless"; Naval Postgraduate School Thesis; Dec. 1993.
Thomborson, Clark; "V.42bis and Other Ziv-Lempel Variants"; IEEE; 1991; p. 460.
Thomborson, Cark; "The V.42bis Standard for Data-Compressing Modems"; IEEE; Oct. 1992; pp. 41-53.
Sun, Andrew; "Using and Managing PPP"; O'Reilly & Associates, Inc.; 1999.
"What is the V42bis Standard?"; www.faqs.org/faqs/compression-faq/part1/section-10.html; accessed on Dec. 2, 2008.
"The WSDC Download Guide: Drive Image Professional for DOS, OS/2, and Windows"; wsdcds01.watson.ibm.com/WSDC.nsf/Guides/Download/Applications-DriveImage.htm; Accessed Nov. 22, 1999.
"The WSDC Download Guide: Drive Image Professional"; wsdcds01.watson.ibm.com/wsdc.nsf/Guides/Download/Applications-DirveImage.htm; accessed on May 3, 2001.
APPNOTE_TXT from pkware.txt; Version 6.3.2; PKWARE Inc., 1989.
CU-SeeMe Readme.txt; Dec. 2, 1995.
CU-seeme txt from indstate.txt; Readme.TXT for CU-SeeMe version 0.90b1; Mar. 23, 1997.
Cuseeme txt 19960221.txt; CUSEEME.TXT; Feb. 21, 1996.
Citrix Technology Guide.
Lettieri, et al.; "Data Compression in the V.42bis Modems"; pp. 398-403.
High Performance x2/V.34+/V.42bis 56K BPS Plug & Play External Voice/FAX/Data Modem User's Manual.
H.323 Protocols Suite; www.protocols.com/pbook/h323.htm.
Hoffman, Roy; "Data Compression in Digital Systems"; Chapman & Hall; 1997; Chapter 14, pp. 344-360.
LBX X Consortium Algorithms; rzdocs.uni-hohenheim.de/aix_4.33/ext_doc/usr/share/man/info/en_US/a_doc_lib/x11 . . . ; X11 R6 Technical Specifications.
Basics of Images; www.geom.uiuc.edu/events/courses/1996/cmwh/Stills/basics.html.
Parties' Joint Claim Construction and Prehearing Statement Pursuant to P.R. 4-3, filed in *Realtime Data, LLC d/b/a/ IXO v. Packeteer, Inc. et al.*, Civil Action No. 6:08-cv-00144-LED; U.S. District Court for the Eastern District of Texas.
Declaration of Professor James A. Storer, Ph.D., relating to U.S. Patent No. 6,604,158, Mar. 18, 2009.
Declaration of Professor James A. Storer, Ph.D., relating to U.S. Patent No. 6,601,104, Mar. 18, 2009.
Declaration of Professor James A. Storer, Ph.D., relating to U.S. Patent No. 7,321,937, May 4, 2009.
Declaration of Professor James A. Storer, Ph.D., relating to U.S. Patent No. 6,624,761, May 4, 2009.
Declaration of Professor James A. Storer, Ph.D., relating to U.S. Patent No. 7,378,992, May 20, 2009.
Declaration of Professor James A. Storer, Ph.D., relating to U.S. Patent No. 7,161,506, May 26, 2009.
"Video Coding for Low Bit Rate Communication", International Telecommunication Union (ITU),Recommendation H.263, § 3.4 (Mar. 1996).
Realtime's Response in Opposition to the Defendants' Joint Objections to Report and Recommendation of Magistrate Regarding Motion for Partial Summary Judgment of Invalidity for Indefiniteness, in *Realtime Data, LLC d/b/a/IXO v. Packeteer, Inc. et al.*, Civil Action No. 6:08-cv-00144-LED; U.S. District Court for the Eastern District of Texas.
Reply to Realtime's Response to Blue Coat Defendants' Objections to Report and Recommendation of United States Magistrate Judge Regarding Motion for Partial Summary Judgment of Invalidity for Indefiniteness Entered Jun. 23, 2009, in *Realtime Data, LLC d/b/a/ IXO v. Packeteer, Inc. et al.*, Civil Action No. 6:08-cv-00144-LED; U.S. District Court for the Eastern District of Texas.

Realtime Data's Sur-Reply in Opposition to the Defendants' Joint Objections to Report and Recommendation of Magistrate Regarding Motion for Partial Summary Judgment of Invalidity for Indefiniteness, in *Realtime Data, LLC d/b/a/IXO v. Packeteer, Inc. et al.*, Civil Action No. 6:08-cv-00144-LED; U.S. District Court for the Eastern District of Texas.
"A-T Financial Offers Manipulation, Redistribution of Ticker III", Inside Market Data, vol. 4, No. 14, Sep. 5, 1989, 1 page.
"Add-on Options for the XpressFiles", Intelligent Compression Technologies, http://web.archive.org/web/19980518053418/ictcompress.com/options_X.html, 1998, 2 pages.
Andrews et al., "A Mean-Removed Variation of Weighted Universal Vector Quantization for Image Coding", IEEE, 1993, pp. 302-309.
Asserted Claims Chart for U.S. Patent No. 6,624,761, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 4 pages.
Asserted Claims Chart for U.S. Patent No. 7,161,506, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 5 pages.
Asserted Claims Chart for U.S. Patent No. 7,400,274, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 6 pages.
Asserted Claims Chart for U.S. Patent No. 7,417,568, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 13 pages.
Asserted Claims Chart for U.S. Patent No. 7,714,747, *Realtime Data, LLC D/B/A IXO. v. CME Group Inc., et al.*, 6:09-cv-327-LED-JDL, 6:10-cv-246-LED-JDL, United States District Court for the Eastern District of Texas Tyler Division, Oct. 19, 2010, 19 pages.
Barton, Rich S&P ComStock Network Character Set Definition, 19.2 KB Network, Version 1.7.0, Feb. 10, 1995, 29 pages.
Beech et al., AX.25 Link Access Protocol for Amateur Packet Radio, Version 2.2, Revision: Jul. 1998, 143 pages.
Bormann, Carsten, "Providing Integrated Services over Low-bitrate Links", Network Working Group Request for Comments: 2689, Category: Informational, Sep. 1999, 14 pages.
ComStock Services Pamphlet, McGraw-Hill Fininicial Services Company, purportedly published by Jul. 19, 1995, 6 pages.
Cormack, Gordon V., "Data Compression on Database System", Communications of the ACM, vol. 28, No. 12, Dec. 1985, pp. 1336-1342.
Court Docket Listing for 6:10-cv-00493-LED *Realtime Data, LLC D/B/A/IXO, v. MetroPCS Texas, LLC et al.*, dated May 25, 2011, 11 pages.
Court Docket History for 1:09-cv-04486 *Chicago Board Options Exchange, Incoporated, v. Realtime Data, LLC*, dated May 25, 2011, 7 pages.
Court Docket History for 6:09-cv-00326-LED-JDL *Realtime Data, LLC D/B/A/IXO, v. Morgan Stanley et al*, dated May 25, 2011, 43 pages.
Court Docket History for 6:09-cv-00327-LED-JDL *Realtime Data, LLC D/B/A/IXO, v. CME Group Inc. et al*, dated May 25, 2011, 54 pages.
Court Docket History for 6:09-cv-00333-LED-JDL *Realtime Data, LLC d/b/a IXO v. Thomson Reuters et al*, dated May 25, 2011, 28 pages.
Court Docket History for 1:09-cv-07868-RMB *Thomson Reuters Corporation v. Realtime Data, LLC*, dated May 25, 2011, 3 pages.
Court Docket History for 6:09-cv-00144-LED-JDL *Realtime Data, LLC d/b/a IXO v. Packeteer, Inc. et al*, dated May 25, 2011, 119 pages.
Danskin, John Moffatt, Compressing the X Graphics Protocol: A Dissertation Presented to the Facult of Princeton University in Candidacy for the Degree of Doctor of Philosophy, Jan. 1995, 147 pages.
"Data Networks and Open System Communications", Information Technology—Abstract Syntax Notation One (ASN. 1) Specification of Basic Notation, International Telecommunication Union, ITU-T Telecommunication Standardization Sector of ITU X.680, Jul. 1994.
Defendants' Invalidity Contentions, *Realtime Data, LLC D/B/A IXO v. CME Group Inc., et al.*, 6:09-cv-327-LED-JDL, 6:10-cv-246-

LED-JDL, United States District Court for the Eastern District of Texas Tyler Division, Oct. 19, 2010, 19 pages.
Degermark, Mikael, "IP Header Compression", Network Working Group Request for Comments: 2507, Category Standards Track, Feb. 1999, 47 pages.
Developer's Guide, Version 1.0.2, S&P ComStock, Feb. 15, 1994, 186 pages.
Domanski, Dr. Bernie, "All the news you can eat, Department: Dr. Bernie's Digestions and Digressions", Demand Technology's Capacity Management Review, vol. 25, No. 7, Jul. 1997, pp. 24, 18-22.
Effros, Michelle and Philip A. Chou, "Weighted Universal Transform Coding: Universal Image Compression with the Karhunen-Loeve Transform", IEEE, 1995, pp. 61-64.
Engan, Mathias, "IP Header Compression over PPP", Network Working Group Request for Comments: 2509, Category: 2509, Feb. 1999, 10 pages.
Exhibit A, Invalidity Claim Charts A1-A45 for U.S. Patent 6,624,761, *Realtime Data, LLC D/B/A IXO* v. *CME Group Inc., et al.*, 6:09-cv-327-LED-JDL, 6:10-cv-246-LED-JDL, United States District Court for the Eastern District of Texas Tyler Division, Oct. 19, 2010, 616 pages.
Exhibit B, Invalidity Claim Charts B1-B45 for U.S. Patent 7,161,506, *Realtime Data, LLC D/B/A IXO* v. *CME Group Inc., et al.*, 6:09-cv-327-LED-JDL, 6:10-cv-246-LED-JDL, United States District Court for the Eastern District of Texas Tyler Division, Oct. 19, 2010, 1513 pages.
Exhibit C, Invalidity Claim Charts C1-C7, C9-C31, C33-C45 for U.S. Patent 7,400,274, *Realtime Data, LLC D/B/A IXO* v. *CME Group Inc., et al.*, 6:09-cv-327-LED-JDL, 6:10-cv-246-LED-JDL, United States District Court for the Eastern District of Texas Tyler Division, Oct. 19, 2010, 1528 pages.
Exhibit D, Invalidity Claim CHarts D1-D7, D9-D45 for U.S. Patent 7,417,568, *Realtime Data, LLC D/B/A IXO* v. *CME Group Inc., et al.*, 6:09-cv-327-LED-JDL, 6:10-cv-246-LED-JDL, United States District Court for the Eastern District of Texas Tyler Division, Oct. 19, 2010, 2458 pages.
Exhibit E, Invalidity Claim Charts E1-E7, E9, E11, E13-E15, E17-E30, E32-E45 for U.S. Patent 7,714,747, *Realtime Data, LLC D/B/A IXO* v. *CME Group Inc., et al.*, 6:09-cv-327-LED-JDL, 6:10-cv-246-LED-JDL, United States District Court for the Eastern District of Texas Tyler Division, Oct. 19, 2010, 3312 pages.
Greene, Tim, "Squeeze your 'Net links", NetworkWorld, vol. 14, No. 28, Jul. 14, 1997, pp. 1 and 56.
Helck, Christopher J., "Encapsulated Ticker: Ver 1.0", Jul. 14, 1993, 22 pages.
"High-performance schema-specific compression for XML data formats.", XML-Xpress: Product Overview, Intelligent Compression Technologies, http://web.archive.org/web/20020818002535/www.ictcompress.com/products_xmlxpress, 2001, 2 pages.
Hsu, William H. and Amy E. Zwarico, "Automatic Synthesis of Compression Techniques for Heterogeneous Files", Software—Practice and Experience, vol. 25 (10), Oct. 1995, pp. 1097-1116.
"ICT's XML-Xpress", Intelligent Compression Technologies, Dec. 2000, 6 pages.
"Information processing systems—Data communication—High-level data link control procedures—Frame structure", UNI ISO 3309, 1984, 11 pages.
Installing and Administering PPP, Edition 1, Hewlitt-Packard Company, 1997, 169 pages.
"Introducing XpressFiles", Intelligent Compression Technologies, http://web.archive.org/web/19980518053310/ictcompress.com/xpressfiles.html, 1998, 1 page.
"Ion's RemoteScript speeds transmission", Seybold Report on Publishing Systems, vol. 22, No. 5, Nov. 9, 1992, pp. 21-23.
Jacobson, Compressing TCP/IP Headers for Low-Speed Serial Links, Feb. 1990, 43 pages.
Kulkosky, Victor, "Upping the Ante", Wall Street & Technology, vol. 11 No. 5, Oct. 1993, pp. 8-11.
Liefke, Hartmut and Dan Suciu, An Extensible Compressor for XML Data, SIGMOD Record, vol. 29, No. 1, Mar. 2000, pp. 57-62.
Liefke, Hartmut and Dan Suciu, Xmill: an Efficient Compressor for XML Data, 2000, pp. 153-164.
Liefke, Hartmut and Dan Suciu, Xmill: an Efficient Compressor for XML Data, Oct. 18, 1999, 25 pages.
McGregor, Glenn, "The PPP Internet Protocol Control Protocol (IPCP)", Network Working Group Request for Comments: 1332, Obsoletes: RFC 1172, May 1992, 14 pages.
Obviousness Chart for U.S. Pat. No. 6,624,761, *Realtime Data, LLC D/B/A IXO* v. *CME Group Inc., et al.*, 6:09-cv-327-LED-JDL, 6:10-cv-246-LED-JDL, United States District Court for the Eastern District of Texas Tyler Division, Oct. 19, 2010, 19 pages.
Obviousness Chart for U.S. Pat. No. 7,161,506, *Realtime Data, LLC D/B/A IXO* v. *CME Group Inc., et al.*, 6:09-cv-327-LED-JDL, 6:10-cv-246-LED-JDL, United States District Court for the Eastern District of Texas Tyler Division, Oct. 19, 2010, 49 pages.
Obviousness Chart for U.S. Pat. No. 7,400,274, *Realtime Data, LLC D/B/A IXO* v. *CME Group Inc., et al.*, 6:09-cv-327-LED-JDL, 6:10-cv-246-LED-JDL, United States District Court for the Eastern District of Texas Tyler Division, Oct. 19, 2010, 41 pages.
Obviousness Chart for U.S. Pat. No. 7,417,568, *Realtime Data, LLC D/B/A IXO* v. *CME Group Inc., et al.*, 6:09-cv-327-LED-JDL, 6:10-cv-246-LED-JDL, United States District Court for the Eastern District of Texas Tyler Division, Oct. 19, 2010, 75 pages.
Obviousness Chart for U.S. Pat. No. 7,714,747, *Realtime Data, LLC D/B/A IXO* v. *CME Group Inc., et al.*, 6:09-cv-327-LED-JDL, 6:10-cv-246-LED-JDL, United States District Court for the Eastern District of Texas Tyler Division, Oct. 19, 2010, 97 pages.
Open Financial Exchange Specification 2.0, Intuit Inc., Microsoft Corp., Apr. 28, 2000, 537 pages.
Rand, Dave, "The PPP Compression Control Protocol (CCP)", Network Working Group Reuest for Comments: 1962, Catefory: Standards Track, Jun. 1996, 9 pages.
Rogers, Amy, "Bandwidth Bargain IT hot on products that squeeze more out of the pipe", No. 673. Jul. 21, 1997, pp. 1 and 65.
Roth, Mark A. and Scott J. Van Horn, "Database Compression", SIGMOD Record, vol. 22, No. 3, Sep. 1993, pp. 31-39.
Schmerken, Ivy, "Time Running Out for Old Technologies", Wall Street Computer Review, Apr. 1990, pp. 14-16, 23-24, 28, 56.
"Scrolling News", Inside Market Data, Feb. 27, 1995, 2 pages.
Simpson, W., "PPP in HDLC-like Framing", Network Working Group Request for Comments: 1662, STD 51, Obsoletes 1549, Category: Standards Track, Jul. 1994, 26 pages.
Suciu, Dan, Data Management on the Web, AT&T Labs, Apr. 4, 2000, 52 slides.
Suciu, Dan, Data Management on the Web: Abstract, University of Washington Computer Science & Engineering, Apr. 4, 2000, 1 page.
"Telekurs Buys S&P Trading Systems and Its Ticker III Feed", Inside Market Data, vol. 4, No. 11, Jul. 10, 1989, 1 page.
"Telekurs May Debut 128 KPS Ticker by Year's End"Inside Market Data, Jul. 18, 1994, 2 pages.
Telekurs Now Carries All Dow Jones' News on 56-Kbps Ticker, Inside Market Data, Dec. 20, 1993, 2 pages.
"Telekurs Sell No. American Division in Mgmt. Buyout", Inside Market Data, Oct. 23, 1995, 2 pages.
!! Hyperlink file:///\\\\nt-prod\\skgf-r2\\Dept\\EGROUP\\2855\\New%20Refs%20from%20McKool%20Smith\\Prior%20Art%20-%20CME%20Invalidity%20Contentions\\Telekurs\\No%20 author-.
Telekurs Manual, Jan. 11, 1993, 184 pages.
"The Technology Behind XpressFiles", Intelligent Compression Technologies, http://web.archive.org/web/19980518053634/ictcompress.com/technical_X.html, 1998, 1 page.
TID Information: Revisions to TID Program Since the Dawn of Time!!! Version 1.0, 23 pages; TID Codes 1, 1 page; TID Codes 2, 1 page, purportedly by Jul. 19, 1995.
TypeWorld: The First and Only Newspaper for Electronic Publishing, vol. 16 No. 9, Jun. 17, 1992, 3 pages.
"XpressFiles White Paper", Intelligent Compression Technologies, 1999-2001, 3 pages.
U.S. Appl. No. 60/309,218, filed Jul. 31, 2001.
Danskin, et al., "Fast Higher Bandwidth X," Dartmouth College, Hanover, NH, 1995, 8 pages.
Hoffman, Roy, "Data Compression in Digital Systems," Digital Multimedia Standards Series, Chapman & Hall, 1997, 426 pages.

Defendants' Invalidity Contentions, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, 34 pages.

Appendix A, Obviousness Chart for U.S. Patent No. 7,777,651, not dated, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, 466 pages.

Appendix B, § 112 Invalidity Arguments for U.S. Pat. No. 7,777,651, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, 75 pages.

Exhibit 1, Prior Art Chart for U.S. Pat. No. 7,777,651, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, 161 pages, citing Aakre et al., U.S. Patent No. 4,956,808.

Exhibit 2, Prior Art Chart for U.S. Pat. No. 7,777,651, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, 206 pages, citing Albert et al., U.S. Patent No. 5,907,801.

Exhibit 3, Prior Art Chart for U.S. Pat. No. 7,777,651, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, 95 pages, citing B. Andrews, P. Chou, M. Effros and R. Gray "A Mean-Removed Variation of Weighted Universal Vector Quantization for Image Coding," IEEE 0-8186-3392-1/93, 302-309 (1993).

Exhibit 4, Prior Art Chart for U.S. Pat. No. 7,777,651, 144 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Barnes et al., U.S. Patent No. 6,792,151.

Exhibit 5, Prior Art Chart for U.S. Pat. No. 7,777,651, 216 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Birdwell et al., U.S. Patent No. 6,032,197.

Exhibit 6, Prior Art Chart for U.S. Pat. No. 7,777,651, 257 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Bledsoe, U.S. Patent No. 4,646,061.

Exhibit 7, Prior Art Chart for U.S. Pat. No. 7,777,651, 169 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Brickman et al., U.S. Patent No. 4,499,499.

Exhibit 8, Prior Art Chart for U.S. Pat. No. 7,777,651, 396 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing C. Bormann et al., "Robust Header Compression (ROHC)," Network Working Group Internet-Draft Sep. 18, 2000.

Exhibit 9, Prior Art Chart for U.S. Pat. No. 7,777,651, 253 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Carr, U.S. Patent No. 5,293,379.

Exhibit 10, Prior Art Chart for U.S. Pat. No. 7,777,651, 205 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Cellier et al., U.S. Patent No. 5,884,269.

Exhibit 11, Prior Art Chart for U.S. Pat. No. 7,777,651, 181 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Chu, U.S. Patent Nos. 5,374,916 & 5,467,087.

Exhibit 12, Prior Art Chart for U.S. Pat. No. 7,777,651, 175 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Cisco IOS Data Compression White Paper (Cisco Systems Inc., 1997).

Exhibit 13, Prior Art Chart for U.S. Pat. No. 7,777,651, 590 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Comstock—S&P ComStock Developers Guides (McGraw-Hill, 1994); Rich Barton, "S&P ComStock Network Character Set Definition" (Feb. 10, 1995).

Exhibit 14, Prior Art Chart for U.S. Pat. No. 7,777,651, 186 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing D.J. Craft. "A fast hardware data compression algorithm and some algorithmic extensions," IBM J. Res. Develop. vol. 42, No. 6 (Nov. 6, 1998).

Exhibit 15, Prior Art Chart for U.S. Pat. No. 7,777,651, 142 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Deering, U.S. Pat. No. 6,459,429.

Exhibit 16, Prior Art Chart for U.S. Pat. No. 7,777,651, 284 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Dye et al., U.S. Patent No. 7,190,284 and International Publication No. WO 00/45516.

Exhibit 17, Prior Art Chart for U.S. Pat. No. 7,777,651, 269 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Earl et al., U.S. Patent No. 5,341,440.

Exhibit 18, Prior Art Chart for U.S. Pat. No. 7,777,651, 132 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Eastman et al., U.S. Patent No. 4,464,650.

Exhibit 19, Prior Art Chart for U.S. Pat. No. 7,777,651, 125 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Elgamal et al., U.S. Patent No. 5,410,671.

Exhibit 20, Prior Art Chart for U.S. Pat. No. 7,777,651, 122 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Enari et al., European Patent Application No. 0,493,130.

Exhibit 21, Prior Art Chart for U.S. Pat. No. 7,777,651, 379 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Fascenda, U.S. Patent No. 5,045,848.

Exhibit 22, Prior Art Chart for U.S. Pat. No. 7,777,651, 218 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Frachtenberg et al., U.S. Patent. Pub. 2003/0030575.

Exhibit 23, Prior Art Chart for U.S. Pat. No. 7,777,651, 247 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Franaszek et al., U.S. Patent. No. 5,870,036.

Exhibit 24, Prior Art Chart for U.S. Pat. No. 7,777,651, 327 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing French et al., U.S. Patent No. 5,794,229.

Exhibit 25, Prior Art Chart for U.S. Pat. No. 7,777,651, 225 pages, Exhibit 24, Prior Art Chart for U.S. Pat. No. 7,777,651, 327 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Geiger et al., U.S. Patent No. 5,987,022.

Exhibit 26, Prior Art Chart for U.S. Pat. No. 7,777,651, 219 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Gentile, U.S. Patent No. 5,504,842.

Exhibit 27, Prior Art Chart for U.S. Pat. No. 7,777,651, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED- JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, 167 pages, citing Giltner et al., U.S. Patent No. 4,386,416.

Exhibit 28, Prior Art Chart for U.S. Pat. No. 7,777,651, 156 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Gooch, U.S. Patent No. 4,325,085.

Exhibit 29, Prior Art Chart for U.S. Pat. No. 7,777,651, 132 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Hauck, U.S. Patent No. 4,626,829.

Exhibit 30, Prior Art Chart for U.S. Pat. No. 7,777,651, 161 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Heath, U.S. Patent No. 5,955,976.

Exhibit 31, Prior Art Chart for U.S. Pat. No. 7,777,651, 359 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Hewlett-Packard Company, "Installing and Administering PPP," B2355-90137, HP 9000 Networking, E0948 (1st Ed. 1997).

Exhibit 32, Prior Art Chart for U.S. Pat. No. 7,777,651, 229 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Hsu & Zwarico, Automatic Synthesis of Compression Techniques for Heterogeneous Files, Software-Practice & Experience, vol. 25(10), pp. 1097-1116 (Oct. 1995).

Exhibit 33, Prior Art Chart for U.S. Pat. No. 7,777,651, 206 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing ICT XML-Xpress White Paper (Intelligent Compression Technologies Inc., 2000) & website.

Exhibit 34, Prior Art Chart for U.S. Pat. No. 7,777,651, 138 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing ICT XpressFiles White Paper (Intelligent Compression Technologies Inc., 1999) & website.

Exhibit 35, Prior Art Chart for U.S. Pat. No. 7,777,651, 128 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Iseda et al., E.P. 0405572 A2.

Exhibit 36, Prior Art Chart for U.S. Pat. No. 7,777,651, 205 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing J. Danskin. "Compressing the X Graphics Protocol," Princeton University (Jan. 1995).

Exhibit 37, Prior Art Chart for U.S. Pat. No. 7,777,651, 159 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Kalkstein, U.S. Patent No. 5,945,933.

Exhibit 38, Prior Art Chart for U.S. Pat. No. 7,777,651, 402 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Kari, U.S. Patent No. 6,434,168; International Publication No. WO97/48212 A1.

Exhibit 39, Prior Art Chart for U.S. Pat. No. 7,777,651, 209 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Koopmas et al., U.S. Patent No. 7,024,460.

Exhibit 40, Prior Art Chart for U.S. Pat. No. 7,777,651, 214 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Kopf, U.S. Patent No. 5,825,830.

Exhibit 41, Prior Art Chart for U.S. Pat. No. 7,777,651, 281 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Lafe et al., U.S. Patent No. 6,449,658.

Exhibit 42, Prior Art Chart for U.S. Pat. No. 7,777,651, 340 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Lane et al., U.S. Patent No. 5,521,940.

Exhibit 43, Prior Art Chart for U.S. Pat. No. 7,777,651, 164 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Langdon, Jr. et al., U.S. Patent No. 4,494,108.

Exhibit 44, Prior Art Chart for U.S. Pat. No. 7,777,651, 211 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Lavallee, U.S. Patent No. 6,215,904.

Exhibit 45, Prior Art Chart for U.S. Pat. No. 7,777,651, 103 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing M. Effros, P. Chou & R.M. Gray. "Variable Dimension Weighted Universal Vector Quantization and Noiseless Coding," IEEE 1068-0314/94 (1994).

Exhibit 46, Prior Art Chart for U.S. Pat. No. 7,777,651, 414 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing MacCrisken, U.S. Patent No. 4,730,348.

Exhibit 47, Prior Art Chart for U.S. Pat. No. 7,777,651, 319 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Madany et al., U.S. Patent No. 5,774,715.

Exhibit 48, Prior Art Chart for U.S. Pat. No. 7,777,651, 228 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011,citing Mark A. Roth and Scott J. Van Horn, "Database Compression" SIGMOD Record, vol. 22, No. 3 (1993).

Exhibit 49, Prior Art Chart for U.S. Pat. No. 7,777,651, 235 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Miller et al., U.S. Patent No. 4,814,746.

Exhibit 50, Prior Art Chart for U.S. Pat. No. 7,777,651, 172 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing O'Brien et al., U.S. Patent No. 4,929,946.

Exhibit 51, Prior Art Chart for U.S. Pat. No. 7,777,651, 30 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Osler et al., U.S. Patent No. 6,768,749.

Exhibit 52, Prior Art Chart for U.S. Pat. No. 7,777,651, 103 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing P. G. Howard, F. Kossenti, S. Forchammer, and W. J. Rucklidge [1998]. "The Emerging JBIG2 Standard", IEEE Transactions on Circuits and Systems for Video Technology 8:7,838-848.

Exhibit 53, Prior Art Chart for U.S. Pat. No. 7,777,651, 218 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Panaoussis, U.S. Patent No. 5,949,355.

Exhibit 54, Prior Art Chart for U.S. Pat. No. 7,777,651, 335 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Payne et al, U.S. Patent No. 6,021,433.

Exhibit 55, Prior Art Chart for U.S. Pat. No. 7,777,651, 273 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Reynar et al, U. S. Patent No. 5,951,623.

Exhibit 56, Prior Art Chart for U.S. Pat. No. 7,777,651, 399 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing RFC 1144: V. Jacobson, "Compressing TCP/IP Headers for Low-Speed Serial Links," Network Working Group, Request for Comments: 1144 (Feb. 1990).

Exhibit 57, Prior Art Chart for U.S. Pat. No. 7,777,651, 103 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing RFC 1661: Point-to-Point Protocol Working Group, "The Point-to-Point Protocol," RFC 1661 (William Simpson ed., Internet Engineering Task Force 1994); RFC 1662: Point-to-Point Protocol Working Group, "PPP in HDLC-like Framing," RFC 1662 (William Simpson ed., Internet Engineering Task Force 1994); RFC 1962: Dave Rand, "The PPP compression Control Protocol (CCP)," RFC 1962 (Internet Engineering Task Force 1996); RFC 1332: Glenn McGregor, "The PPP Internet Protocol Control Protocol (IPCP)," RFC 1332 Internet Engineering Task Force 1992); RFC 2509; Mathias Engan et al., "IP Header Compression over IP," RFC 2509 (Internet Society 1999).

Exhibit 58, Prior Art Chart for U.S. Pat. No. 7,777,651, 218 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing RFC 2507: Mikael Degermark et al., "IP Header Compression," RFC 2507 (Internet Society 1999).

Exhibit 59, Prior Art Chart for U.S. Pat. No. 7,777,651, 335 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Roper et al., U.S. Patent No. 5,454,079.

Exhibit 60, Prior Art Chart for U.S. Pat. No. 7,777,651, 273 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Sebastian, U.S. Patent No. 6,253,264 and International Publication No. WO/1998/039699.

Exhibit 61, Prior Art Chart for U.S. Pat. No. 7,777,651, 399 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Seroussi et al., U.S. Patent No. 5,243,341.

Exhibit 62, Prior Art Chart for U.S. Pat. No. 7,777,651, 322 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Seroussi et al., U.S. Patent No. 5,389,922.

Exhibit 63, Prior Art Chart for U.S. Pat. No. 7,777,651, 102 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Shin, U.S. Patent No. 5,455,680.

Exhibit 64, Prior Art Chart for U.S. Pat. No. 7,777,651, 126 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Taaffe et al., U.S. Patent No. 5,179,651.

Exhibit 65, Prior Art Chart for U.S. Pat. No. 7,777,651, 313 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Telekurs Ticker—"Telekurs Ticker Service: Programmer's Reference," Telekurs (North America), Inc. (Jan. 11, 1993); C. Helck. "Encapsulated Ticker: Ver. 1.0," Telekurs NA, 1-22 (Jul. 14, 1993); A-T Financial Offers Manipulation, Redistribution of Ticker III, Micro Ticker Report, v 4, n 14 (Sep. 5, 1989); V. Kulkosky, "Upping the Ante" Wall Street & Technology, v11 n5 pp. 8-11 (Oct. 1993); "Telekurs to Launch New Int'l Feed/Internet Server," Wall Street & Technology, v15 n1 pp. 14 (Jan. 1997); I. Schmerken, "Time running out for old technologies", Wall Street Computer Review, v7 n7 p. 14(7) (Apr. 1990); Scrolling News, Inside Market Data, v 10, n 11 (Feb. 27, 1995); Telekurs Buys S&P Trading Systems and Its Ticker III Feed, Micro Ticker Report, v 4, n 11 (Jul. 10, 1989); Telekurs May Debut 128 KPS Ticker by Year's End, Inside Market Data, v 9, n 21 (Jul. 18, 1994); Telekurs Now Carries All Dow Jones' News on 56-KBPS Ticker, Inside Market Data, v9, n7 (Dec. 20, 1993); Telekurs Sells No. American Division in Mgmt. Buyout, Inside Market Data, v11, n3 (Oct. 23, 1995).

Exhibit 66, Prior Art Chart for U.S. Pat. No. 7,777,651, 265 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Tyler et al., U.S. Patent No. 5,638,498.

Exhibit 67, Prior Art Chart for U.S. Pat. No. 7,777,651, 86 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing UNI International Standard ISO 3309-1984 (E) [1984]."Information Processing Systems—Data Communication—High-level Data Link Control Procedures—Frame Structure," 1-6 (1984).

Exhibit 68, Prior Art Chart for U.S. Pat. No. 7,777,651, 236 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Unwired Planet, EP 0928070 A2.
Exhibit 69, Prior Art Chart for U.S. Pat. No. 7,777,651, 80 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Vange et al., U.S. Patent No. 7,127,518.
Exhibit 70, Prior Art Chart for U.S. Pat. No. 7,777,651, 197 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Wernikoff et al., U.S. Patent No. 3,394,352.
Exhibit 71, Prior Art Chart for U.S. Pat. No. 7,777,651, 253 pages, Exhibit 70, Prior Art Chart for U.S. Pat. No. 7,777,651, 197 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Willis et al., U.S. Patent No. 4,745,559; Boilen, U.S. Patent No. 4,750,135.
Exhibit 72, Prior Art Chart for U.S. Pat. No. 7,777,651, 277 pages, Exhibit 71, Prior Art Chart for U.S. Pat. No. 7,777,651, 253 pages, Exhibit 70, Prior Art Chart for U.S. Pat. No. 7,777,651, 197 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing XMill—Hartmut Liefke & Dan Suciu, "XMill: an Efficient Compressor for XML Data," University of Pennsylvania, Philadelphia, Pennsylvania, MS-CIS-99-26 (Oct. 18, 1999); Hartmut Liefke & Dan Suciu, "XMill: an Efficient Compressor for XML Data," Proceedings of SIGMOD, 2000; Hartmut Liefke & Dan Suciu, "An Extensible Compressor for XML Data," SIGMOD Record, vol. 29, No. 1 (Mar. 2000); Dan Suciu, "Data Management on the Web," Presentation at University of Washington College of Computer Science & Engineering, Seattle, WA (Apr. 4, 2000).
Bormann et al., "Robust Header Compression (ROHC)," Network Working Group Internet-Draft, Sep. 18, 2000, 111 pages.
Effros, M., P.A. Chou and R.M. Gray, "Variable Dimension Weighted Universal Vector Quantization and Noiseless Coding," IEEE 1068-0314/94, 1994, pp. 2-11.
Defendant Bloomberg L.P.'s Invalidity Contentions Pursuant to Patent Local Rule 3-3, *Realtime Data, LLC d/b/a IXO vs. Thomson Reuters Corp., et al.*, 6:2009-cv-00333 LED-JDL, 6:2010-cv-00247 LED-JDL, 6:2010-cv-00425 LED-JDL, Oct. 29, 2010, 17 pages.
Appendix A: U.S. Patent No. 6,624,761, (The "761 Patent"), from Defendant Bloomberg L.P.'s Invalidity Contentions Pursuant to Patent Local Rule 3-3, *Realtime Data, LLC d/b/a IXO vs. Thomson Reuters Corp., et al.*, 6:2009-cv-00333 LED-JDL, 6:2010-cv-00247 LED-JDL, 6:2010-cv-00425 LED-JDL, Oct. 29, 2010, 37 pages.
Appendix B: U.S. Patent No. 7,161,506, (The "506 Patent"), from Defendant Bloomberg L.P.'s Invalidity Contentions Pursuant to Patent Local Rule 3-3, *Realtime Data, LLC d/b/a IXO vs. Thomson Reuters Corp., et al.*, 6:2009-cv-00333 LED-JDL, 6:2010-cv-00247 LED-JDL, 6:2010-cv-00425 LED-JDL, Oct. 29, 2010, 63 pages.
Appendix C: U.S. Patent No. 7,400,274, (The "274 Patent"), from Defendant Bloomberg L.P.'s Invalidity Contentions Pursuant to Patent Local Rule 3-3, *Realtime Data, LLC d/b/a IXO vs. Thomson Reuters Corp., et al.*, 6:2009-cv-00333 LED-JDL, 6:2010-cv-00247 LED-JDL, 6:2010-cv-00425 LED-JDL, Oct. 29, 2010, 95 pages.
Appendix D: U.S. Patent No. 7,417,568, (The "568 Patent"), from Defendant Bloomberg L.P.'s Invalidity Contentions Pursuant to Patent Local Rule 3-3, *Realtime Data, LLC d/b/a IXO vs. Thomson Reuters Corp., et al.*, 6:2009-cv-00333 LED-JDL, 6:2010-cv-00247 LED-JDL, 6:2010-cv-00425 LED-JDL, Oct. 29, 2010, 147 pages.
Appendix E: U.S. Patent No. 7,714,747, (The "747 Patent"), from Defendant Bloomberg L.P.'s Invalidity Contentions Pursuant to Patent Local Rule 3-3, *Realtime Data, LLC d/b/a IXO vs. Thomson Reuters Corp., et al.*, 6:2009-cv-00333 LED-JDL, 6:2010-cv-00247 LED-JDL, 6:2010-cv-00425 LED-JDL, Oct. 29, 2010, 137 pages.
Appendix F: Comparison of FAST to the Proir Art, from Defendant Bloomberg L.P.'s Invalidity Contentions Pursuant to Patent Local Rule 3-3, *Realtime Data, LLC d/b/a IXO vs. Thomson Reuters Corp., et al.*, 6:2009-cv-00333 LED-JDL, 6:2010-cv-00247 LED-JDL, 6:2010-cv-00425 LED-JDL, Oct. 29, 2010, 7 pages.
Defendant Bloomberg L.P.'s Invalidity Contentions Pursuant to Patent Local Rule 3-3 Regarding U.S. Patent No. 7,777,651, *Realtime Data, LLC d/b/a IXO vs. Thomson Reuters Corp., et al.*, 6:2009-cv-00333 LED-JDL, 6:2010-cv-00247 LED-JDL, 6:2010-cv-00425 LED-JDL, Feb. 4, 2011, 21 pages.
Appendix G: U.S. Patent No. 7,777,651, (The 651 Patent), from Defendant Bloomberg L.P.'s Invalidity Contentions Pursuant to Patent Local Rule 3-3 Regarding U.S. Patent No. 7,777,651, *Realtime Data, LLC d/b/a IXO vs. Thomson Reuters Corp., et al.*, 6:2009-cv-00333 LED-JDL, 6:2010-cv-00247 LED-JDL, 6:2010-cv-00425 LED-JDL, Feb. 4, 2011, 480 pages.
Plaintiff's Motion for Leave to Supplement the Parties' Joint Claim Construction and Prehearing Statement filed in *Realtime Data, LLC d/b/a/IXO v. Packeteer, Inc. et al.*, Civil Action No. 6:08-cv-00144-LED; U.S. District Court for the Eastern District of Texas, Apr. 8, 2009, 123 pgs.
Defendant Citrix Opposition to Realtime's Objections to and Partially Unopposed Motion for Reconsideration of Magistrate Love's Claim Construction Memorandum and Order filed by Citrix Systems, Inc., filed on behalf of some of the defendants in *Realtime Data, LLC d/b/a/IXO v. Packeteer, Inc. et al.*, Civil Action No. 6:08-cv-00144-LED; U.S. District Court for the Eastern District of Texas, Jul. 27, 2009, 8 pgs.
Defendants' Response in Opposition to Realtime Data's Objections to and Partially Unopposed Motion for Reconsideration of Magistrate Judge Love's Claim Construction Memorandum and Order, filed on behalf of some of the defendants in *Realtime Data, LLC d/b/a/IXO v. Packeteer, Inc. et al.*, Civil Action No. 6:08-cv-00144-LED; U.S. District Court for the Eastern District of Texas, Jul. 27, 2009, 9 pgs.
"Plaintiff Realtime Data's Opposition to Defendant F5 Networks' Motion for Summary Judgment that Claims 18-20 of U.S. Patent No. 7,321,937 are Invalid (Aug. 25, 2009)" Civil Action No. 6:08-cv-00144-LED Jury Trial Demanded Filed Under Seal; In the United States District Court for the Eastern District of Texas Tyler Division. [Under Seal—Document Not Submitted].
Realtime's Response in Opposition to the Defendants' Joint Objections to Report and Recommendation of Magistrate Regarding Motion for Partial Summary Judgment of Invalidity for Indefiniteness, in *Realtime Data, LLC d/b/a/IXO v. Packeteer, Inc. et al.*, Civil Action No. 6:08-cv-00144-LED; U.S. District Court for the Eastern District of Texas, Jul. 27, 2009, 15 pgs.
Reply to Realtime's Response to Blue Coat Defendants' Objections to Report and Recommendation of United States Magistrate Judge Regarding Motion for Partial Summary Judgment of Invalidity for Indefiniteness Entered Jun. 23, 2009, in *Realtime Data, LLC d/b/a/*

*IXO v. Packeteer, Inc. et al.*, Civil Action No. 6:08-cv-00144-LED; U.S. District Court for the Eastern District of Texas, Jul. 31, 2009, 3 pgs.

Realtime Data's Sur-Reply in Opposition to the Defendants' Joint Objections to Report and Recommendation of Magistrate Regarding Motion for Partial Summary Judgment of Invalidity for Indefiniteness, in *Realtime Data, LLC d/b/a/IXO v. Packeteer, Inc. et al.*, Civil Action No. 6:08-cv-00144-LED; U.S. District Court for the Eastern District of Texas, Aug. 3, 2009, 3 pgs.

Non-Final Office Action for U.S. Appl. No. 12/684,624, mailed Nov. 10, 2010, 5 pgs.

Notice of Allowance for U.S. Appl. No. 12/123,081, mailed Feb. 17, 2011, 7 pgs.

Non-Final Office Action for U.S. Appl. No. 12/688,413, mailed Sep. 27, 2010, 13 pgs.

Notice of Allowance for U.S. Appl. No. 11/551,211, mailed Jan. 31, 2011, 4 pgs.

Notice of Allowance for U.S. Appl. No. 11/551,211, mailed Sep. 22, 2010, 4 pgs.

Notice of Allowance for U.S. Appl. No. 11/551,204, mailed Jan. 11, 2011, 4 pgs.

Notice of Allowance for U.S. Appl. No. 11/553,419, mailed Sep. 22, 2010, 4 pgs.

Notice of Allowance for U.S. Appl. No. 11/651,365, mailed Feb. 4, 2010, 8 pgs.

Notice of Allowance for U.S. Appl. No. 11/651,365, mailed Nov. 19, 2009, 8 pgs.

Non-Final Office Action for U.S. Appl. No. 09/969,987, mailed Aug. 27, 2010, 13 pgs.

Final Office Action for U.S. Appl. No. 09/969,987, mailed Jan. 28, 2010, 11 pgs.

Notice of Allowance for U.S. Appl. No. 12/131,631, mailed Jun. 22, 2010, 5 pgs.

Notice of Allowance for U.S. Appl. No. 11/551,204, mailed Sep. 30, 2010, 4 pages.

Non-Final Office Action for U.S. Appl. No. 11/551,204, mailed Jun. 16, 2009, 5 pages.

Notice of Allowance for U.S. Appl. No. 11/551,204, mailed Jun. 21, 2010, 4 pages.

Non-Final Office Action for U.S. Appl. No. 11/551,204, mailed Sep. 22, 2008, 9 pages.

Notice of Allowance for U.S. Appl. No. 11/551,204, mailed Jan. 27, 2010, 4 pages.

Non-Final Office Action for U.S. Appl. No. 12/690,125, mailed Sep. 21, 2010, 12 pages.

Final Office Action for U.S. Appl. No. 09/969,987, mailed May 23, 2011, 17 pages.

Notice of Allowance for U.S. Appl. No. 11/551,211, mailed May 6, 2011, 5 pages.

Notice of Allowance for U.S. Appl. No. 12/703,042, mailed May 5, 2011, 8 pages.

Notice of Allowance for U.S. Appl. No. 12/553,427, mailed Mar. 24, 2011, 5 pages.

Notice of Allowance for U.S. Appl. No. 11/553,419, mailed May 20, 2011, 5 pages.

International Search Report for PCT/US00/42018, mailed Jul. 31, 2001, 3 pages.

International Search Report for PCT/US01/03712, mailed May 10, 2002, 2 pages.

International Search Report for PCT/US01/03711, mailed Jan. 28, 2001, 5 pages.

Submission of prior art under 37 CFR 1.501, for U.S. Pat. No. 6,604,158, Mar. 3, 2011, 5 pgs.

Submission of prior art under 37 CFR 1.501, for U.S. Pat. No. 7,415,530, Mar. 3, 2011, 14 pgs.

Submission of prior art under 37 CFR 1.501, for U.S. Pat. No. 6,601,104, Mar. 3, 2011, 5 pgs.

Submission of prior art under 37 CFR 1.501, for U.S. Pat. No. 7,161,506, Mar. 3, 2011, 12 pgs.

Submission of prior art under 37 CFR 1.501, for U.S. Pat. No. 7,395,345, Mar. 3, 2011, 14 pgs.

Submission of prior art under 37 CFR 1.501, for U.S. Pat. No. 7,321,937, Mar. 3, 2011, 14 pgs.

Submission of prior art under 37 CFR 1.501, for U.S. Pat. No. 7,352,300, Mar. 3, 2011, 14 pgs.

Submission of prior art under 37 CFR 1.501, for U.S. Pat. No. 7,378,992, Mar. 3, 2011, 14 pgs.

Request for Inter Partes Reexaminiation of U.S. Patent No. 7,714,747, Control No. 95/001,517, filed Dec. 30, 2010, 696 pages.

Replacement Request for Inter Partes Reexamination of U.S. Patent No. 7,417,568, Control No. 95/001,533, filed Mar. 1, 2011, 357 pages.

L. Gannoun, "RTP Payload Format for X Protocol Media Streams," Audio-Visual Transport WG Internet Draft, Internet Engineering Task Force, Mar. 11, 1998, 15 pgs.

Right of Appeal Notice in Inter Partes Reexamination of U.S. Pat. No. 6,624,761, Control No. 95/000;464; issued Jan. 6, 2011, 15 pgs.

Action Closing Prosecution in Inter Partes Reexamination of U.S. Pat. No. 6,624,761, Control No. 95/000,464, issued Aug. 27, 2010, 25 pgs.

Right of Appeal Notice in Inter Partes Reexamination of U.S. Pat. No. 7,321,937, Control No. 95/000,466, issued May 24, 2010, 23 pgs.

Final Office Action in Ex Parte Reexamination of U.S. Pat. No. 6,601,104, Control No. 90/009,428, issued Feb. 15, 2010, 16 pgs.

Right of Appeal Notice for Inter Partes Reexamination of U.S. Pat. No. 7,161,506, Control No. 95/000,479, issued Jan. 27, 2011, 18 pgs.

Action Closing Prosecution in Inter Partes Reexamination of U.S. Pat. No. 7,161,506, Control No. 95/000,479, issued Aug. 27, 2010, 34 pgs.

Right of Appeal Notice for Inter Partes Reexamination of U.S. Pat. No. 7,378,992, Control No. 95/000,478, issued Jan. 6, 2011, 15 pgs.

Action Closing Prosecution in Inter Partes Reexaminiation of U.S. Pat. No. 7,378,992, Control No. 95/000,478, issued Aug. 23, 2010, 31 pgs.

Action Closing Prosecution in Inter Partes Reexamination of U.S. Pat. No. 6,604,158 Control No. 95/000,486, issued Mar. 7, 2011, 257 pgs.

Patent Owner's reply to Office Action in Inter Partes Reexamination of U.S. Patent No. 7,378,992, mailed Mar. 15, 2010, 23 pages.

Patent Owner's reply to Office Action in Inter Partes Reexamination of U.S. Patent No. 7,161,506, mailed Mar. 15, 2010, 23 pages.

Patent Owner's reply to Action Closing Prosecution of Aug. 23, 2010 in Inter Partes Reexamination of U.S. Patent 7,378,992, mailed Sep. 23, 2010, 23 pages.

Patent Owner's reply to Action Closing Prosecution of Aug. 27, 2010 in Inter Partes Reexamination of U.S. Patent 7,161,506, mailed Sep. 27, 2010, 26 pages.

Patent Owner's reply to Action Closing Prosecution of Aug. 27, 2010 in Inter Partes Reexamination of U.S. Patent 6,624,761, mailed Sep. 27, 2010, 20 pages.

Corrected Request for Inter Partes Reexamination of U.S. Patent No. 6,624,761, filed Jun. 15, 2009, 241 pages.

Request for Inter Partes Reexamination of U.S. Patent No. 7,378,992, filed May 21, 2009, 255 pages.

Request for Inter Partes Reexamination of U.S. Patent No. 7,161,506, filed May 28, 2009, 455 pages.

Request for Inter Partes Reexamination of U.S. Patent No. 7,777,651, Control No. 95/001,581, filed Mar. 21, 2011, 2,457 pages.

Request for Inter Partes Reexamination of U.S. Patent No. 7,400,274, Control No. 95/001,544, filed Feb. 14, 2011, 420 pages.

Action Closing Prosecution in Inter Partes Reexamination of U.S. Pat. No. 7,321,937, Control No. 95/000,466, issued Dec. 22, 2009, 20 pages.

Order Granting request for inter partes reexamination of U.S. Patent No. 7,400,274 and Non-Final Office Action in Inter Partes reexam of U.S. Patent No. 7,400,274, Control No. 95/001,544, issued Mar. 25, 2011, 47 pages.

Appeal Brief filed in Ex Partes Reexamination of U.S. Patent No. 6,601,104, Control No. 90/009,428, Sep. 2, 2010, 28 pages.

Order Adopting Report and Recommendation of United States Magistrate Judge, *Realtime Data, LLC D/B/A Ixo v. Packeteer, Inc., et al.*, District Court for the Eastern District of Texas, No. 6:08cv144, Aug. 24, 2009, 2 pgs.

Second Amended Answer filed on behalf of Citrix Systems, Inc, (includes allegations of inequitable conduct on at least pp. 24-43) filed in *Realtime Data, LLC d/b/a/IXO v. Packeteer, Inc. et al.*, Civil Action No. 6:08-cv-00144-LED; U.S. District Court for the Eastern District of Texas, Feb. 10, 2009, 45 pgs.
Expert Report of James B. Gambrell on Inequitable Conduct filed on behalf of some of the defendants [Includes Appendices—Exhibits A-I] filed in *Realtime Data, LLC d/b/a/IXO v. Packeteer, Inc. et al.*, Civil Action No. 6:08-cv-00144-LED; U.S. District Court for the Eastern District of Texas, Jun. 10, 2009, 57 pgs.
Exhibit A of Expert Report of James B. Gambrell on Inequitable Conduct filed on behalf of some of the defendants filed in *Realtime Data, LLC d/b/a/IXO v. Packeteer, Inc. et al.*, Civil Action No. 6:08-cv-00144-LED; U.S. District for the Eastern District of Texas, Jun. 10, 2009, 6 pgs.
Exhibit B of Expert Report of James B. Gambrell on Inequitable Conduct filed on behalf of some of the defendants filed in *Realtime Data, LLC d/b/a/IXO v. Packeteer, Inc. et al.*, Civil Action No. 6:08-cv-00144-LED; U.S. District Court for the Eastern District of Texas, Jun. 10, 2009, 3 pgs.
Exhibit C of Expert Report of James B. Gambrell on Inequitable Conduct filed on behalf of some of the defendants filed in *Realtime Data, LLC d/b/a/IXO v. Packeteer, Inc. et al.*, Civil Action No. 6:08-cv-00144-LED; U.S. District Court for the Eastern District of Texas, Jun. 10, 2009, 2 pgs.
Exhibit D of Expert Report of James B. Gambrell on Inequitable Conduct filed on behalf of some of the defendants filed in *Realtime Data, LLC d/b/a/IXO v. Packeteer, Inc. et al.*, Civil Action No. 6:08-cv-00144-LED; U.S. District Court for the Eastern District of Texas, Jun. 10, 2009, 2 pgs.
Exhibit E of Expert Report of James B. Gambrell on Inequitable Conduct filed on behalf of some of the defendants filed in *Realtime Data, LLC d/b/a/IXO v. Packeteer, Inc. et al.*, Civil Action No. 6:08-cv-00144-LED; U.S. District Court for the Eastern District of Texas, Jun. 10, 2009, 2 pgs.
Exhibit F of Expert Report of James B. Gambrell on Inequitable Conduct filed on behalf of some of the defendants filed in *Realtime Data, LLC d/b/a/IXO v. Packeteer, Inc. et al.*, Civil Action No. 6:08-cv-00144-LED; U.S. District Court for the Eastern District of Texas, Jun. 10, 2009, 2 pgs.
Exhibit G of Expert Report of James B. Gambrell on Inequitable Conduct filed on behalf of some of the defendants filed in *Realtime Data, LLC d/b/a/IXO v. Packeteer, Inc. et al.*, Civil Action No. 6:08-cv-00144-LED; U.S. District Court for the Eastern District of Texas, Jun. 10, 2009, 2 pgs.
Exhibit H of Expert Report of James B. Gambrell on Inequitable Conduct filed on behalf of some of the defendants filed in *Realtime Data, LLC d/b/a/IXO v. Packeteer, Inc. et al.*, Civil Action No. 6:08-cv-00144-LED; U.S. District Court for the Eastern District of Texas, Jun. 10, 2009, 2 pgs.
Exhibit I of Expert Report of James B. Gambrell on Inequitable Conduct filed on behalf of some of the defendants filed in *Realtime Data, LLC d/b/a/IXO v. Packeteer, Inc. et al.*, Civil Action No. 6:08-cv-00144-LED; U.S. District Court for the Eastern District of Texas, Jun. 10, 2009, 117 pgs.
Expert Report of Dr. James A. Storer on Invalidity filed on behalf of some of the defendants [Includes Appendices—Exhibits A-K (Exhibit A has been redacted pursuant to a protective order)] filed in *Realtime Data, LLC d/b/a/IXO v. Packeteer, Inc. et al.*, Civil Action No. 6:08-cv-00144-LED; U.S. District Court for the Eastern District of Texas, Jun. 10, 2009, 1090 pgs.
Supplementary Expert Report of Dr. James A. Storer on Invalidity filed on behalf of some of the defendants [Includes Appendices—Exhibits 1-8] filed in *Realtime Data, LLC d/b/a/IXO v. Packeteer, Inc. et al.*, Civil Action No. 6:08-cv-00144-LED; U.S. District Court for the Eastern District of Texas, Jun. 19, 2009, 301 pgs.
Deposition of Dr. James A. Storer conducted on behalf of the plaintiffs filed in *Realtime Data, LLC d/b/a/IXO v. Packeteer, Inc. et al.*, Civil Action No. 6:08-cv-00144-LED; U.S. District Court for the Eastern District of Texas, Feb. 27, 2009, 242 pgs.
Deposition of Brian Von Herzen conducted on behalf of the plaintiffs filed in *Realtime Data, LLC d/b/a/IXO v. Packeteer, Inc. et al.*, Civil Action No. 6:08-cv-00144-LED; U.S. District Court for the Eastern District of Texas, Feb. 26, 2009, 241 pgs.

Second Amended Complaint filed on behalf of the Plaintiff in *Realtime Data, LLC d/b/a/IXO v. Packeteer, Inc. et al.*, Civil Action No. 6:08-cv-00144-LED; U.S. District Court for the Eastern District of Texas, Feb. 10, 2009, 28 pgs.
Answers to the Second Amended Complaint and Counterclaims filed by Citrix Systems, Inc, in *Realtime Data, LLC d/b/a/IXO v. Packeteer, Inc. et al.*, Civil Action No. 6:08-cv-00144-LED; U.S. District Court for the Eastern District of Texas, Feb. 17, 2009, 46 pgs.
Answers to the Second Amended Complaint and Counterclaims filed by F5 Networks, Inc, in *Realtime Data, LLC d/b/a/IXO v. Packeteer, Inc. et al.*, Civil Action No. 6:08-cv-00144-LED; U.S. District Court for the Eastern District of Texas, Feb. 17, 2009, 17 pgs.
Answers to the Second Amended Complaint and Counterclaims filed by Averitt Express, Inc, in *Realtime Data, LLC d/b/a/IXO v. Packeteer, Inc. et al.*, Civil Action No. 6:08-cv-00144-LED; U.S. District Court for the Eastern District of Texas, Feb. 17, 2009, 17 pgs.
Answers to the Second Amended Complaint and Counterclaims filed by DHL Express, Inc, in *Realtime Data, LLC d/b/a/IXO v. Packeteer, Inc. et al.*, Civil Action No. 6:08-cv-00144-LED; U.S. District Court for the Eastern District of Texas, Feb. 17, 2009, 37 pgs.
Answers to the Second Amended Complaint and Counterclaims filed by Expand Networks, Inc, Interstate Battery System of America, Inc., and O'Reilly Automotive, Inc. in *Realtime Data LLC d/b/a/IXO v. Packeteer, Inc. et al.*, Civil Action No. 6:08-cv-00144-LED; U.S. District Court for the Eastern District of Texas, Feb. 17, 2009, 21 pgs.
Answers to the Second Amended Complaint and Counterclaims filed by Blue Coat Systems, Inc., Packeteer, Inc., 7-Eleven, Inc., ABM Industries, Inc., ABM Janitorial Services-South Central, Inc., and Build-A-Bear Workshop, Inc. in *Realtime Data, LLC d/b/a/IXO v. Packeteer, Inc. et al.*, Civil Action No. 6:08-cv-00144-LED; U.S. District Court for the Eastern District of Texas, Feb. 18, 2009, 84 pgs.
Plaintiff's Response to the Answers to the Second Amended Complaint and Counterclaims filed by Citrix Systems, Inc, in *Realtime Data, LLC d/b/a/IXO v. Packeteer, Inc. et al.*, Civil Action No. 6:08-cv-00144-LED; U.S. District Court for the Eastern District of Texas, Mar. 4, 2009, 24 pgs.
Plaintiff's Responses to the Answers to the Second Amended Complaint and Counterclaims filed by F5 Networks, Inc, in *Realtime Data, LLC d/b/a/IXO v. Packeteer, Inc. et al.*, Civil Action No. 6:08-cv-00144-LED; U.S. District Court for the Eastern District of Texas, Mar. 4, 2009, 5 pgs.
Plaintiff's Responses to the Answers to the Second Amended Complaint and Counterclaims filed by Averitt Express, Inc, in *Realtime Data, LLC d/b/a/IXO v. Packeteer, Inc. et al.*, Civil Action No. 6:08-cv-00144-LED; U.S. District Court for the Eastern District of Texas, Mar. 4, 2009, 5 pgs.
Plaintiff's Responses to the Answers to the Second Amended Complaint and Counterclaims filed by DHL Express, Inc, in *Realtime Data, LLC d/b/a/IXO v. Packeteer, Inc. et al.*, Civil Action No. 6:08-cv-00144-LED; U.S. District Court for the Eastern District of Texas, Mar. 4, 2009, 17 pgs.
Plaintiff's Responses to the Answers to the Second Amended Complaint and Counterclaims filed by Expand Networks, Inc, Interstate Battery System of America, Inc., and O'Reilly Automotive, Inc. in *Realtime Data, LLC d/b/a/IXO v. Packeteer, Inc. et al.*, Civil Action No. 6:08-cv-00144-LED; U.S. District Court for the Eastern District of Texas, Mar. 4, 2009, 15 pgs.
Plaintiff's Responses to the Answers to the Second Amended Complaint and Counterclaims filed by Blue Coat Systems, Inc., Packeteer, Inc., 7-Eleven, Inc., ABM Industries, Inc., ABM Janitorial Services-South Central, Inc., and Build-A-Bear Workshop, Inc. in *Realtime Data, LLC d/b/a/IXO v. Packeteer, Inc. et al.*, Civil Action No. 6:08-cv-00144-LED; U.S. District Court for the Eastern District of Texas, Mar. 4, 2009, 34 pgs.
Opening Claim Construction Brief filed in *Realtime Data, LLC d/b/a/IXO v. Packeteer, Inc. et al.*, Civil Action No. 6:08-cv-00144-LED; U.S. District Court for the Eastern District of Texas, Mar. 5, 2009, 36 pgs.
Declaration of Jordan Adler in support of the Opening Claim Construction Brief filed in *Realtime Data, LLC d/b/a/IXO v. Packeteer, Inc. et al.*, Civil Action No. 6:08-cv-00144-LED; U.S. District Court for the Eastern District of Texas, Mar. 5, 2009, 214 pgs.

Motion for Partial Summary Judgment for Invalidity of some of the Patents in Suit for Indefiniteness, including the '104 patent, filed on behalf of the defendants in *Realtime Data, LLC d/b/a/IXO v. Packeteer, Inc. et al.*, Civil Action No. 6:08-cv-00144-LED; U.S. District Court for the Eastern District of Texas, Mar. 16, 2009, 22 pgs.
Declaration of Michele E. Moreland in support Motion for Partial Summary Judgment for Invalidity of some of the Patents in Suit for Indefiniteness, including the '104 patent, filed on behalf of the defendants in *Realtime Data, LLC d/b/a/IXO v. Packeteer, Inc. et al.*, Civil Action No. 6:08-cv-00144-LE, Mar. 16, 2009, 168 pgs.
Declaration of James A. Storer in support Motion for Partial Summary Judgment for Invalidity of some of the Patents in Suit for Indefiniteness, including the '104 patent, filed on behalf of the defendants in *Realtime Data, LLC d/b/a/IXO v. Packeteer, Inc. et al.*, Civil Action No. 6:08-cv-00144-LE, Mar. 16, 2009, 27 pgs.
Joint Defendants Reply regarding Motion for Partial Summary Judgment for Invalidity of some of the Patents in Suit for Indefiniteness, including the '104 patent, filed on behalf of the defendants in *Realtime Data, LLC d/b/a/IXO v. Packeteer, Inc. et al.*, Civil Action No. 6:08-cv-00144-LE, Apr. 2, 2009, 20 pgs.
Responsive Briefs in Support of Claim Construction filed by Blue Coats Systems, Inc., Packeteer Inc., 7-Eleven, Inc., ABM Industries, Inc., ABM Janitorial Services-South Central, Inc. and Build-A-Bear Workshop, Inc. in *Realtime Data, LLC d/b/a/IXO v. Packeteer, Inc. et al.*, Civil Action No. 6:08-cv-00144-LED; U.S. District Court for the Eastern District of Texas, Mar. 19, 2009, 451 pgs.
Responsive Briefs in Support of Claim Construction filed by F5 Networks, Inc. and Averitt Express, Inc. in *Realtime Data, LLC d/b/a/IXO v. Packeteer, Inc. et al.*, Civil Action No. 6:08-cv-00144-LED; U.S. District Court for the Eastern District of Texas, Mar. 19, 2009, 20 pgs.
Responsive Briefs in Support of Claim Construction filed by Citrix Systems, Inc., Expand Networks, Inc., DHL Express (USA), Inc., Interstate Battery System of America, Inc., and O'Reilly Automotive Inc. in *Realtime Data, LLC d/b/a/IXO v. Packeteer, Inc. et al.*, Civil Action No. 6:08-cv-00144-LED; U.S. District Court for the Eastern District of Texas, Mar. 16, 2009, 377 pgs.
Declaration of Dr. James A. Storer filed in Support of the Brief in Support of Claim Construction filed on behalf of of F5 Networks, Inc. and Averitt Express, Inc in *Realtime Data, LLC d/b/a/IXO v. Packeteer, Inc. et al.*, Civil Action No. 6:08-cv-00144-LED [including Exhibits 1-2]; U.S. District Court for the Eastern District of Texas, Mar. 19, 2009, 778 pgs.
Defendant Citrix Systems, Inc.'s Motion to Exclude Dr. Brian Von Herzen's Opinions Regarding Claim Construction filed in *Realtime Data, LLC d/b/a/IXO v. Packeteer, Inc. et al.*, Civil Action No. 6:08-cv-00144-LED; U.S. District Court for the Eastern District of Texas, Mar. 20, 2009, 244 pgs.
Plaintiff's Opposition to Defendant Citrix Systems, Inc.'s Motion to Exclude Dr. Brian Von Herzen's Opinions Regarding Claim Construction filed in *Realtime Data, LLC d/b/a/IXO v. Packeteer, Inc. et al.*, Civil Action No. 6:08-cv-00144-LED; U.S. District Court for the Eastern District of Texas, Mar. 20, 2009, 20 pgs.
Declaration of Karam Oussayef submitted in support of the Opposition of Plaintiff's Opposition to Defendant Citrix Systems, Inc.'s Motion to Exclude Dr. Brian Von Herzen's Opinions Regarding Claim Construction filed in *Realtime Data, LLC d/b/a/IXO v. Packeteer, Inc. et al.*, Civil Action No. 6:08-cv-00144-LED; U.S. District Court for the Eastern District of Texas, Mar. 16, 2009, 119 pgs.
Order of the Court Denying Defendant Citrix Systems, Inc.'s Motion to Exclude Dr. Brian Von Hersen's Opinions Regarding Claim Construction, *Realtime Data, LLC D/B/A Ixo v. Packeteer, Inc. et al.*, District Court for the Eastern District of Texas, No. 6:08cv144, dated Apr. 6, 2009, 1 page.
Parties Joint Submission of Terms to be Heard at the Markman Hearing filed in *Realtime Data, LLC d/b/a/IXO v. Packeteer, Inc. et al.*, Civil Action No. 6:08-cv-00144-LED; U.S. District Court for the Eastern District of Texas, dated Mar. 24, 2009, 5 pages.
Order of the Court Regarding the terms to be heard at the Markman Hearing in *Realtime Data, LLC d/b/a/IXO v. Packeteer, Inc. et al.*, Civil Action No. 6:08-cv-00144-LED; U.S. District Court for the Eastern District of Texas, dated Mar. 25, 2009, 2 pages.

Transcript of the Markman Hearing held on Apr. 9, 2009 in *Realtime Data, LLC d/b/a/IXO v. Packeteer, Inc. et al.*, Civil Action No. 6:08-cv-00144-LED; U.S. District Court for the Eastern District of Texas, dated Apr. 9, 2009, 174 pages.
Plaintiff's Reply Claim Construction Brief filed in *Realtime Data, LLC d/b/a/IXO v. Packeteer, Inc. et al.*, Civil Action No. 6:08-cv-00144-LED; U.S. District Court for the Eastern District of Texas, dated Mar. 30, 2009, 30 pages.
Declaration of Brian von Herzen in Support of the Plaintiff's Reply Claim Construction Brief filed in *Realtime Data, LLC d/b/a/IXO v. Packeteer, Inc. et al.*, Civil Action No. 6:08-cv-00144-LED; U.S. District Court for the Eastern District of Texas, dated Mar. 30, 2009, 25 pages.
F5 Sur-Reply to Plaintiff's Claim Construction Brief filed by some of the defendants in *Realtime Data, LLC d/b/a/IXO v. Packeteer, Inc. et al.*, Civil Action No. 6:08-cv-00144-LED; U.S. District Court for the Eastern District of Texas, dated Apr. 3, 2009, 12 pages.
Citrix Sur-reply to Plaintiff's Claim COnstruction Brief filed by some of the defendants in *Realtime Data, LLC d/b/a/IXO v. Packeteer, Inc. et al.*, Civil Action No. 6:08-cv-00144-LED; U.S. District Court for the Eastern District of Texas, dated Apr. 3, 2009, 13 pages.
Blue Coat Sur-Reply to Plaintiff's Claim Construction Brief filed by some of the defendants in *Realtime Data, LLC d/b/a/IXO v. Packeteer, Inc. et al.*, Civil Action No. 6:08-cv-00144-LED; U.S. District Court for the Eastern District of Texas, dated Apr. 3, 2009, 12 pages.
Declaration of Michele Moreland in Support of Sur-Replies to Plaintiff's Claim Construction Brief filed by some of the defendants in *Realtime Data, LLC d/b/a/IXO v. Packeteer, Inc. et al.*, Civil Action No. 6:08-cv-00144-LED; U.S. District Court for the Eastern District of Texas, dated Apr. 3, 2009, 8 pages.
Declaration of James Storer in Support of Sur-Replies to Plaintiff's Claim Construction Brief filed by some of the defendants in *Realtime Data, LLC d/b/a/IXO v. Packeteer, Inc. et al.*, Civil Action No. 6:08-cv-00144-LED; U.S. District Court for the Eastern District of Texas, dated Apr. 7, 2009, 6 pages.
Plaintiff's Motion for Leave to Supplement the Parties' Joint Claim Construction and Prehearing Statement filed in *Realtime Data, LLC d/b/a/IXO v. Packeteer, Inc. et al.*, Civil Action No. 6:08-cv-00144-LED; U.S. District Court for the Eastern District of Texas, dated Apr. 8, 2009, 123 pages.
Motion for Reconsideration of the Court's Order Denying Plaintiff's Motion for Leave to Supplement the Parties' Joint Claim Construction and Prehearing Statement filed in *Realtime Data, LLC d/b/a/IXO v. Packeteer, Inc. et al.*, Civil Action No. 6:08-cv-00144-LED; U.S. District Court for the Eastern District of Texas, Jul. 13, 2009, 3 pages.
Notice of Agreement to Claim Term between Plaintiff and Defendant filed in *Realtime Data, LLC d/b/a/IXO v. Packeteer, Inc. et al.*, Civil Action No. 6:08-cv-00144-LED; U.S. District Court for the Eastern District of Texas, Apr. 22, 2009, 3 pages.
Provisional Claim Construction Order issued by the Court on Jun. 2, 2009 in *Realtime Data, LLC d/b/a/IXO v. Packeteer, Inc. et al.*, Civil Action No. 6:08-cv-00144-LED; U.S. District Court for the Eastern District of Texas, Jun. 2, 2009, 28 pages.
Citrix Request for Consideration and Objections to the Provisional Claim Construction Order issued by the Court on Jun. 2, 2009 filed on behalf of some of the defendants in *Realtime Data, LLC d/b/a/IXO v. Packeteer, Inc. et al.*, Civil Action No. 6:08-cv-00144-LED; U.S. District Court for the Eastern District of Texas, Jul. 9, 2009, 22 pages.
Blue Coat Request for Consideration and Objections to the Provisional Claim Construction Order issued by the Court on Jun. 2, 2009 filed on behalf of some of the defendants in *Realtime Data, LLC d/b/a/IXO v. Packeteer, Inc. et al.*, Civil Action No. 6:08-cv-00144-LED; U.S. District Court for the Eastern District of Texas, Jul. 10, 2009, 9 pages.
F5 Request for Consideration and Objections to the Provisional Claim Construction Order issued by the Court on Jun. 2, 2009 filed on behalf of some of the defendants in *Realtime Data, LLC d/b/a/IXO v. Packeteer, Inc. et al.*, Civil Action No. 6:08-cv-00144-LED; U.S. District Court for the Eastern District of Texas, Jul. 10, 2009, 15 pages.
Comtech AHA Corporation's Complaint in Intervention against the Plaintiff filed in *Realtime Data, LLC d/b/a/IXO v. Packeteer, Inc. et* al., Civil Action No. 6:08-cv-00144-LED; U.S. District Court for the Eastern District of Texas, dated Apr. 6, 2009, 8 pages.

Memorandum Opinion and Order regarding Claim Constriction issued by the Court on Jun. 22, 2009 in *Realtime Data, LLC d/b/a/ IXO* v. *Packeteer, Inc. et al.*, Civil Action No. 6:08-cv-00144-LED; U.S. District Court for the Eastern District of Texas.

Report and Recommendation of United States Magistrate Judge on Motion for Partial Summary Judgment issued on Jun. 23, 2009, in *Realtime Data, LLC d/b/a/IXO* v. *Packeteer, Inc. et al.*, Civil Action No. 6:08-cv-00144-LED; U.S. District Court for the Eastern District of Texas.

Objection to Report and Recommendation of United States Magistrate Judge on Motion for Partial Summary Judgment issued on Jun. 23, 2009, filed by defendant Blue Coat in *Realtime Data, LLC d/b/ a/IXO* v. *Packeteer, Inc. et al.*, Civil Action No. 6:08-cv-00144-LED; U.S. District Court for the Eastern District of Texas.

Plaintiff's Objections to and Partially Unopposed Motion for Reconsideration of the Report and Recommendation of United States Magistrate Judge on Motion for Partial Summary Judgment issued on Jun. 23, 2009, in *Realtime Data, LLC d/b/a/IXO* v. *Packeteer, Inc. et al.*, Civil Action No. 6:08-cv-00144-LED; U.S. District Court for the Eastern District of Texas.

Citrix Opposition to Plaintiff's Objections to and Partially Unopposed Motion for Reconsideration of the Report and Recommendation of United States Magistrate Judge on Motion for Partial Summary Judgment issued on Jun. 23, 2009, filed on behalf of some of the defendants in *Realtime Data, LLC d/b/a/IXO* v. *Packeteer, Inc. et al.*, Civil Action No. 6:08-cv-00144-LED; U.S. District Court for the Eastern District of Texas.

F5 Opposition to Plaintiff's Objections to and Partially Unopposed Motion for Reconsideration of the Report and Recommendation of United States Magistrate Judge on Motion for Partial Summary Judgment issued on Jun. 23, 2009, filed on behalf of some of the defendants in *Realtime Data, LLC d/b/a/IXO* v. *Packeteer, Inc. et al.*, Civil Action No. 6:08-cv-00144-LED; U.S. District Court for the Eastern District of Texas.

Plaintiff's Reply to Citrix Opposition to Plaintiff's Objections to and Partially Unopposed Motion for Reconsideration of the Report and Recommendation of United States Magistrate Judge on Motion for Partial Summary Judgment issued on Jun. 23, 2009, in *Realtime Data, LLC d/b/a/IXO* v. *Packeteer, Inc. et al.*, Civil Action No. 6:08-cv-00144-LED; U.S. District Court for the Eastern District of Texas.

Plaintiff's Reply to Blue Coat Opposition to Plaintiff's Objections to and Partially Unopposed Motion for Reconsideration of the Report and Recommendation of United States Magistrate Judge on Motion for Partial Summary Judgment issued on Jun. 23, 2009, in *Realtime Data, LLC d/b/a/IXO* v. *Packeteer, Inc. et al.*, Civil Action No. 6:08-cv-00144-LED; U.S. District Court for the Eastern District of Texas.

Plaintiff's selected Responses to Defendant Citrix System's Interrogatories and First Set of Requests for Admission filed in *Realtime Data, LLC d/b/a/IXO* v. *Packeteer, Inc. et al.*, Civil Action No. 6:08-cv-00144-LED; U.S. District Court for the Eastern District of Texas.

Script for Defendants' Joint Claim Construction Technology Tutorial Presented to the Magistrate Judge in *Realtime Data, LLC d/b/a/IXO* v. *Packeteer, Inc. et al.*, Civil Action No. 6:08-cv-00144-LED; U.S. District Court for the Eastern District of Texas, 95 pgs.

Preliminary data Sheet, 9600 Data Compressor Processor, Hi/fn, 1997-99, HIFN 000001-68, 68 pgs.

Data Sheet, 9751 Data Compression Processor, 1997-99, HIFN 000069-187, 119 pgs.

Signal Termination Guide, Application Note, Hi/fn, 1997-98, HIFN 000188-194, 7 pgs.

How LZS Data Compression Works, Application Note, Hi/fn, 1997-99, HIFN 000195-207, 13 pgs.

Reference Hardware, 9751 Compression Processor, Hi/fn, 1997-99, HIFN 000208-221, 14 pgs.

Using 9751 in Big Endian Systems, Application Note, Hi/fn, 1997-99, HIFN 000222-234, 13 pgs.

Specification Update, 9751 Compression Processor, Hi/fn, 1997-2000, HIFN 000235-245, 11 pgs.

9732AM Product Release, Hi/fn, 1994-99, HIFN 000246-302, 57 pgs.

Data Sheet, 9732A Data Compression Processor, Hi/fn, 1997-99, HIFN 000303-353, 51 pgs.

9711 to 7711 Migration, Application Note, Hi/fn, 1997-99, HIFN 000354-361, 8 pgs.

Specification Update, 9711 Data Compression Processor, Hi/fn, 1997-99, HIFN 000362-370, 9 pgs.

Differences Between the 9710 & 9711 Processors, Application Note, Hi/fn, 1997-99, HIFN 000371-77, 7 pgs.

Specification Update, 9710 Data Compression Processor, Hi/fn, 1997-99, HIFN 000378-388, 11 pgs.

9706/9706A Data Compression Coprocessor Data Sheet, Stac Electronics, 1991-97, HIFN 000389-473, 85 pgs.

9705/9705A Data Compression Coprocessor, Stac Electronics, 1988-96, HIFN 000474-562, 88 pgs.

9705/9705A Data Compression Coprocessor Data Sheet, Stac Electronics, 1988-96, HIFN 000563-649, 87 pgs.

9700/9701 Compression Coprocessors, Hi/fn, 1997, HIFN 000650-702, 53 pgs.

Data Sheet 9610 Data Compression Processor, Hi/fn, 1997-98, HIFN 000703-744, 42 pgs.

Specification Update 9610 Data Compression Processor, Hi/fn, 1997-99, HIFN 000745-751, 7 pgs.

9705 Data Compression Coprocessor, Stac Electronics, 1988-92, HIFN 000752-831, 80 pgs.

9705 Network Software Design Guide, Application Note, Stac Electronics, 1990-91, HIFN 000832-861, 30 pgs.

Data Sheet 9601 Data Compression Processor, Hi/fn, May 21, 1998, HIFN 000862-920, 59 pgs.

7751 Encryption Processor Reference Kit, Hi/fn, Apr. 1999, HIFN 000921-1114, 194 pgs.

Hardware Data Book, Hi/fn, Nov. 1998, HIFN 001115-1430, 316 pgs.

Data Compression Data Book, Hi/fn, Jan. 1999, HIFN 001431-1889, 459 pgs.

Reference Software 7751 Encryption Processor, Hi/fn, Nov. 1998, HIFN 002164-2201, 38 pgs.

Interface Specification for Synergize Encoding/Decoding Program. JPB, Oct. 10, 1997, HIFN 002215-2216, 2 pgs.

Anderson, Chip, Extended Memory Specification Driver, 1998, HIFN 002217-2264, 48 pgs.

Whiting, Doug, LZS Hardware API, Mar. 12, 1993, HIFN 002265-68, 4 pgs.

Whiting, Doug, Encryption in Sequoia, Apr. 28, 1997, HIFN 002309-2313, 5 pgs.

LZS221-C Version 4 Data Compression Software, Data Sheet, Hi/fn, 1994-97, HIFN 002508-2525, 18 pgs.

eXtended Memory Specification (XMS), ver. 2.0, Microsoft, Jul. 19, 1988, HIFN 002670-2683, 14 pgs.

King, Stanley, Just for Your Info—From Microsoft 2, May 4, 1992, HIFN 002684-2710, 27 pgs.

eXtended Memory Specification (XMS), ver. 2.0, Microsoft, Jul. 19, 1988, HIFN 002711-2724, 14 pgs.

Advanced LZS Technology (ALZS), Whitepaper, Hi/fn, Jun. 1, 1998, HIFN 002725-2727, 3 pgs.

Secure Tape Technology (STT) Whitepaper, Hi/fn, Jun. 1, 1998, HIFN 002728-2733, 6 pgs.

SSLRef 3.0 API Details, Netscape, Nov. 19, 1996, HIFN 002734-2778, 45 pgs.

LZS221-C Version 4 Data Compression Software Data Sheet, Hi/fn, 1994-97, HIFN 002779-2796, 18 pgs.

MPPC-C Version 4 Data Compression Software Data Sheet, Hi/fn, 1994-1997, HIFN 002797-2810, 14 pgs.

Magstar MP 3570 Tape Subsystem, Operator Guide, B-Series Models, 1998-1999, [IBM_1_601 pp. 339-525], 187 pages.

Preview, IBM Magstar 3590 Tape System Enhancements, Hardware Announcement, Feb. 16, 1999, [IBM_1_601 pp. 526-527], 2 pgs.

New IBM Magstar 3590 Models E11 and E1A Enahance Tape Drive Performance, Hardware Announcement, Apr. 20, 1999, [IBM_1_601 pp. 528-540] 13 pgs.

New IBM Magstar 3590 Model A60 Dramatically Enhances Tape Drive Performance, Hardware Announcement Jul. 27, 1999, [IBM_1_601 pp. 541-550] 10 pgs.

The IBM Magstar MP Tape Subsystem Provides Fast Access to Data, Sep. 3, 1996, Announcement No. 196-176, [IBM_1_601 pp. 551-563] 13 pgs.

IBM 3590 High Performance Tape Subsystem, Apr. 10, 1995, Announcement 195-106, [IBM_1_601 pp. 564-581] 18 pgs.

Standard ECMA-222 (Jun. 1995): ECMA—Standardizing Information and Communications Systems, Adaptive Lossless Data Compression Algorithm, [IBM_1_601 pp. 564-601] 38 pgs.

IBM 3590 and 3494 Revised Availability, Hardware Announcement Aug. 8, 1995, [IBM_743_1241 p. 1] 1 pg.

Direct Delivery of IBM 3494, 3466, and 3590 Storage Products, Hardware Announcement, Sep. 30, 1997, Announcement 197-297, [IBM_743_1241 pp. 2-3] 2 pgs.

IBM Magstar 3590 Enhances Open Systems, Hardware Announcement Feb. 9, 1996, Announcement 198-014, [IBM_743_1241 pp. 4-7] 4 pgs.

Hardware Withdrawal: IBM Magstar 3590 A00 Controller—Replacement Available, Announcement No. 197-267, Withdrawal Announcement, Dec. 9, 1997, [IBM_743_1241 p. 9] 1 pg.

IBM Magstar 3590 Tape Subsystem, Introduction and Planning Guide, Document No. GA32-0329007, [IBM_743_1241 pp. 10-499] 490 pgs.

NetMeeting 2.0 Reviewers Guide, Apr. 1997, [MSCS_298_339] 42 pgs.

Microsoft NetMeeting Compatible Products and Services Directory, Apr. 1997, [MSCS_242_297] 56 pgs.

Microsoft NetMeeting "Try This!" Guide, 1997, [MSCS_340_345] 6 pgs.

The Professional Companion to NetMeeting 2—The Technical Guide to Installing, Configuring, and Supporting NetMeeting 2.0 in Your Organization—Microsoft NetMeeting 2.0, 1996-97, [MSCS_2_241] 240 pgs.

CUSeeMe 3.1.2 User Guide, Nov. 1998, [RAD_1_220] 220 pgs.

MeetingPoint Conference Server Users Guide 3.0, Nov. 1997, [RAD_221_548] 328 pgs.

MeetingPoint Conference Server Users Guide 4.0.2, Dec. 1999, [RAD_549_818] 270 pgs.

MeetingPoint Conference Service Users Guide 3.5.1, Dec. 1998, [RAD_819_1062] 244 pgs.

Enhanced CUSeeMe—Authorized Guide, 1995-1996, [RAD_1063_1372] 310 pgs.

Meeting Point Reader File, Jun. 1999, [RAD_1437_1445] 9 pgs.

Press Release—White Pine Announces Launch of MeetingPoint Conferences Server, Oct. 9, 1997, [RAD_1738_1739] 2 pgs.

Press Release—Leading Network Service Providers Line Up to Support White Pine's MeetingPoint Conference Server Technology, Oct. 9, 1997, [RAD_1740_1743] 4 pgs.

BYTE—A New MeetingPoint for Videoconferencing, Oct. 9, 1997, [RAD_1744_1750] 7 pgs.

Declaration of Patrick Gogerty, *Realtime Data, LLC D/B/A/ IXO v. Packeteer, Inc., et al.*, District Court for the Eastern District of Texas, No. 6:08cv144, executed May 8, 2009, 3 pgs.

Other Responses to Interrogatories, Requests for Admission, and Objections to Requests for Admission filed in *Realtime Data, LLC d/b/a/IXO v. Packeteer, Inc. et al.*, Civil Action No. 6:08-cv-00144-LED; U.S. District Court for the Eastern District of Texas, filed on Apr. 18, 2008 and terminated Feb. 2, 2010. (PTO Notified—Document Not submitted).

Deposition Transcript of persons involved in litigation, including inventor James Fallon, and third-party witnesses Jim Karp, Ke-Chiang Chu, and Frank V. DeRosa filed in *Realtime Data, LLC d/b/a/IXO v. Packeteer, Inc. et al.*, Civil Action No. 6:08-cv-00144-LED; U.S. District Court for the Eastern District of Texas, filed on Apr. 18, 2008 and terminated Feb. 2, 2010. (PTO Notified—Document Not submitted).

Office of Rebuttal Expert Reports of Dr. Brian Von Herzen, Lester L. Hewitt and Dr. James A. Storer, and Expert Reports of Dr. James A. Storer and Dr. Nathaniel Polish filed in *Realtime Data, LLC d/b/a/ IXO v. Packeteer, Inc. et al.*, Civil Action No. 6:08-cv-00144-LED; U.S. District Court for the Eastern District of Texas, filed on Apr. 18, 2008 and terminated Feb. 2, 2010. (PTO Notified—Document Not submitted).

Proposed Amended Infringement Contentions filed in *Realtime Data, LLC d/b/a/IXO v. Packeteer, Inc. et al.*, Civil Action No. 6:08-cv-00144-LED; U.S. District Court for the Eastern District of Texas, filed on Apr. 18, 2008 and terminated Feb. 2, 2010. (PTO Notified—Document Not submitted).

Documents Concerning Agreements for Meiations and Mediation Proceedings Between Plaintiffs and Some of the Defendants filed in *Realtime Data, LLC d/b/a/IXO v. Packeteer, Inc. et al.*, Civil Action No. 6:08-cv-00144-LED; U.S. District Court for the Eastern District of Texas, filed on Apr. 18, 2008 and terminated Feb. 2, 2010. (PTO Notified—Document Not submitted).

Plaintiff's Opposition to Joint Defendant's Motion for Partial Summary Judgment of Invalidity of some of the patents in Suit for indefiniteness, including the '104 patent, Blue Coat's response to this objection, Blue Coat's Reply to Plaintiff's response ans Plaintiff's Sur-Reply to Blue Coat's Reply filed in *Realtime Data, LLC d/b/a/ IXO v. Packeteer, Inc. et al.*, Civil Action No. 6:08-cv-00144-LED; U.S. District Court for the Eastern District of Texas, (PTO Notified—Document Not submitted).

Plaintiff's Amended P.R. 3-1 Disclosures and Infringement Contentions, Defendants' Motions to Strike unauthorized portions of these disclosures, and Sur-Replies to these Motions filed in *Realtime Data, LLC d/b/a/IXO v. Packeteer, Inc. et al.*, Civil Action No. 6:08-cv-00144-LED; U.S. District Court for the Eastern District of Texas, filed on Apr. 18, 2008 and terminated Feb. 2, 2010. (PTO Notified—Document Not submitted)

Expert Report of Dr. James A. Storer Regarding Non-Infringement that contains positions related to the validity of the patents in suit filed in *Realtime Data, LLC d/b/a/IXO v. Packeteer, Inc. et al.*, Civil Action No. 6:08-cv-00144-LED; U.S. District Court for the Eastern District of Texas, filed on Apr. 18, 2008 and terminated Feb. 2, 2010. (PTO Notified—Document Not submitted).

Ex Parte Reexaminiation Interview Summary, mailed Dec. 3, 2009, for U.S. Reexam App. No. 90/009,428.

*Thomson Reuters Corporation v. Realtime Data, LLC D/B/A/IXO*, No. 09 CV 7868 (S.D.N.Y.) Sep. 23, 2009 Order Dismisssing Case in Favor of Texas Action.

*Thomson Reuters Corporation v. Realtime Data, LLC D/B/A IXO*, No. 09 CV 7868 (S.D.N.Y.) Sep. 30, 2009 Response to Order re Transfer.

*Thomson Reuters Corporation v. Realtime Data, LLC D/B/A IXO*, No. 09 CV 7868 (S.D.N.Y.) Oct. 7, 2009 Reply Letter regarding Judge Berman Sep. 23, 2009 Order re Transfer.

*Thomson Reuters Corporation v. Realtime Data, LLC D/B/A IXO*, No. 09 CV 7868 (S.D.N.Y.) Oct. 15, 2009 Order Staying Case Until TX Action Decided.

*Thomson Reuters Corporation v. Realtime Data, LLC D/B/A IXO*, No. 09 CV 7868 (S.D.N.Y.) Sep. 11, 2009 Complaint—DJ SD NY.

*Thomson Reuters Corporation v. Realtime Data, LLC D/B/A IXO*, No. 09 CV 7868 (S.D.N.Y.) Sep. 11, 2009 Rule 7.1 Disclosure Statement for Thomson Reuters.

*Thomson Reuters Corporation v. Realtime Data, LLC D/B/A IXO*, No. 09 CV 7868 (S.D.N.Y.) Order—Stay Pending Transfer Motion Confirmed Oct. 15, 2009.

Official Order Granting Request for Inter Partes Reexamination of U.S. Pat. No. 6,624,761, Control No. 95/000,464, issued Jul. 24, 2009, 29 pgs.

Non-Final Office Action in Inter Partes Reexamination of U.S. Pat. No. 6,624,761, Control No. 95/000,464, issued Dec. 15, 2009, 20 pgs.

Non-Final Office Action in Inter Partes Reexamination of U.S. Pat. No. 7,321,937, Control No. 95/000,466, issued Jun. 22, 2009, 11 pgs.

Official Order Granting Request for Inter Partes Reexamination of U.S. Pat. No. 7,321,937, Control No. 95/000,466, issued Jun. 22, 2009, 16 pgs.

Official Action Closing Prosecution for Inter Partes Reexamination of U.S. Pat. No. 7,321,937, Control No. 95/000,466, issued Dec. 22, 2009, 20 pgs.

Comments by Third Party Requester to Patent Owner's Response Inter Partes Reexamination of U.S. Patent No. 7,321,937, Control No. 95/000,466, filed Nov. 10, 2009, 30 pgs.

Supplemental Declaration of Professor James A. Storer, Ph.D. under 37 C.F.R. §1.132 in Inter Partes Reexamination of U.S. Patent No. 7,321,937, Control No. 95/000,466, executed on Nov. 10, 2009, 16 pgs.
Examiner Interview Summary in Ex Parte Reexamination of U.S. Pat. No. 6,601,104, Control No. 90/009,428, issued Dec. 3, 2009, 3 pgs.
Non-Final Office Action in Ex Parte Reexamination of U.S. Pat. No. 6,601,104, Control No. 90/009,428, issued Nov. 2, 2009, 13 pgs.
Official Order Granting Request for Ex Parte Reexamination of U.S. Pat. No. 6,601,104, Control No. 90/009,428, issued Jun. 1, 2009, 12 pgs.
Declaration of Dr. George T. Ligler under 37 C.F.R. §1.132 in Ex Parte Reexamination of U.S. Pat. No. 6,601,104, Control No. 90/009,428, executed Dec. 28, 2009 16 pgs.
Supplementary Declaration of Dr. George T. Ligler under 37 C.F.R. §1.132 in Ex Parte Reexamination of U.S. Pat. No. 6,601,104, Control No. 90/009,428, executed Dec. 30, 2009 1 pg.
Declaration of Dr. George T. Ligler under 37 C.F.R. §1.132 in Inter Partes Reexamination of U.S. Pat. No. 7,321,937 [including Appendices], Control No. 95/000,466, executed Aug. 24, 2009 30 pgs.
Official Order Granting Request for Inter Partes Reexamination of U.S. Pat. No. 7,161,506, Control No. 95/000,479, issued Aug. 14, 2009, 41 pgs.
Non-Final Office Action in Inter Partes Reexamination of U.S. Pat. No. 7,161,506, Control No. 95/000,479, issued Dec. 15, 2009, 37 pgs.
Official Order Granting Request for Inter Partes Reexamination of U.S. Pat. No. 7,378,992, Control No. 95/000,478, issued Aug. 13, 2009, 60 pgs.
Non-Final Office Action in Inter Partes Reexamination of U.S. Pat. No. 7,378,992, Control No. 95/000,478, issued Dec. 15, 2009, 37 pgs.
Official Order Granting Request for Inter Partes Reexamination of U.S. Pat. No. 6,604,158, Control No. 95/000,486, issued Aug. 14, 2009, 35 pgs.
Non-Final Office Action in Inter Partes Reexamination of U.S. Pat. No. 6,604,158, Control No. 95/000,486, issued Nov. 12, 2009, 199 pgs.
Opinion and Order of United States Magistrate Judge regarding Claim Construction, *Realtime Data, LLC D/B/A Ixo v. Packeteer, Inc., et al.*, District Court for the Eastern District of Texas, No. 6:08cv144, issued Jun. 22, 2009, 75 pgs.
Script for Realtime's Technology Tutorial Presented to the Magistrate Judge in *Realtime Data, LLC d/b/a/IXO v. Packeteer, Inc. et al.*, Civil Action No. 6:08-cv-00144-LED; U.S. District Court for the Eastern District of Texas, Mar. 16, 2009, 69 pgs.
Opinion and Order of United States Magistrate Judge regarding Plaintiff's Motion to Strike Unauthorized New Invalidity Theories from Defendant Citrix's Opening and Reply Briefs in Support of its Motion for Summary Judgment of Invalidity, *Realtime Data, LLC D/B/A Ixo v. Packeteer, Inc., et al.*, District Court for the Eastern District of Texas, No. 6:08cv144, issued Dec. 8, 2009, 10 pgs.
Defendant Citrix Systems, Inc.'s Notice Pursuant to 35 U.S.C. Section 282 Disclosures, *Realtime Data, LLC D/B/A Ixo v. Packeteer, Inc., et al.*, District Court for the Eastern District of Texas, No. 6:08cv144, filed Dec. 11, 2009, 3 pgs.
Blue Coat Defendants' Notice Pursuant to 35 U.S.C. Section 282 Disclosures, *Realtime Data, LLC D/B/A Ixo v. Packeteer, Inc., et al.*, District Court for the Eastern District of Texas, No. 6:08cv144, filed Dec. 11, 2009, 7 pgs.
Expand Networks' 35 U.S.C. Section 282 Disclosures, *Realtime Data, LLC D/B/A Ixo v. Packeteer, Inc., et al.*, District Court for the Eastern District of Texas, No. 6:08cv144, filed Dec. 11, 2009, 4 pgs.
Expand Networks' 35 U.S.C. Section 282 Disclosures (Amended), *Realtime Data, LLC D/B/A Ixo v. Packeteer, Inc., et al.*, District Court for the Eastern District of Texas, No. 6:08cv144, filed Dec. 11, 2009, 5 pgs.
Defendant Citrix Systems, Inc.'s Notice of Obviousness Combinations Pursuant to Court Order, *Realtime Data, LLC D/B/A Ixo v. Packeteer, Inc., et al.*, District Court for the Eastern District of Texas, No. 6:08cv144, filed Dec. 11, 2009, 3 pgs.

Order of United States Magistrate Judge regarding Motion to Limit the Number of Prior Art References to be Asserted at Trial, *Realtime Data, LLC D/B/A Ixo v. Packeteer, Inc., et al.*, District Court for the Eastern District of Texas, No. 6:08cv144, filed Dec. 21, 2009, 6 pgs.
Expand Defendants' Notice of Obviousness Combinations Pursuant to Court Order, *Realtime Data, LLC D/B/A Ixo v. Packeteer, Inc., et al.*, District Court for the Eastern District of Texas, No. 6:08cv144, filed Dec. 22, 2009, 3 pgs.
Blue Coat Systems, Inc. and 7-Eleven, Inc.'s Notice of Obviousness Combinations to be Used at Trial, *Realtime Data, LLC D/B/A Ixo v. Packeteer, Inc., et al.*, District Court for the Eastern District of Texas, No. 6:08cv144, filed Dec. 22, 2009, 38 pgs.
Order regarding Defendant Citrix Systems, Inc's Notice of Other Prior Art References Within the Scope of the References Discussed at the Dec. 17, 2009 Hearing, *Realtime Data, LLC D/B/A Ixo v. Packeteer, Inc., et al.*, District Court for the Eastern District of Texas, No. 6:08cv144, filed Dec. 30, 2009, 3 pgs.
Docket Listing downloaded Mar. 10, 2010 for *Realtime Data, LLC D/B/A Ixo v. Packeteer, Inc., et al.*, District Court for the Eastern District of Texas, No. 6:08cv144, filed Apr. 18, 2008, 165 pgs.
Notice of Allowance in Commonly-Assigned U.S. Appl. No. 11/651,366, issued Apr. 10, 2009, 7 pgs.
CCITT Draft Recommendation T.4, RFC 804, Jan. 1981, 12 pgs.
SNA Formats, IBM Corporation, 14th Ed., Nov. 1993, 3 pgs.
Munteanu et al, "Wavelet-Based Lossless Compression Scheme with Progressive Transmission Capability," John Wiley & Sons, Inc., Int'l J. Imaging Sys. Tech., vol. 10, (1999) pp. 76-85.
Forchhammer and Jensen, "Data Compression of Scanned Halftone Images," IEEE Trans. Commun., vol. 42, Feb.-Apr. 1994, pp. 1881-1893.
Christopher Eoyang et al., "The Birth of the Second Generation: The Hitachi S-820/80," Proceedings of the 1998 ACM/IEEE Conference on Supercomputing, pp. 296-303 (1998).
Transcript for Hearing on Motions for Summary Judgment, *Realtime Data, LLC d/b/a IXO v. Packeteer, Inc., et al.*, Civil Action No. 6:08-cv-00144-LED; U.S. District Court for the Eastern District of Texas, filed on Apr. 18, 2008 and terminated Feb. 2, 2010, 133 pgs.
Transcript for Motions Hearing (Including Supplemental Claim Contruction Hearing), *Realtime Data, LLC d/b/a IXO v. Packeteer, Inc., et al*, Civil Action No. 6:08-cv-00144-LED; U.S. District Court for the Eastern District of Texas, filed on Apr. 18, 2008, and terminated Feb. 2, 2010, 88 pgs.
Nelson, "The Data Compression Book," M&T Books (2nd Ed. 1996).
"The Authoritative Dictionary of IEEE Standards Terms," 7th Ed. 2000, p. 273.
Larousse Dictionary of Science and Technology, 1st Ed., 1995, p. 916.
Plaintiff Realtime Data's Motion to Strike Unauthorized New Invalidity Theories from Defendant Citrix's Opening and Reply Briefs in Support Its Motion for Summary Judgment of Invalidity of U.S. Patent No. 7,352,300 (Sep. 22, 2009).
Realtime Data's Reply in Support of Its Motion to Strike Unauthorized New Invalidity Theories from Defendant Citrix's Opening and Reply Briefs in Support of Its Motion for Summary Judgment of Invalidity of U.S. Patent No. 7,352,300 (Oct. 19, 2009).
Defendant Citrix Systems, Inc.'s Sur-Reply in Opposition to Realtime Data LLC's Motion to Strike Unauthorized New Invalidity Theories from Citrix's Opening and Reply Briefs in Support of Its Motion for Summary Judgment of Invalidity of U.S. Patent No. 7,352,300, (Oct. 30, 2009).
Blue Coat Defendants' Response to Realtime Data, LLC's Notice Re Proposed Constriction of "Data Storage Rate" (Nov. 11, 2009).
Order for Supplemental Briefing on Blue Coat 7-11 Motion for Partial SJ on Non-infringement of Pat 6,601,104 (Nov. 13, 2009).
Memorandum Opinion and Order (Nov. 23, 2009).
Memorandum Opinion and Order (Dec. 8, 2009).
Expand's Conclusions of Fact and Law Regarding Defense of Inequitable Conduct Concerning the Unenforceability of U.S. Patent No. 7,321,937 (Nov. 12, 2009).
Realtime Data's Sur-reply Supplemental Claim Construction Brief Concerning Whether the Asserted Claims of the '104 Patent are Product Claims (Dec. 23, 2009).

Order regarding Defendant Citrix Systems, Inc's Notice of Other Prior Art References Within the Scope of the References Discussed at the Dec. 17, 2009 Hearing (Dec. 30, 2009).
Network Working group RFC 2068 (Jan. 1997).
Network Working group RFC 2616 (Jun. 1999).
Network Working group RFC 1945 (May 1996).
Network Working group RFC 1950 (May 1996).
Network Working group RFC 1951 (May 1996).
Network Working group RFC 1952 (May 1996).
Notice of Plaintiff Realtime Data LLC's Proposed Supplemental Construction of "Data Storage Rate" In Response to the Court's Comments During the Nov. 10, 2009 Supplemental Claim Construction Hearing (Nov. 10, 2009).
Citrix's Amended Invalidity Contentions, Including Appendices G2-G8 (Dec. 15, 2009).
Realtime Proposed Claim Constructions, Exhibits A-D, v. Packeteer, Inc., Blue Coat Systems, Inc., Citrix Systems, Inc., Expand Networks, Inc., F5 Networks, Inc., 7Eleven Inc., ABM Industries, Inc., ABM Janiotorial Services-South Central, Inc., Averitt Express, Inc., Build-A-Bear Workshop, inc., DHL Express (USA), Inc., Interstate batter System of America, Inc, and O'Reilly Automotive, Inc., Civil Action No. 6:08-cv-00144-Led; In the U.S. District Court for tthe Eastern District of Texas Tyler Division; filed Feb. 18, 2009.
Declaration of Dr. James W. Modestino relating to U.S. Patent No. 7,161,506, Oct. 29, 2001.
Second Declaration of Dr. George T. Ligler under 37 C.F.R. §1.132 relating to U.S. Patent No. 6,601,104, executed May 5, 2010.
Realtime Data, LLC Complaint for Patent Infringement, *Realtime Data, LLC D/B/A IXO v. CME Group Inc., et al*(II), District Court for the Eastern District of Texas, No. 6:10-cv-246, filed May 11, 2010, 24 pages.
Realtime Data, LLC Complaint for Patent Infringement, *Realtime Data, LLC D/B/A/ IXO v. Thomas Reuters Corporation, et al.* (II), District Court for the Eastern District of Texas, No. 6:10-cv-247, filed May 11, 2010, 15 pages.
Realtime Data, LLC Complaint for Patent Infringement, *Realtime Data, LLC D/B/A/ IXO v. Morgan Stanley, et al.* (II), District Court for the Eastern District of Texas, No. 6:10-cv-248, filed May 11, 2010, 27 pages.
Declaration of Padmaja Chinta in Support of Realtime Data's Reply Claim Construction Brief (including Exhibits A-S), *Realtime Data, LLC D/B/A/ IXO v. Packeteer, Inc., et al.*, District Court for the Eastern District of Texas, No. 6:08-cv-00144-LED, dated Mar. 30, 2009.
Extended European search report issuing from European Patent Application 09150508.1, Aug. 3, 2010.
Complaint, *Thomson Reuters Corporation v. Realtime Data, LLC D/B/A IXO*, Southern District of New York, No. 2:09-cv-7868-RMB, filed Sep. 11, 2009, 6 pages.
Realtime Data, LLC Complaint for Patent Infringement, *Realtime Data, LLC D/B/A IXO v. MetroPCS Texas, LLC et al.*, District Court for the Eastern District of Texas, No. 6:10-cv-00493, filed Sep. 23, 2010, 14 pages.
Complaint and Demand for Jury Trial, *Chicago Board Options Exchange, Incorporated v. Realtime Data, LLC D/B/A IXO*, United States District Court for the Northern District of Illinois, No. 09 CV 4486, filed Jul. 24, 2009, 6 pages.
Magstar MP Hardware Reference B Series Models Document GA32-0365-01, 1996-1997, [IBM_1_601 pp. 1-338], 338 pages.
Jack Venbrux, *A VLSI Chip Set for High-Speed Lossless Data Compression*, IEEE Trans. On Circuits and Systems for Video Technology, vol. 2, No. 4, Dec. 1992, pp. 381-391.
Pen-Shu Yeh, *The CCSDS Lossless Data Compression Recommendation for Space Applications*, Chapter 16, Lossless Compression Handbook, Elsevier Science (USA), 2003, pp. 311-326.
Robert F. Rice, *Some Practical Universal Noiseless Coding Techniques*, Jet Propulsion Laboratory, Pasadena, California, JPL Publication 79-22, Mar. 15, 1979.
K. Murashita et al., High-Speed Statistical Compression using Self-organized Rules and Predetermined Code Tables, IEEE, 1996 Data Compression conference.
IBM, Fast Dos Soft Boot, Feb. 1, 1994, vol. 37, Issue 2B, pp. 185-186.

J. Anderson et al. Codec squeezes color teleconferencing through digital telephone lines, Electronics 1984, pp. 13-15.
Robert Rice, "Lossless Coding Standards for Space Data Systems", IEEE 1058-6393/97, pp. 577-585, 1997.
Coene, W et al. "A Fast Route for Application of Rate-distortion Optimal Quantization in an MPEG Video Encoder" Proceedings of the International Conference on Image Processing, US., New York, IEEE, Sep. 16, 1996, pp. 825-828.
"Telekurs to Launch New Int'l Feed/Internet Server", Wall Street & Technology, vol. 15, No. 1, Jan. 1997, p. 14.
Notice of Allowance for U.S. Appl. No. 11/553,427, mailed May 31, 2011, 5 pgs.
Final Office Action for U.S. Appl. No. 12/690,125, mailed Jun. 7, 2011, 11 pgs.
Final Office Action for U.S. Appl. No. 12/688,413, mailed Jun. 7, 2011, 15 pgs.
Non-Final Office Action in Inter Partes Reexamination of U.S. Patent No. 7,400,274, Control No. 95/001,544, mailed May 20, 2011, 47 pages.
Order Granting Request for Inter Partes Reexamination of U.S. Patent No. 7,777,651, Control No. 95/001,581, mailed Jun. 15, 2011, 22 pages.
Non-Final Office Action in Inter Partes Reexamination of U.S. Patent No. 7,417,568, Control No. 95/001,553, mailed May 6, 2011, 105 pages.
Order Granting Reexamination of U.S. Patent No. 7,714,747, Control No. 95/001,517, mailed Mar. 9, 2011, 21 pages.
Defendants' Invalidity Contentions, *Realtime Data, LLC d/b/a IXO, vs. MetroPCS Texas, LLC, et al.*, Case No. 6:10-CV-00493-LED, In the United States District Court Eastern District of Texas Tyler Division, Jun. 17, 2011, 138 pages.
Appendix A, Claim Charts A-1 to A-25, from Invalidity Contentions, *Realtime Data LLC v. MetroPCS Texas, LLC, et al.*, Case No. 6:10-CV-00493-LED, Jun. 17, 2001, 173 pages.
Appendix B, Claim Charts B-1 to B-23, from *Realtime Data LLC v. MetroPCS Texas, LLC et al.*, Case No. 6:10-CV-00493-LED, Jun. 17, 2011, 809 pages.
Appendix C, Claim Charts C-1 to C-22, from *Realtime Data LLC v. MetroPCS Texas, LLC et al.*, Case No. 6:10-CV-00493-LED, Jun. 17, 2011, 530 pages.
Appendix D, Claim Charts D-1 to D-16, from *Realtime Data LLC v. MetroPCS Texas, LLC et al.*, Case No. 6:10-CV-00493-LED, Jun. 17, 2011, 253 pages.
Appendix E, Claim Charts E-1 to E-20, from *Realtime Data LLC v. MetroPCS Texas, LLC et al.*, Case No. 6:10-CV-00493-LED, Jun. 17, 2011, 397 pages.
Appendix F, Claim Charts F-1 to F-19, from *Realtime Data LLC v. MetroPCS Texas, LLC et al.*, Case No. 6:10-CV-00493-LED, Jun. 17, 2011, 462 pages.
Appendix G, Claim Charts G-1 to G-18, from *Realtime Data LLC v. MetroPCS Texas, LLC et al.*, Case No. 6:10-CV-00493-LED, Jun. 17, 2011, 548 pages.
Appendix H, Claim Charts H-1 to H-22, from *Realtime Data LLC v. MetroPCS Texas, LLC et al.*, Case No. 6:10-CV-00493-LED, Jun. 17, 2011, 151 pages.
Amir et al., "An Application Level Video Gateway," 1995, 11 pages.
Katz, Randy H. and Eric A. Brewer, "The Bay Area Research Wireless Access Network: Towards a Wireless Overlay Internetworking Architecture," Computer Science Division, EECS Department, U.C. Berkeley, 1995, 56 pages.
Katz, R.H. and E.A. Brewer, "The Bay Area Research Wireless Access Network (Barwan)," UC Berkeley, 1995, 68 pages.
Bruckman, Alfred and Andreas Uhl, "Selective Medical Image Compression Using Wavelet Techniques," Jun. 1998, 23 pages.
Crowley et al., "Dynamic Compression During System Save Operations," May 1, 1984, 3 pages.
Hershkovits, "Universal Data Compression with Finite-Memory," Feb. 1995, 99 pages.
Katz et al., "The Bay Area Research Wireless Access Networks (Barwan)," 1996, 6 pages.
Klein, "Compression and Coding in Information Retrieval Systems," Jun. 1987, pp. vii-viii, 1-4, 10-15, 22-30, 43-48, 62-66, 86-89, 108-111.

Reghbati, "An Overview of Data Compression Techniques," Apr. 1981, pp. 71-75.
Notice of Allowance for U.S. Appl. No. 12/123,081, mailed Sep. 26, 2011, 9 pages.
Notice of Allowance for U.S. Appl. No. 11/551,204, mailed Sep. 28, 2011, 5 pages.
Notice of Allowance for U.S. Appl. No. 11/551,211, mailed Oct. 18, 2011, 5 pages.
Non-Final Office Action for U.S. Appl. No. 13/154,239, mailed Nov. 2, 2011, 6 pages.
Notice of Allowance for U.S. Appl. No. 12/703,042, mailed Nov. 15, 2011, 8 pages.
Non-Final Office Action for U.S. Appl. No. 12/688,413, mailed Nov. 28, 2011, 14 pages.
Notice of Allowance for U.S. Appl. No. 12/857,238, mailed Dec. 30, 2011, 5 pages.
Non-Final Action Closing Prosecution in Inter Partes Reexamination of U.S. Patent No. 7,714,747, Control No. 95/001,517, mailed Sep. 21, 2011, 29 pages.
Definition of "data packet", Academic Press Dictionary of Science and Technology, Copyright 1992, 1996, cited by Examiner in Inter Partes Reexamination of U.S. Patent No. 7,714,747, Control No. 95/001,517, mailed Sep. 21, 2011, 2 pages.
Patent Owner's Reply to Office Action in Inter Partes Reexamination of U.S. Patent No. 7,777,651, Control No. 95/001,581, mailed Sep. 26, 2011, 44 pages.
Examiner's Answer to Appeal Brief in Inter Partes Reexamination of U.S. Patent No. 6,624,761, Control No. 95/000,464, mailed Sep. 28, 2011, 20 pages.
Examiner's Answer to Appeal Brief in Inter Partes Reexamination of U.S. Patent No. 7,161,506, Control No. 95/000,479, mailed Sep. 28, 2011, 25 pages.
Examiner's Answer to Appeal Brief in Inter Partes Reexamination of U.S. Patent No. 7,378,992, Control No. 95/000,478, mailed Sep. 29, 2011, 27 pages.
Decision on Appeal in Ex parte Reexamination of U.S. Patent No. 6,601,104 B1, Control No. 90/009,428, dated Mar. 18, 2011, 14 pages.
Patent Owner's Rebuttal Brief Under 37 C.F.R § 41.71 Retracting the Arguments Made to Overcome the Claim Rejections and Thereby Eliminating the Issues on Appeal in Inter Partes Reexamination of U.S. Patent No, 6,624,761, Control No. 95/000,464, dated Oct. 28, 2011, 9 pages.
Patent Owner's Rebuttal Brief Under 37 C.F.R § 41.71 Retracting the Arguments Made to Overcome the Claim Rejections and Thereby Eliminating the Issues on Appeal in Inter Partes Reexamination of U.S. Patent No. 7,378,992, Control No. 95/000,478, dated Oct. 28, 2011, 10 pages.
Patent Owner's Rebuttal Brief Under 37 C.F.R § 41.71 Retracting the Arguments Made to Overcome the Claim Rejections and Thereby Eliminating the Issues on Appeal in Inter Partes Reexamination of U.S. Patent No. 7,161,506, Control No. 95/000,479, dated Oct. 28, 2011, 9 pages.
Non-Final Action Closing Prosecution in Inter Partes Reexamination of U.S. Patent No. 7,400,274, Control No. 95/001,544, mailed Nov. 18, 2011, 39 pages.
Non-Final Action Closing Prosecution in Inter Partes Reexamination of U.S. Patent No. 7,417,568, Control No. 95/001,533, mailed Dec. 9, 2011; 42 pages.
Patent Owner's Reply to Action Closing Prosecution of Nov. 18, 2011 in Inter Partes Partes Reexamination of U.S. Patent No. 7,400,274, Control No. 95/001,544, mailed Dec. 19, 2011, 9 pages.
Patent Owner's Reply to Action Closing Prosecution of Dec. 9, 2011 in Inter Partes Reexamination of U.S. Patent No. 7,417,568, Control No. 95/001,533, mailed Dec. 29, 2011, 14 pages.
Notice of Intent to Issue Ex Parte Reexamination Certificate in Ex Parte Reexamination of U.S. Patent No. 6,601,104, Control No. 90/009,428, mailed Jan. 13, 2010, 5 pages.
Decision on Appeal in Inter Partes Reexamination of U.S. Patent No. 6,624,761, Control No. 95/000,464, mailed Jan. 18, 2012, 5 pages.
Decision on Appeal in Inter Partes Reexamination of U.S. Patent No. 7,321,937, Control No. 95/000,466, mailed Jan. 18, 2010, 8 pages.

Decision on Appeal in Inter Partes Reexamination of U.S. Patent No. 7,378,992, Control No. 95/000,478, mailed Jan. 18, 2012, 5 pages.
Decision on Appeal in Inter Partes Reexamination of U.S. Patent No. 7,161,506, Control No. 95/000,479, mailed Jan. 18, 2012, 6 pages.
Court Docket History for 6:10-cv-00493-LED-JDL, *Realtime Data, LLC D/B/A/ IXO,* v. *MetroPCS Texas, LLC et al.*, dated Jan. 27, 2010, 24 pages.
Court Docket History for 6:09-cv-00326-LED-JDL, *Realtime Data, LLC D/B/A/ IXO,* v. *Morgan Stanley et al.*, dated Jan. 27, 2010, 45 pages.
Court Docket History for 6:09-cv-00327-LED-JDL, *Realtime Data, LLC D/B/A/IXO,* v. *CME Group Inc. et al.*, dated Jan. 27, 2012, 56 pages.
Court Docket History for 6:09-cv-00333-LED-JDL, *Realtime Data, LLC d/b/a IXO* v. *Thomson Reuters et al.*, dated Jan. 27, 2012, 30 pages.
Court Docket History for 1:11-cv-06696-RJH, *Realtime Data, LLC D/B/A/ IXO,* v. *Morgan Stanley et al.*, dated Jan. 27, 2012, 50 pages.
Court Docket History for 1:11-cv-06697-UA, *Realtime Data, LLC D/B/A/IXO,* v. *CME Group Inc. et al.*, dated Jan. 27, 2012, 56 pages.
Court Docket History for 1:11-cv-06698-UA, *Realtime Data, LLC d/b/a IXO* v. *Thomson Reuters et al.*, dated Jan. 27, 2012, 34 pages.
Defendants' Joint Preliminary Invalidity Contentions filed in *Realtime Data, LLC D/B/A/ IXO* v. *Packeteer, Inc., et al.*, Civil Action No. 6:08-cv-144-LED, United States District Court for the Eastern District of Texas Tyler Division, Dec. 8, 2008, 19 pages.
Appendix A, Claim Charts A-1 A-46, from *Realtime Data, LLC* v. *Packeteer, Inc., et al.*, Civil Action No. 6:08-cv-144-LED, Dec. 8, 2008, 345 pages.
Appendix B, Claim Charts B-1 to B-17, from *Realtime Data, LLC* v. *Packeteer, Inc., et al.*, Civil Action No. 6:08-cv-144-LED, Dec. 8, 2008, 1893 pages.
Appendix C, Claim Charts C-1 to C-34, from *Realtime Data, LLC* v. *Packeteer, Inc., et al.*, Civil Action No. 6:08-cv-144-LED, Dec. 8, 2008, 993 pages.
Appendix D, Claim Charts D-1 to D-14, from *Realtime Data, LLC* v. *Packeteer, Inc., et al.*, Civil Action No. 6:08-cv-144-LED, Dec. 8, 2008, 197 pages.
Appendix E, Claim Charts E-1 to E-11, from *Realtime Data, LLC* v. *Packeteer, Inc., et al.*, Civil Action No. 6:08-cv-144-LED, Dec. 8, 2008, 735 pages.
Appendix F, Claim Charts F-1 to F-17, from *Realtime Data, LLC* v. *Packeteer, Inc., et al.*, Civil Action No. 6:08-cv-144-LED, Dec. 8, 2008, 775 pages.
Appendix G Claim Charts G-1 to G-8 from *Realtime Data, LLC* v. *Packeteer, Inc., et al.*, Civil Action No. 6:08-cv-144-LED, Dec. 8, 2008, 567 pages.
Appendix H, Claim Charts H-1 to H-18, from *Realtime Data, LLC* v. *Packeteer, Inc., et al.*, Civil Action No. 6:08-cv-144-LED, Dec. 8, 2008, 94 pages.
Appendix I, Claim Charts I-1 to I-18, from *Realtime Data, LLC* v. *Packeteer, Inc., et al.*, Civil Action No. 6:08-cv-144-LED, Dec. 8, 2008, 145 pages.
Appendix J, Prior Art Chart, from *Realtime Data, LLC* v. *Packeteer, Inc., et al.*, Civil Action No. 6:08-cv-144-LED, Dec. 8, 2008, 25 pages.
Realtime data, LLC's [Corrected] P.R. 3-1 Disclosures and Preliminary Infringement Contentions filed in *Realtime Data, LLC D/B/A/ IXO* v. *Packeteer, Inc., et al.*, Civil Action No. 6:08-cv-00144-LED, United States District for the Eastern District of Texas Tyler Division, Oct. 8, 2008, 591 pages.
Amended Answer and Counterclaims of Defendants Blue Coat Systems, Inc., Packeteer, Inc., 7-Eleven, Inc., ABM Industries, Inc., ABM Janitorial Services-South Central, Inc., and Build-A-Bear Workshop, Inc. to Plaintiff's First Amended Complaint for Patent Infringement filed in *Realtime Data, LLC d/b/a/IXO* v. *Packeteer, Inc., et al.*, Civil Action No. 6:08cv144-LED, United States District Court for the Eastern District of Texas Tyler Division, Oct. 28, 2008, 81 pages.
Notice of Allowance for U.S. Appl. No. 11/551,204, mailed Jul. 11, 2011, 5 pages.
Notice of Allowance for U.S. Appl. No. 12/684,624, mailed Jul. 25, 2011, 5 pages.

Non-Final Office Action for U.S. Appl. No. 12/703,042, mailed Jul. 28, 2011, 5 pages.
Non-Final Office Action for U.S. Appl. No. 12/857,238, mailed Aug. 10, 2011, 6 pages.
Non-Final Office Action for U.S. Appl. No. 13/101,994, mailed Aug. 16, 2011, 10 pages.
Notice of Allowance for U.S. Appl. No. 11/551,211, mailed Aug. 24, 2011, 5 pages.
Notice of Allowance for U.S. Appl. No. 12/684,624, mailed Sep. 1, 2011, 9 pages.
Examiner's Answer to Appeal Brief in Inter Partes Reexamination of U.S. Patent No. 7,321,937, Control No. 95/000,466, mailed Jul. 18, 2011, 33 pages.
Non-Final Office Action in Inter Partes Reexamination of U.S. Patent No. 7,777,651, Control No. 95/001,581, mailed Jul. 25, 2011, 274 pages.
"Packeteer iShaper, PacketShaper and iShared Appliances Drive Intelligent Application Acceleration Across Coogee Resources Wide Area Network", Business Wire, accesses on Aug. 25, 2008, 2 pages.
Whiting, Doug, "*Deflate* vs. *LZS*", Nov. 2000, 2 pages.
"The Packeteer Q4 2005 Financial Conference Call", Jan. 26, 2006, 9 pages.
"Data Compression Ratio", Wikipedia, the free encyclopedia, accessed on Aug. 10, 2011 from http://en.wikipedia.org/wiki/Data_compression_ratio, 2 pages.
Court Docket History for 6:10-cv-00493-LED-JDL *Realtime Data, LLC D/B/A/ IXO,* v. *MetroPCS Texas, LLC et al.*, dated Sep. 2, 2011, 16, pages.
Court Docket History for 6:09-cv-00326-LED-JDL *Realtime Data, LLC D/B/A/ IXO,* v. *Morgan Stanley et al.*, dated Sep. 2, 2011, 45 pages.
Court Docket History for 6:09-cv-00327-LED-JDL *Realtime Data, LLC D/B/A/IXO,* v. *CME Group Inc. et al.*, dated Sep. 2, 2011, 56 pages.
Court Docket History for 6:09-cv-00333-LED-JDL *Realtime Data, LLC d/b/a IXO* v. *Thomson Reuters et al.*, dated Sep. 2, 2011, 30 pages.
Request for Inter Partes Reexamination of U.S. Patent No. 7,321,937, Control No. 95/001,922, filed Mar. 2, 2012, including accompanying Exhibits PA-A to PA-D, PAT-A to PAT-C, CC-A to CC-D, Oth-A, and Form PTO/SB/08a, 2865 pages.
Request for Inter Partes Reexamination of U.S. Patent No. 6,604,158, Control No. 95/001,923, filed Mar. 2, 2012, including accompanying Exhibits PA-A to PA-D, PAT-A to PAT-B, CC-A to CC-F, Oth-A, and Form PTO/SB/08a, 560 pages.
Request for Inter Partes Reexamination of U.S. Patent No. 7,352,300, Control No. 95/001,924, filed Mar. 2, 2012, including accompanying Exhibits PA-A to PA-A, PAT-A to Pat-B, CC-A to CC-F, Oth-A, and Form PTO/SB/08a, 1012 pages.
Request for Inter Partes Reexamination of U.S. Patent No. 7,395,345, Control No. 95/001,925, filed Mar. 2, 2012, including accompanying Exhibits PA-A to PA-C, PAT-A, CC-A to CC-C, Oth-A, and Form PTO/SB/08a, 204 pages.
Request for Inter Partes Reexamination of U.S. Patent No. 7,161,506, Control No. 95/001,926, filed Mar. 2, 2012, with accompanying Exhibits PA-A to PA-C, PAT-A to PAT-C, CC-A to CC-B, Oth-A to Oth-B, and Form PTO/SB/08a, 2651 pages.
Request for Inter Partes Reexamination of U.S. Patent No. 7,415,530, Control No. 95/001,927, filed Mar. 2, 2012, including accompanying Exhibits PA-A to PA-F, PAT-A to PAT-B, CC-A to CC-O, Oth-A, and Form PTO/SB/08a, 700 pages.
Request for Inter Partes Reexamination of U.S. Patent No. 7,378,992, Control No. 95/001,928, filed Mar. 2, 2012, including Exhibits PA-A to PA-D, PAT-A to PAT-C, CC-A to CC-B, Oth-A, and Form PTO/SB/08a, 2316 pages.
Petition Under 37 C.F.R. §§ 1.181 and 1.182 for Correction of Notice of Intent to Issue Reexamination Certificate in Inter Partes Reexaminatoin of U.S. Patent No. 7,378,992, Control No. 95/000,478, filed May 9, 2012, 8 pages.
Court Docket History for 6:10-cv-00493-LED-JDL, *Realtime Data, LLC D/B/A/IXO,* v. *MetroPCS Texas, LLC et al.*, dated May 29, 2012, 36 pages.

Court Docket History for 1:11-cv-06696-RJH, *Realtime Data, LLC D/B/A/IXO,* v. *Morgan Stanley et al.*, May 29, 2012, 64 pages.
Court Docket History for 1:11-cv-06697-UA, *Realtime Data, LLC D/B/A/IXO,* v.*CME Group Inc. et al.*, dated May 29, 2012, 72 pages.
Court Docket History for 1:11-cv-06698-UA, *Realtime Data, LLC d/b/a IXO* v. *Thomson Reuters et al.*, dated May 29, 2012, 44 pages.
"Hard Disk Data Control Method", IBM Technical Disclosure Bulletin NN9302301, vol. 36, No. 2, Feb. 1993, pp. 301-302.
Non-Final Rejection for U.S. Appl. No. 12/690,125, mailed Mar. 8, 2012, 7 pages.
Notice of Allowance for U.S. Appl. No. 12/703,042, mailed Mar. 30, 2012, 8 pages.
Non-Final Rejection for U.S. Appl. No. 09/969,987, mailed Apr. 11, 2012, 6 pages.
Notice of Allowance for U.S. Appl. No. 11/553,419, mailed Apr. 23, 2012, 6 pages.
Non-Final Office Action in Inter Partes Reexamination of U.S. Patent No. 7,777,651, Control No. 95/001,581, mailed Jan. 27, 2012, 152 pages.
Patent owner's Respondent Brief on Appeal Under 37 C.F.R. § 41.68 in Inter Partes Reexamination of U.S. Patent No. 7,714,747, Control 95/001,517, filed Feb. 17, 2012, 20 pages.
Patent Owner's Reply to Second Non-Final Office Action of Jan. 27, 2012 in Inter Partes Reexamination of U.S. Patent No. 7,777,651, Control No. 95/001,581, filed Feb. 24, 2012, 30 pages.
Ex Parte Reexamination Certificate in Ex Parte Reexamination of U.S. Patent No. 6,601,104, Control No. 90/009,428, issued Feb. 28, 2012, 2 pages.
Examiner's Answer to Appeal Brief in Inter Partes Reexamination of U.S. Patent No. 7,714,747, Control No. 95/001,517, mailed Mar. 1, 2012, 4 pages.
Right of Appeal Notice in Inter Partes Reexamination of U.S. Patent No. 7,417,568, Control No. 95/001,533, mailed Mar. 1, 2012, 8 pages.
Rigt of Appeal Notice in Inter Partes Reexamination of U.S. Patent No. 7,400,274, Control No. 95/001,544, mailed Mar. 6, 2012, 7 pages.
Request for Inter Partes Reexamination of U.S. Patent No. 7,321,937, Control No. 95/001,922, filed Mar. 2, 2012, 88 pages.
Request for Inter Partes Reexamination of U.S. Patent No. 6,604,158, Control No. 95/001,923, filed Mar. 2, 2012, 111 pages.
Request for Inter Partes Reexamination of U.S. Patent No. 7,352,300, Control No. 95/001,924, filed Mar. 2, 2012, 60 pages.
Request for Inter Partes Reexamination of U.S. Patent No. 7,395,345, Control No. 95/001,925, filed Mar. 2, 2012, 59 pages.
Request for Inter Partes Reexamination of U.S. Patent No. 7,161,506, Control No. 95/001,926, filed Mar. 2, 2012, 30 pages.
Request for Inter Partes Reexamination of U.S. Patent No. 7,415,530, Control No. 95/001,927, filed Mar. 2, 2012, 229 pages.
Request for Inter Partes Reexamination of U.S. Patent No. 7,378,992, Control No. 95/001,928, filed Mar. 2, 2012, 21 pages.
Official Order Granting Request for Inter Partes Reexamination of U.S. Patent No. 7,395,345, Control No. 95/001,925, mailed Mar. 19, 2012, 11 pages.
Non-Final Office Action in Inter Partes Reexamination of U.S. Patent No. 7,395,345, Control No. 95/001,925, mailed Mar. 19, 2012, 20 pages.
Notice of Intent to Issue Inter Partes Reexamination Certificate in Inter Partes Reexamination of U.S. Patent No. 7,321,937, Control No. 95/000,466, mailed Mar. 21, 2012, 7 pages.
Right of Appeal for Inter Partes Reexamination of U.S. Patent No. 6,604,158, Control No. 95/000,486, mailed Mar. 26, 2012, 253 pages.
Notice of Intent to Issue Inter Partes Reexamination Certificate in Inter Partes Reexamination of of U.S. Patent No. 6,624,761, Control No. 95/000,464, mailed Apr. 3, 2012, 7 pages.
Notice of Intent to Issue Inter Partes Reexamination Certificate in Inter Partes Reexamination U.S. Patent No. 7,161,506, Control No. 95/000,479, mailed Apr. 4, 2012, 15 pages.
Notice of Intent to Issue Inter Partes Reexamination Certificate in Inter Partes Reexamination of U.S. Patent No. 7,378,992, Control No. 95/000,478, mailed Apr. 6, 2012, 5 pages.

Official Order Granting Request for Inter Partes Reexamination of U.S. Patent No. 7,321,937, Control No. 95/001,922, mailed Apr. 20, 2012, 17 pages.
Non-Final Office Acton in Inter Partes Reexamination of U.S. Patent No. 7,321,937, Control No. 95/001,922, mailed Apr. 20, 2012, 8 pages.
Official Order Granting Request for Inter Partes Reexamination of U.S. Patent No. 7,161,506, Control No. 05/001,926, mailed Apr. 25, 2012, 9 pages.
Non-Final Office Action in Inter Partes Reexamination of U.S. Patent No. 7,161,506, Control No. 95/001,926, mailed Apr. 25, 2012, 7 pages.
Official Order Granting Request for Inter Partes Reexamination of U.S. Patent No. 7,378,992, Control No. 95/001,928, mailed Apr. 25, 2012, 8 pages.
Non-Final Office Action in Inter Partes Reexamination of U.S. Patent No. 7.378,992, Control No. 95/001,928, mailed Apr. 25, 2012, 8 pages.
Official Order Denying Request for Inter Partes Reexamination of U.S. Patent No. 7,415,530, Control No. 95/001,927, mailed Apr. 27, 2012, 52 pages.
Court Docket History for 6:10-cv-00493-LED-JDL, *Realtime Data, LLC D/B/A/IXO,* v. *MetroPCS Texas, LLC et al.,* Dated May 3, 2012, 34 pages.
Court Docket History for 1:11-cv-06696-RJH, *Realtime data, LLC D/B/A/IXO,* v. *Morgan Stanley et al.,* May 3, 2012, 60 pages.
Court Docket History for 1:11-cv-06697-UA, *Realtime Data, LLC D/B/A/IXO,* v. *CME Group Inc. et al.,* dated May 3, 2012, 68 pages.
Court Docket History for 1:11-cv-06698-UA, *Realtime Data, LLC d/b/a IXO* v. *Thomson Reuters et al.,* dated May 3, 2012, 40 pages.
Defendants' Supplemental Invalidity Contentions, filed in *Realtime Data, LLC d/b/a IXO* v. *Morgan Stanley, et al.,* Civil Action No. 1:11-cv-6696, *Realtime Data, LLC d/b/a IXO* v. *CME Group Inc., et al.,* Civil Action No. 1:22-cv-6697, and *Realtime Data, LLC d/b/a IXO* v. *Thomas Reuters, et al.,* Civil Action No. 1:11-cv-6698, United States District Court Southern District of New York, filed May 17, 2012, 54 pages.
Expert Report of Michael Brogioli Regarding Asserted Claims of U.S. Patent Nos. 7,417,568 and 7,777,651, with Exhibit A: List ofs Materials Reviewed, filed in *Realtime Data, LLC d/b/a IXO* v. *Morgan Stanley, et al.,* Civil Action No. 1:11-cv-6696, *Realtime Data, LLC d/b/a IXO* v. *CME Group Inc.,* Civil Action No. 1:11-cv-6697, and *Realtime Data, LLC d/b/a IXO* v. *Thomas Reuters, et al.,* Civil Action No. 1:11-cv-6698, United States District Court Southern District of New York, filed Jun. 15, 2012, 26 pages.
Exhibit 1, Curriculum Vitae of Michael C. Brogioli, from Expert Report, filed in *Realtime Data, LLC d/b/a IXO* v. *Morgan Stanley, et al.,* Civil Action No. 1:11-cv-6696, *Realtime Data, LLC d/b/a IXO* v. *CME Group Inc., et al.,* Civil Action No. 1:11-cv-6697, and *Realtime Data, LLC d/b/a IXO* v. *Thomas Reuters, et al.,* Civil Action No. 1;11-cv-6698, United States District Court Southern District of New York, filed Jun. 15, 2012, 9 pages.
Exhibit 2, [Proposed] Order Adopting the Parties' Agreed Claim Constructions, from Expert Report, filed in *Realtime Data, LLC d/b/a IXO* v. *Morgan Stanley, et al.,* Civil Action No. 1:11-cv-6696, *Realtime Data, LLC d/b/a IXO* v. *CME Group Inc., et al.,* Civil Action No. 1:11-cv-6697, and *Realtime Data, LLC d/b/a IXO* v. *Thomson Reuters, et al.,* Civil Action No. 1:11-cv-6698, United States District Court Southern District of New York, filed Jun. 15, 2012, 6 pages.
Exhibit 3, The Parties' Disputed Claim Constructions, revised May 3, 2012, from Expert report, filed in *Realtime Data, LLC d/b/a IXO* v. *Morgan Stanley, et al.,* Civil Action No. 1:11-cv-6696, *Realtime Data, LLC d/b/a IXO* v. *CME Group Inc., et al.,* Civil Action No. 1:11-cv-6697, and *Realtime Data, LLC d/b/a IXO* v. *Thomson Reuters, et al.,* Civil Action No. 1:11-cv-6698, United States District Court Southern District of New York, filed Jun. 15, 2012, 6 pages.
Exhibit 4, E-Mail Correspondence between James Shalek and Brett Cooper, dated May 17 and 18, 2012, from Expert Report, filed in *Realtime Data, LLC d/b/a IXO* v. *Morgan Stanley, et al.,* Civil Action No. 1:11-cv-6696, *Realtime Data, LLC d/b/a IXO* v. *CME Group Inc., et al.* Civil Action No. 1:11-cv-6697, and *Realtime Data, LLC*

*d/b/a IXO* v. *Thomson Reuters, et al.,* Civil Action No. 1:11-cv-6698, United States District Court Southern District of New York, filed Jun. 15, 2012, 3 pages.
Exhibit 5, Source Code Chart for U.S. Pat. No. 7,417,568 comparing representative elements of the NQDSLIB source code (Apr. 29, 2002 or earlier), from Expert Report, filed in *Realtime Data, LLC d/b/a IXO* v. *Morgan Stanley, et al.,* Civil Action No. 1:22-cv-6696, *Realtime Data, LLC d/b/a IXO* v. *CME Group Inc., et al.,* Civil Action No. 1:11-cv-6697, and *Realtime Data, LLC d/b/a IXO* v. *Thomas Reuters, et al.* Civil Action No. 1:11-cv-6698, United States District Court Southern District of New York, filed Jun. 15, 2012, 3 pages.
Exhibit 6, Source Code Chart for U.S. Pat. No. 7,417,568 comparing representative elements of the NQDSLIB source code (May 2, 2002 or earlier), from Expert Report, filed in *Realtime Data, LLC d/b/a IXO* v. *Morgan Stanley, et al.,* Civil Action'No. 1:11-cv-6696, *Realtime Data, LLC d/b/a IXO* v. *CME Group Inc., et al.,* Civil Action No. 1:11-cv-6697, and *Realtime Data, LLC d/b/a IXO* v. *Thomson Reuters, et al.,* Civil Action No. 1:11-cv-6698, United States District Court Southern District of New York, filed Jun. 15, 2012, 3 pages.
Exhibit 7, Source Code Chart for U.S. Pat. No. 7,777,651 comparing representative elements of the NQDSLIB source code (Apr. 29, 2002 or earlier), from Expert Report, filed in *Realtime Data, LLC d/b/a IXO* v. *Morgan Stanley, et al.,* Civil Action No. 1:11-cv-6696, *Realtime Data, LLC d/b/a IXO* v. *CME Group Inc., et al.,* Civil Action No. 1:11-cv-6697, and *Realtime Data, LLC d/b/a IXO* v. *Thomson Reuters, et al.,* Civil Action No. 1:11-cv-6698, United States District Court Southern District of New York, filed Jun. 15, 2012, 21 pages.
Exhibit 8, Source Code Chart for U.S. Pat. No. 7,777,651 comparing representative elements of the NQDSLIB source code (May 2, 2002 or earlier), from Expert Report, filed in *Realtime Data, LLC d/b/a IXO* v. *Morgan Stanley, et al.,* Civil Action No. 1:11-cv-6696, *Realtime Data, LLC d/b/a IXO* v. *CME Group Inc., et al.,* Civil Action No. 1:11-cv-6697, and *Realtime Data, LLC d/b/a IXO* v. *Thomson Reuters, et al.,* Civil Action No. 1:11-cv-6698, United States District Court Southern District of New York, filed Jun. 15, 2012, 21 pages.
Invalidity Expert Report of Dr. James A. Storer (Redacted), filed in *Realtime Data, LLC d/b/a IXO* v. *CME Group Inc., et al.,* Civil Action No. 1:11-cv-6696, *Realtime Data, LLC d/b/a IXO* v. *CME Group Inc., et al.,* Civil Action No. 1:11-cv-6697, and *Realtime Data, LLC d/b/a IXO* v. *Thomson Reuters, et al.,*Civil Action No. 1:11-cv-6698, United States District Court Southern District of New York, filed Jun. 15, 2012, 227 pages.
Defendants' Claim Construction Tutorial, filed in *Realtime Data, LLC d/b/a IXO* v. *Morgan Stanley, et al.,* Civil Action No. 1:11-cv-6696, *Realtime Data, LLC d/b/a IXO* v. *CME Group Inc., et al.,* Civil Action No. 1:11-cv-6697, and *Realtime Data, LLC d/b/a IXO* v. *Thomson Reuters, et al.,* Civil Action No. 1:11-cv-6698, United States District Court Southern District of New York, filed May 17, 2012, 54 pages.
Opinion and Order (Markman), filed in *Realtime Data, LLC d/b/a IXO* v. *Morgan Stanley, et al.,* Civil Acton No. 1:11-cv-6696, *Realtime Data, LLC d/b/a IXO* v. *CME Group Inc., et al.,* Civil Action No. 1:11-cv-6697, and *Realtime Data, LLC d/b/a IXO* v. *Thomson Reuters, et al.,* Civil Action No. 1:11-cv-6698, United States District Court Southern District of New York, filed Jun. 22, 2012, 41 pages.
Opinion and Order (Partial Motion for Summary Judgment re Written Description: "Data Packets"), filed in *Realtime Data, LLC d/b/a IXO* v. *Morgan Stanley, et al.,* Civil Action No. 1:11-cv-6696, *Realtime Data, LLC d/b/a IXO* v. *CME Group Inc., et al.,* Civil Action No. 1:11-cv-6697, and *Realtime Data, LLC d/b/a IXO* v. *Thomson Reuters, et al.,* Civil Action No. 1:11-cv-6698, United States District Court Southern District of New York, filed Jun. 26, 2012, 8 pages.
Opinion and Order (Partial Motion for Summary Judgment re Data Decompression) filed in *Realtime Data, LLC d/b/a IXO* v. *Morgan Stanley, et al.,* Civil Action No. 1:11-cv-6696, *Realtime Data, LLC d/b/a IXO* v. *CME Group Inc., et al.,* Civil Action No. 1:11-cv-6697, and *Realtime Data, LLC d/b/a IXO* v. *Thomson Reuters, et al.,* Civil Action No. 1:11-cv-6698, United States District Court Southern District of New York, filed Jun. 27, 2012, 21 pages.
Technology Tutorial (.exe file), presentation filed in *Realtime Data, LLC d/b/a IXO* v. *Morgan Stanley, et al.,* Civil Action No. 1:11-cv-6696, *Realtime Data, LLC d/b/a IXO* v. *CME Group Inc., et al.,* Civil Action No. 1:11-cv-6697, and *Realtime Data, LLC d/b/a IXO* v.

*Thomas Reuters, et al.* Civil Action No. 1:11-cv-6698, United States District Court Southern District of New York, filed Jun. 2012 (submitted on accompanying CD-ROM).
Friend, R., et al., "IP Payload Compression Using LZS," Network Working Group, Request for Comments: 2395, Category: Informational, Dec. 1998; 9 pages.
"High Speed Network, Developer's Guide," Standard & Poor's Comstock, Version 1.1, 1994, pp. 1-42, and 53-124.
"Information technology—Abstract Syntax Notation One (ASN.1): Specification of basic notation," Series X: Data Networks and Open Systems Communication, OSI networking and System aspects—Abstract Syntax Notation One (ASN.1), International Telecommunication Union, ITU-T Recommendation X.680, Dec. 1997, 109 pages.
Information technology—ASN.1 encoding rules—Specification of Packed Encoding Rules (PER) Series X: Data Networks and Open System Communications, OSI networking and system aspects—Abstract Syntax Notation One (ASN.1), International Telecommunication Union, ITU-T Recommendation X.691, Dec. 1997, 51 pages.
Larmouth, J., "ASN.1 Complete", Academic Press, 2000, pp. xxi-xxvii, 1-45, 115-130, 168-172, 174, 270-276, and 443-472.
Lilley, J., et al., "A Unified Header Compression Framework for Low-Bandwidth Links," MobiCom 2000, Aug. 6-11, 2000, Boston, MA, 12 pages.
Petty, J., "PPP Hewlett-Packard Packet-by-Packet Compression (HP PPC) Protocol," draft-ietf-ppext-hpppc-00.txt., Oct. 1993, 7 pages.
"User Manual for XMill," 2001, 21 pages.
"WAN Link Compression on HP Routers," Hewlett Packard Application Note, May 1995, 7 pages.
Notice of Allowance for U.S. Appl. No. 11/553,427, mailed May 7, 2012, 7 pages.
Non-Final Office Action for U.S. Appl. No. 13/118,122, mailed May 16, 2012, 9 pages.
Non-Final Office Action for U.S. Appl. No. 13/101,994, mailed May 23, 2012, 12 pages.
Notice of Allowance for U.S. Appl. No. 12/857,238, mailed May 29, 2012, 5 pages.
Final Office Action for U.S. Appl. No. 13/154,239, mailed Jun. 26, 2012, 14 pages.
Notice of Allowance for U.S. Appl. No. 12/857,238, mailed Jul. 12, 2012, 5 pages.
Notice of Allowance for U.S. Appl. No. 12/703,042, mailed Jul. 16, 2012, 8 pages.
Official Order Granting Request for Inter Partes Reexamination of U.S. Patent No. 6,604,158, Control No. 95/001,923, mailed May 7, 2012, 14 pages.
Non-Final Office Action in Inter Partes Reexamination of U.S. Patent No. 6,604,158, Control No. 95/001,923, mailed May 7, 2012, 8 pages.
Petition Under 37 C.F.R. §§ 1.181 and 1.182 for Correction of Notice of Intent to Issue Reexamination Certificate in Inter Partes Reexamination of U.S. Patent No. 7,378,992, Control No. 95/000,478, filed May 9, 2012, 8 pages.
Inter Partes Reexamination Certificate in Inter Partes Reexamination of U.S. Patent No. 7,321,937, Control No. 95/000,466, issued May 15, 2012, 2 pages.
Official Order Granting Request for Inter Partes Reexamination of U.S. Patent No. 7,352,300, Control No. 95/001,924, mailed May 17, 2012, 12 pages.
Non-Final Office Action in Inter Partes Reexamination of U.S. Patent No. 7,352,300, Control No. 95/001,924, mailed May 17, 2012, 18 pages.
Patent Owner's Response to Office Action of Mar. 19, 2012 in Inter Partes Reexamination of U.S. Patent No. 7,395,345, Control No. 95/001,925, filed May 21, 2012, 21 pages.
Inter Partes Reexamination Certificate in Inter Partes Reexamination of U.S. Patent No. 7,161,506, Control No. 95/000,479, issued May 22, 2012, 2 pages.
Inter Partes Reexamination Certificate in Inter Partes Reexamination of U.S. Patent No. 6,624,761, Control No. 95/000,464, issued Jun. 12, 2012, 2 pages.
Action Closing Prosecution in Inter Partes Reexamination of U.S. Patent No. 7,777,651, Control No. 95/001,581, mailed Jun. 18, 2012, 45 pages.
Patent Owner's Response to Office Action of Apr. 20, 2012 in Inter partes Reexamination of U.S. Patent No. 7,321,937, Control No. 95/001,922, filed Jun. 20, 2012, 11 pages.
Patent Owner's Response to Office Action of Apr. 25, 2012 in Inter Partes Reexamination of U.S. Patent No. 7,161,506, Control No. 95/001,926, filed Jun. 25, 2012, 20 pages.
Patent Owner's Response to Office Action of Apr. 25, 2012 in Inter Partes Reexamination of U.S. Patent No. 7,378,992, Control No. 95/001,928, filed Jun. 25, 2012, 20 pages.
Patent Owner's Rsponse to Office Action of May 7, 2012 in Inter Partes Reexamination of U.S. Patent No. 6,604,158, Control No. 95/001,923, filed Jul. 9, 2012, 19 pages.
Patent Owner's Response to Office Action of May 17, 2012 in Inter Partes Reexamination of U.S. Patent No. 7,352,300, Control No. 95/001,924, filed Jul. 17, 2012, 31 pages.
New Decision on Appeal after Board Decision in Inter Partes Reexamination of U.S. Patent No. 7,714,747, Control No. 95/001,517, mailed Jul. 24, 2012, 24 pages.

* cited by examiner

SYSTEM AND METHODS FOR ACCELERATED DATA STORAGE AND RETRIEVAL

CROSS-REFERENCE TO RELATED APPLICATION

This application is a Continuation of U.S. patent application Ser. No. 11/230,953, filed on Sep. 19, 2005, now abandoned which is fully incorporated herein by reference, which is a Continuation of U.S. patent application Ser. No. 10/628,801, filed on Jul. 28, 2003, which is abandoned, which is a Continuation of U.S. patent application Ser. No. 09/481,243 filed on Jan. 11, 2000, now U.S. Pat. No. 6,604,158, which is a Continuation-in-Part of U.S. application Ser. No. 09/266,394 filed on Mar. 11, 1999, now U.S. Pat. No. 6,601,104.

BACKGROUND

1. Technical Field

The present invention relates generally to data storage and retrieval and, more particularly to systems and methods for improving data storage and retrieval bandwidth utilizing lossless and/or lossy data compression and decompression.

2. Description of the Related Art

Information may be represented in a variety of manners. Discrete information such as text and numbers are easily represented in digital data. This type of data representation is known as symbolic digital data. Symbolic digital data is thus an absolute representation of data such as a letter, figure, character, mark, machine code, or drawing.

Continuous information such as speech, music, audio, images and video frequently exists in the natural world as analog information. As is well-known to those skilled in the art, recent advances in very large scale integration (VLSI) digital computer technology have enabled both discrete and analog information to be represented with digital data. Continuous information represented as digital data is often referred to as diffuse data. Diffuse digital data is thus a representation of data that is of low information density and is typically not easily recognizable to humans in its native form.

There are many advantages associated with digital data representation. For instance, digital data is more readily processed, stored, and transmitted due to its inherently high noise immunity. In addition, the inclusion of redundancy in digital data representation enables error detection and/or correction. Error detection and/or correction capabilities are dependent upon the amount and type of data redundancy, available error detection and correction processing, and extent of data corruption.

One outcome of digital data representation is the continuing need for increased capacity in data processing, storage, and transmittal. This is especially true for diffuse data where increases in fidelity and resolution create exponentially greater quantities of data. Data compression is widely used to reduce the amount of data required to process, transmit, or store a given quantity of information. In general, there are two types of data compression techniques that may be utilized either separately or jointly to encode/decode data: lossy and lossless data compression.

Lossy data compression techniques provide for an inexact representation of the original uncompressed data such that the decoded (or reconstructed) data differs from the original unencoded/uncompressed data. Lossy data compression is also known as irreversible or noisy compression. Negentropy is defined as the quantity of information in a given set of data. Thus, one obvious advantage of lossy data compression is that the compression ratios can be larger than that dictated by the negentropy limit, all at the expense of information content. Many lossy data compression techniques seek to exploit various traits within the human senses to eliminate otherwise imperceptible data. For example, lossy data compression of visual imagery might seek to delete information content in excess of the display resolution or contrast ratio of the target display device.

On the other hand, lossless data compression techniques provide an exact representation of the original uncompressed data. Simply stated, the decoded (or reconstructed) data is identical to the original unencoded/uncompressed data. Lossless data compression is also known as reversible or noiseless compression. Thus, lossless data compression has, as its current limit, a minimum representation defined by the negentropy of a given data set.

It is well known within the current art that data compression provides several unique benefits. First, data compression can reduce the time to transmit data by more efficiently utilizing low bandwidth data links. Second, data compression economizes on data storage and allows more information to be stored for a fixed memory size by representing information more efficiently.

One problem with the current art is that the bandwidth and storage capacity of existing memory storage devices severely limit the performance of consumer, entertainment, office, workstation, servers, and mainframe computers for all disk and memory intensive operations. For example, magnetic disk mass storage devices currently employed in a variety of home, business, and scientific computing applications suffer from significant seek-time access delays along with profound read/write data rate limitations. Currently the fastest available (10,000) rpm disk drives support only a 22 Megabyte per second data rate (MB/sec). This is in stark contrast to the modern Personal Computer's Peripheral Component Interconnect (PCI) Bus's input/output capability of 528 MB/sec and internal local bus capability of over 1,064 MB/sec. Substantially faster processor, internal local bus memory, and I/O bus bandwidths are expected in the near future.

Another problem within the current art is that emergent high performance disk interface standards such as the Small Computer Systems Interface (SCSI-3) and Fibre Channel offer only the promise of higher data transfer rates through intermediate data buffering in random access memory. These interconnect strategies do not address the fundamental problem that all modern magnetic disk storage devices for the personal computer marketplace are still limited by the same physical media restriction of 22 MB/sec. Faster disk access data rates are only achieved by the high cost solution of simultaneously accessing multiple disk drives with a technique known within the art as data striping.

Additional problems with bandwidth limitations similarly occur within the art by all other forms of sequential, pseudo-random, and random access mass storage devices. Typically mass storage devices include magnetic and optical tape, magnetic and optical disks, and various solid-state mass storage devices. It should be noted that the present invention applies to all forms and manners of memory devices including storage devices utilizing magnetic, optical, and chemical techniques, or any combination thereof.

SUMMARY OF THE INVENTION

The present invention is directed to systems and methods for providing accelerated data storage and retrieval by utilizing lossless and lossy data compression and decompression. The present invention provides an effective increase of the data storage and retrieval bandwidth of a memory storage device. In one aspect of the present invention, a method for providing accelerated data storage comprises the steps of receiving a digital data stream at an input data transmission rate which is greater than a data storage rate of a target storage device, compressing the digital data stream at a compression rate that increases the effective data storage rate of the target storage device, and storing the compressed digital data stream in the target storage device. The step of compressing may be performed using lossless data compression, lossy data compression or a combination of lossless and lossy data compression.

In another aspect of the present invention, the compression process comprises the steps of reading a first parameter that is indicative of a compression type to be applied to the input digital data stream, and selecting at least one allowable encoder based on the first parameter.

In yet another aspect, the compression process further comprises the step of reading a second parameter that is indicative of an amount of information loss that is permissible, if lossy data compression is selected.

In another aspect of the present invention, a method for providing accelerated retrieval of stored data comprises the steps of retrieving a compressed digital data stream from a target storage device at a rate equal to a data access rate of the target storage device and decompressing the compressed data at a decompression rate that increases the effective data access rate of the target storage device. The step of compressing may be performed using lossless data compression, lossy data compression or a combination of lossless and lossy data compression.

In yet another aspect of the present invention, the decompression process comprises the steps of reading a first parameter that is indicative of a decompression type to be applied to the compressed digital data stream, and selecting at least one allowable decoder based on the first parameter.

In another aspect, the decompression process further comprises the step of reading a second parameter that is indicative of an amount of information loss that is permissible, if lossy data decompression is selected.

In yet another aspect of the present invention, the method for providing accelerated data storage utilizes a compression ratio that is at least equal to the ratio of the input data transmission rate to the data storage rate so as to provide continuous storage of the input data stream at the input data transmission rate. Moreover, the method for providing accelerated data retrieval utilizes a decompression ratio which is equal to or greater than the ratio of the data access rate to a maximum accepted output data transmission rate so as to provide a continuous and optimal data output transmission rate.

In another aspect of the present invention, data storage and retrieval acceleration is employed in a disk storage adapter to reduce the time required to store and retrieve data from computer to a disk memory device.

In another aspect of the present invention, data storage and retrieval acceleration is employed in conjunction with random access memory to reduce the time required to store and retrieve data from random access memory.

In another aspect of the present invention, data storage and retrieval acceleration is employed in a video data storage system to reduce the time required to store digital video data.

In another aspect of the present invention, data storage and retrieval acceleration is employed in a display controller to reduce the time required to send display data to the display controller or processor.

In another aspect of the present invention, data storage and retrieval acceleration is employed in an input/output controller to reduce the time required to store, retrieve, or transmit data various forms of data.

The present invention is realized due to recent improvements in processing speed, inclusive of dedicated analog and digital hardware circuits, central processing units, digital signal processors, dedicated finite state machines (and any hybrid combinations thereof), that, coupled with advanced data compression and decompression algorithms, are enabling of ultra high bandwidth data compression and decompression methods that enable improved data storage and retrieval bandwidth.

These and other aspects, features and advantages, of the present invention will become apparent from the following detailed description of preferred embodiments, that is to be read in connection with the accompanying drawings.

DETAILED DESCRIPTION OF PREFERRED EMBODIMENTS

Figure 1:
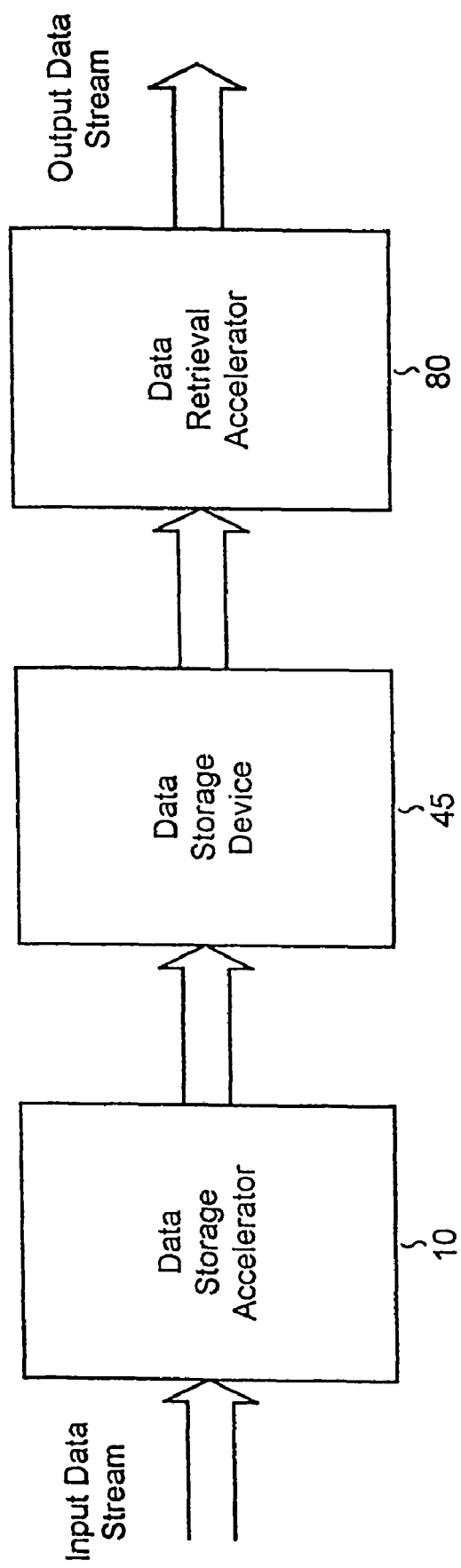
FIG. 1 is a block diagram of a system for accelerated data storage and retrieval according to one embodiment of the present invention.

The present invention is directed to systems and methods for providing improved data storage and retrieval bandwidth utilizing both lossless and lossy data compression and decompression. In the following description, it is to be understood that system elements having equivalent or similar functionality are designated with the same reference numerals in the Figures. It is to be further understood that the present invention may be implemented in various forms of digital and/or analog hardware, software, firmware, or a combination thereof. Preferably, the present invention is implemented on a computer platform including hardware such as one or more central processing units (CPU) or digital signal processors (DSP), a random access memory (RAM), and input/output (I/O) interface(s). The computer platform may also include an operating system, microinstruction code, and dedicated processing hardware utilizing combinatorial logic, finite state machines, analog signal processing. The various processes and functions described herein may be either part of the hardware, microinstruction code or application programs that are executed via the operating system, or any combination thereof.

It is to be further understood that, because some of the constituent system components described herein are preferably implemented as software modules, the actual system connections shown in the Figures may differ depending upon the manner in that the systems are programmed. It is to be appreciated that special purpose microprocessors, digital signal processors, analog signal processors, dedicated hardware, or and combination thereof may be employed to implement the present invention. Given the teachings herein, one of ordinary skill in the related art will be able to contemplate these and similar implementations or configurations of the present invention.

Referring now to FIG. 1, a block diagram illustrates a system for accelerated data storage and retrieval in accordance with an embodiment of the present invention. The system inlcudes a data storage accelerator 10 that is operatively coupled to a data storage device 45. The data storage accelerator operates to increase the effective data storage rate of the data storage device 45. It is to be appreciated that the data storage device 45 may be any form of memory device including all forms of sequential, pseudo-random, and random access storage devices. The memory storage device 45 may be volatile or non-volatile in nature, or any combination thereof. Storage devices as known within the current art include all forms of random access memory, magnetic and optical tape, magnetic and optical disks, along with various other forms of solid-state mass storage devices. Thus it should be noted that the current invention applies to all forms and manners of memory devices including, but not limited to, storage devices utilizing magnetic, optical, and chemical techniques, or any combination thereof.

The data storage accelerator 10 receives and processes data blocks from an input data stream. The data blocks may range in size from individual bits through complete files or collections of multiple files, and the data block size may be fixed or variable. In order to achieve continuous data storage acceleration, the data storage accelerator 10 must be configured to compress a given input data block utilizing lossless or lossy data compression at a rate that is equal to or faster than receipt of the input data. Thus, to achieve optimum throughput, the rate that data blocks from the input data stream may be accepted by the data storage accelerator 10 is a function of the size of each input data block, the compression ratio achieved, and the bandwidth of the target storage device. For example, if the data storage device 45 (e.g., a typical target mass storage device) is capable of storing 30 megabytes per second and the data storage accelerator 10 is capable of providing an average compression ratio of 3:1, then 90 megabytes per second may be accepted as input and the data storage acceleration is precisely 3:1, equivalent to the average compression ratio.

It should be noted that it is not a requirement of the present invention to configure the storage accelerator 10 to compress a given input data block at a rate that is equal to or faster than receipt of the input data. Indeed, if the storage accelerator 10 compresses data at a rate that is less than the input data rate, buffering may be applied to accept data from the input data stream for subsequent compression. Further, since data may be received in high-speed bursts, the present invention may increase the effective bandwidth of the data storage process without increasing the instantaneous bandwidth of the data storage device.

Additionally, it is not a requirement that the data storage accelerator 10 utilize data compression with a ratio that is at least the ratio of the input data stream to the data storage access rate of the data storage device 45. Indeed, if the compression ratio is less than this ratio, the input data stream may be periodically halted to effectively reduce the rate of the input data stream. Alternatively, the input data stream or the output of the data accelerator 10 may be buffered to temporarily accommodate the mismatch in data bandwidth. An additional alternative is to reduce the input data rate to rate that is equal to or slower than the ratio of the input data rate to the data storage device access rate by signaling the data input source and requesting a slower data input rate, if possible.

Referring again to FIG. 1, a data retrieval accelerator 80 is operatively connected to and receives data from the data storage device 45. The data retrieval accelerator 80 receives and processes compressed data from data storage device 45 in data blocks that may range in size from individual bits through complete files or collections of multiple files. Additionally, the input data block size may be fixed or variable. The data retrieval accelerator 80 is configured to decompress each compressed data block which is received from the data storage device 45. In order to achieve continuous accelerated data retrieval, the data retrieval accelerator must decompress a given input data block at a rate that is equal to or faster than receipt of the input data.

In a manner analogous to the data storage accelerator 10, achieving optimum throughput with the data retrieval accelerator 80 is a function of the rate that compressed data blocks are retrieved from the data storage device 45, the size of each data block, the decompression ratio achieved, and the limitation on the bandwidth of the output data stream, if any. For example, if the data storage device 45 is capable of continuously supplying 30 megabytes per second and the data retrieval accelerator 80 is capable of providing an average decompression ratio of 1:3, then a 90 megabytes per second output data stream is achieved, and the corresponding data retrieval acceleration is precisely 1:3, equivalent to the average decompression ratio.

It is to be understood that it is not required that the data retrieval accelerator 80 utilize data decompression with a ratio that is at most equal to the ratio of the retrieval rate of the data storage device 45 to the maximum rate data output stream. Indeed, if the decompression ratio is greater than this ratio, retrieving data from the data storage device may be periodically halted to effectively reduce the rate of the output data stream to be at or below its maximum. Alternatively, the compressed data retrieved from the data storage device 45 or the output of the data decompressor may be buffered to temporarily accommodate the mismatch in data bandwidth. An additional alternative is to increase the output data rate by signaling or otherwise requesting the data output device(s) receiving the output data stream to accept a higher bandwidth, if possible.

Figure 2:
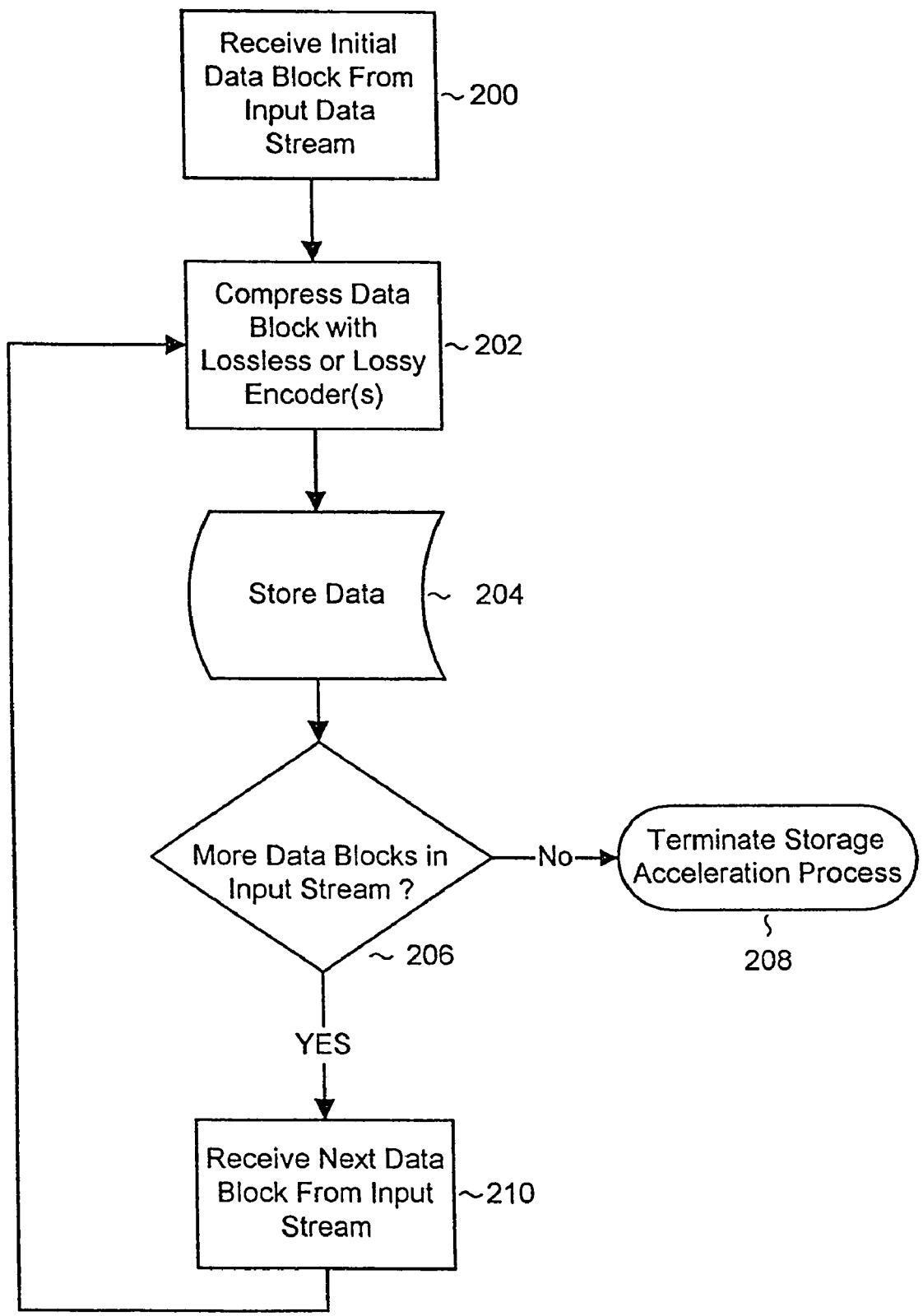
FIG. 2 is a flow diagram of a method for accelerated data storage in accordance with one aspect of the present invention.

Referring now to FIG. 2, a flow diagram of a method for accelerated data storage according to one aspect of the present invention illustrates the operation of the data storage acceleration shown in FIG. 1. As previously stated above, data compression is performed on a per data block basis. Accordingly, the initial input data block in the input data stream (step 200) is input into and compressed by the data storage accelerator 10 (step 202) utilizing lossless or lossy data compression, or any combination or permutation thereof. Upon completion of the encoding of the input data block, the encoded data block is then stored in the data storage device 45 (step 204). A check or other form of test is performed to see if there are additional data blocks available in the input stream (step 206). If no more data blocks are available, the storage acceleration process is terminated (step 208). If more data blocks are available in the input data stream, the next data block is received (step 210) and the process repeats beginning with data compression (step 202).

Figure 3:
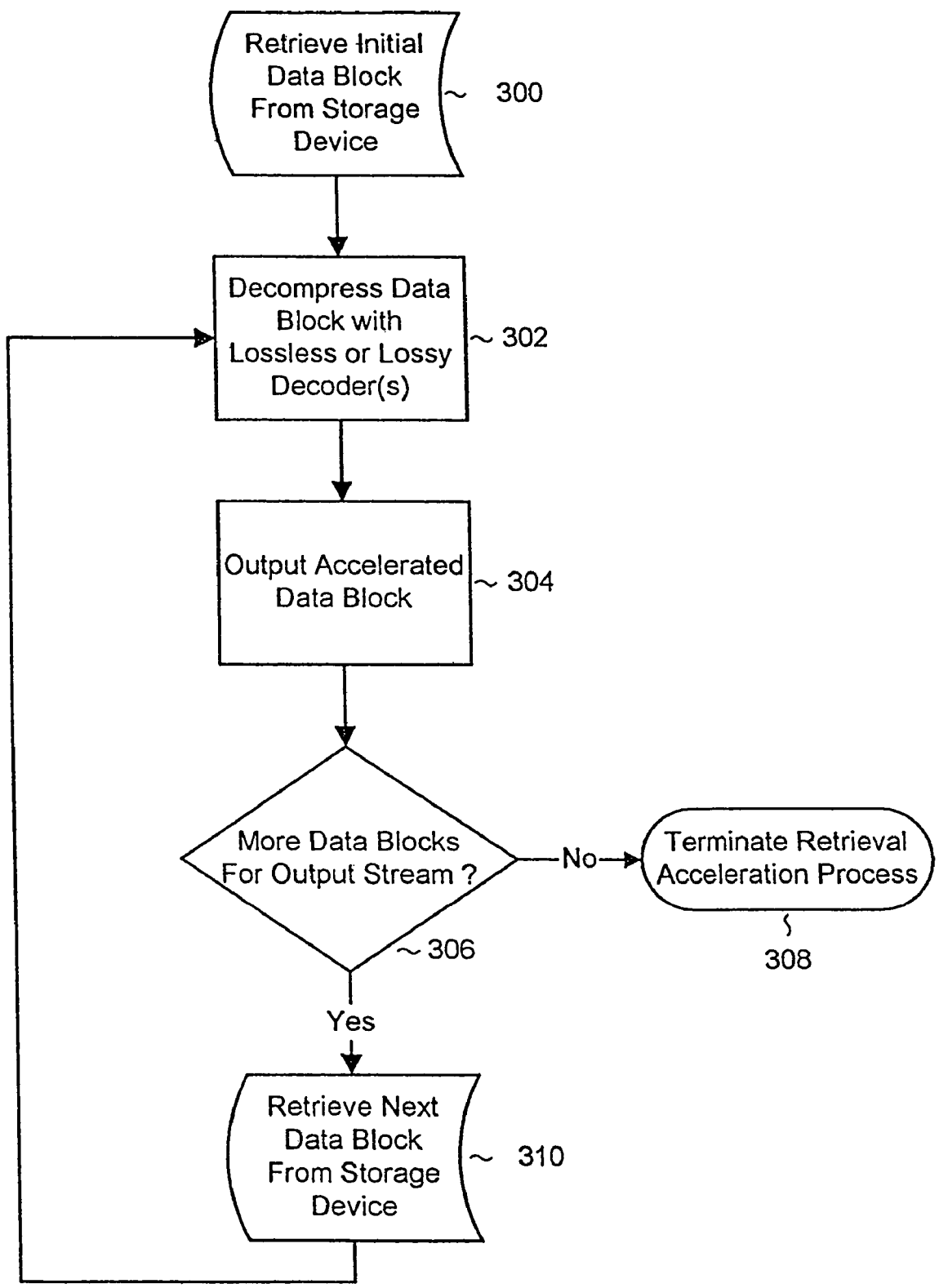
FIG. 3 is a flow diagram of a method for accelerated data retrieval in accordance with one aspect of the present invention.

Referring now to FIG. 3, a flow diagram of a method for accelerated data retrieval according to one aspect of the present invention illustrates the operation of the data retrieval accelerator 80 shown in FIG. 1. Data decompression is also performed on a per data block basis. The initial compressed data block is retrieved from the storage device 45 (step 300) and is decompressed by the data retrieval accelerator 80 (step 302) utilizing lossless or lossy data decompression, or any combination or permutation thereof. Upon completion of the decoding of the initial data block, the decoded data block is then output for subsequent processing, storage, or transmittal (step 304). A check or other form of test is performed to see if additional data blocks available from the data storage device (step 306). If no more data blocks are available, the data retrieval acceleration process is terminated (step 308). If more data blocks are available from the data storage device, the next data block is retrieved (step 310) and the process repeats beginning with data decompression (step 302).

Figure 4A:
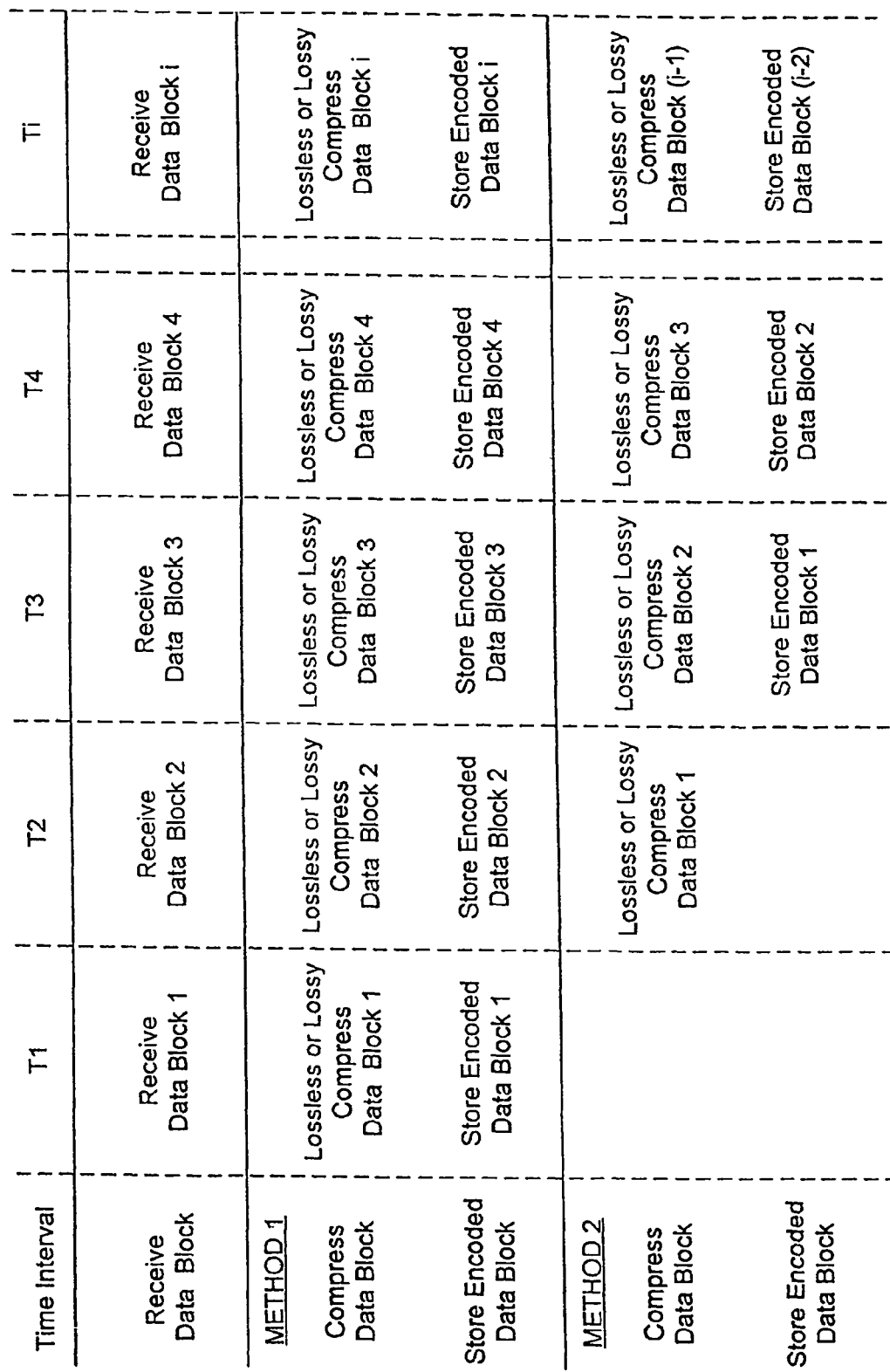
FIGS. 4a and 4b are timing diagrams of methods for accelerated data storage according to the present invention.
Figure 4B:
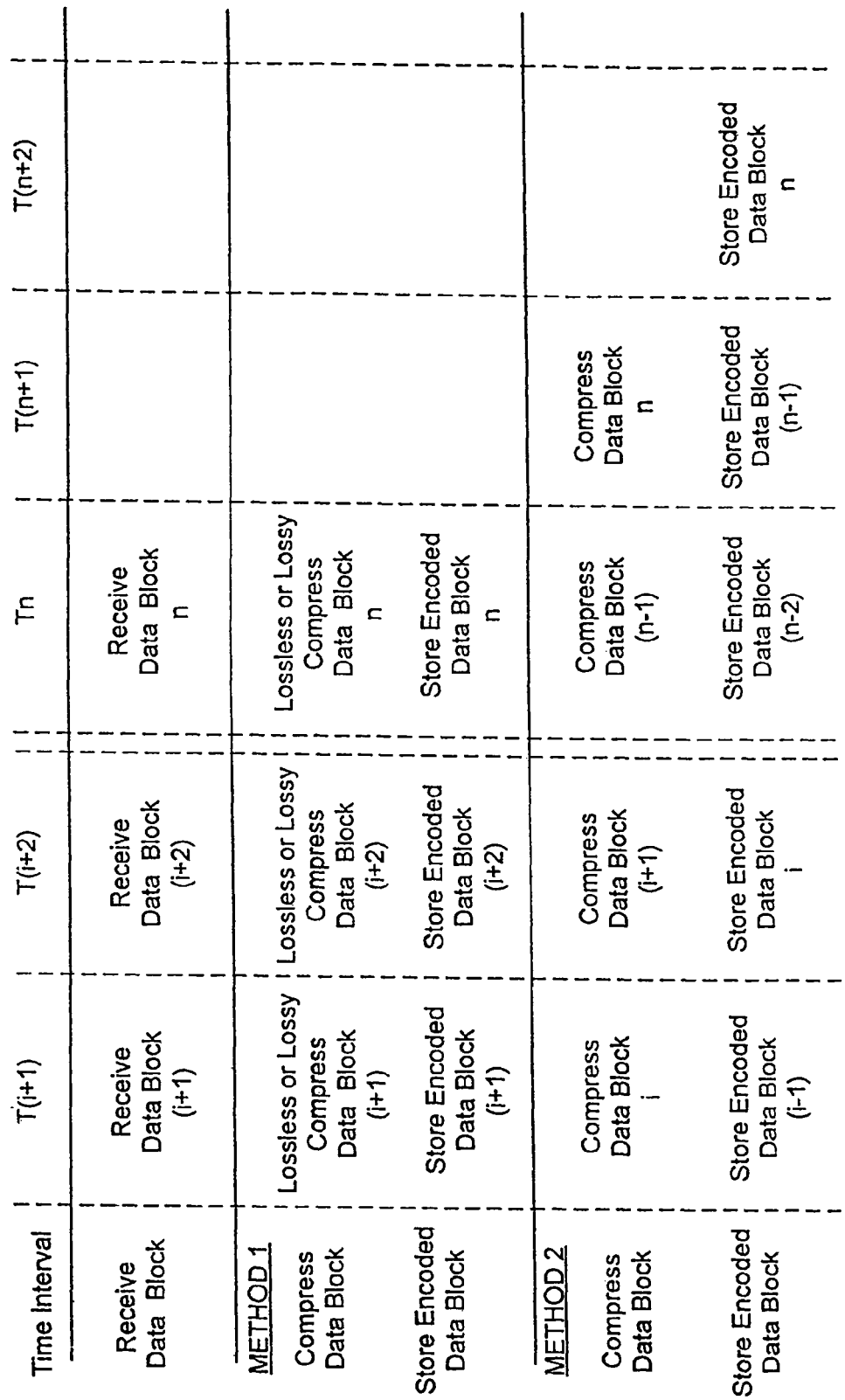

Referring now to FIGS. 4a and 4b, a timing diagram illustrates methods for accelerated data storage utilizing data compression in accordance with the present invention. Successive time intervals of equal duration are represented as T1 through T(n+2). Data block 1 is received from an input stream of one or more data blocks. Similarly, data block 2 through data block n are received during time intervals T2 through Tn, respectively. For the purposes of discussion, FIGS. 4a and 4b demonstrate one embodiment of the data storage utilizing a stream of n data blocks. As previously stated, the input data stream is comprised of one or more data blocks data blocks that may range in size from individual bits through complete files or collections of multiple files. Additionally, the input data block size may be fixed or variable.

In accordance with Method 1, lossless or lossy compression of data block 1 and subsequent storage of the encoded data block 1 occurs within time interval T1. Similarly, the compression and storage of each successive data block occurs within the time interval the data block is received. Specifically, data blocks 2 . . . n are compressed in time intervals T2 . . . Tn, respectively, and the corresponding encoded data blocks 2 . . . n are stored during the time intervals T2 . . . Tn, respectively. It is to be understood that Method 1 relies on data compression and encoding techniques that process data as a contiguous stream (i.e., not block oriented). It is well known within the current art that certain data compression techniques including, but not limited to, dictionary compression, run length encoding, null suppression and arithmetic compression are capable of encoding data when received. Additionally many lossy data techniques commonly applied to diffuse data also exhibit this same capability including, but not limited to adaptive differential pulse code modulation, linear predictive coding, linear prediction based analysis by synthesis coding, subband adaptive transformation and adaptive transform acoustic coding. It is to be appreciated that Method 1 possesses the advantage of introducing a minimum delay in the time from receipt of input to storage of encoded data blocks.

Referring again to FIGS. 4a and 4b, Method 2 illustrates compressing and storing data utilizing pipelined data processing. For Method 2, successive time intervals of equal duration are represented as T1 through T(n+2). Data block 1 is received from an input stream of one or more data blocks during time interval T1. Similarly, data block 2 through data block n are received during time intervals T2 through Tn, respectively. Compression of data block 1 occurs during time interval T2 and the storage of encoded data block 1 occurs during time interval T3. As shown by Method 2, compression of each successive data block occurs within the next time interval after the data block is received and data storage of the corresponding encoded data block occur in the next time interval after completion of data compression.

The pipelining of Method 2, as shown, utilizes successive single time interval delays for lossless or lossy data compression and data storage. Within the current invention, it is permissible to have increased pipelining to facilitate additional data processing or storage delays. For example, data compression processing for a single input data block may utilize more than one time interval. Accommodating more than one time interval for data compression requires additional data compressors to process successive data blocks, e.g., data compression processing of a single data block through three successive time intervals requires three data compressors, each processing a successive input data block. Due to the principle of causality, encoded data blocks are output only after compression encoding.

Method 2 provides for block oriented processing of the input data blocks. Within the current art, block oriented data compression techniques provide the opportunity for increased data compression ratios. This includes various forms of dictionary compression, along with many compression techniques commonly applied to diffuse image data including current standards by the Joint Photographic Experts Group, the Motion Picture Experts Group, vector quantization, wavelet coding, and fractal coding. Method 2 may provide increased delay from receipt of input data block to storage of encoded data. However, depending on factors such as the size of input data blocks, the rate that they are received, the time required for data compression processing, the data compression ratio achieved, the bandwidth of the data storage device, and the intended application, the delay may or may not be significant. For example, in a modern database system, recording data for archival purposes, the opportunity for increased data compression may far outweigh the need for minimum delay. Conversely, in systems such as a military real-time video targeting system, minimizing delay is often of the essence. It should be noted that Method 1 and Method 2 are not mutually exclusive, and may be utilized in any combination.

Figure 5A:
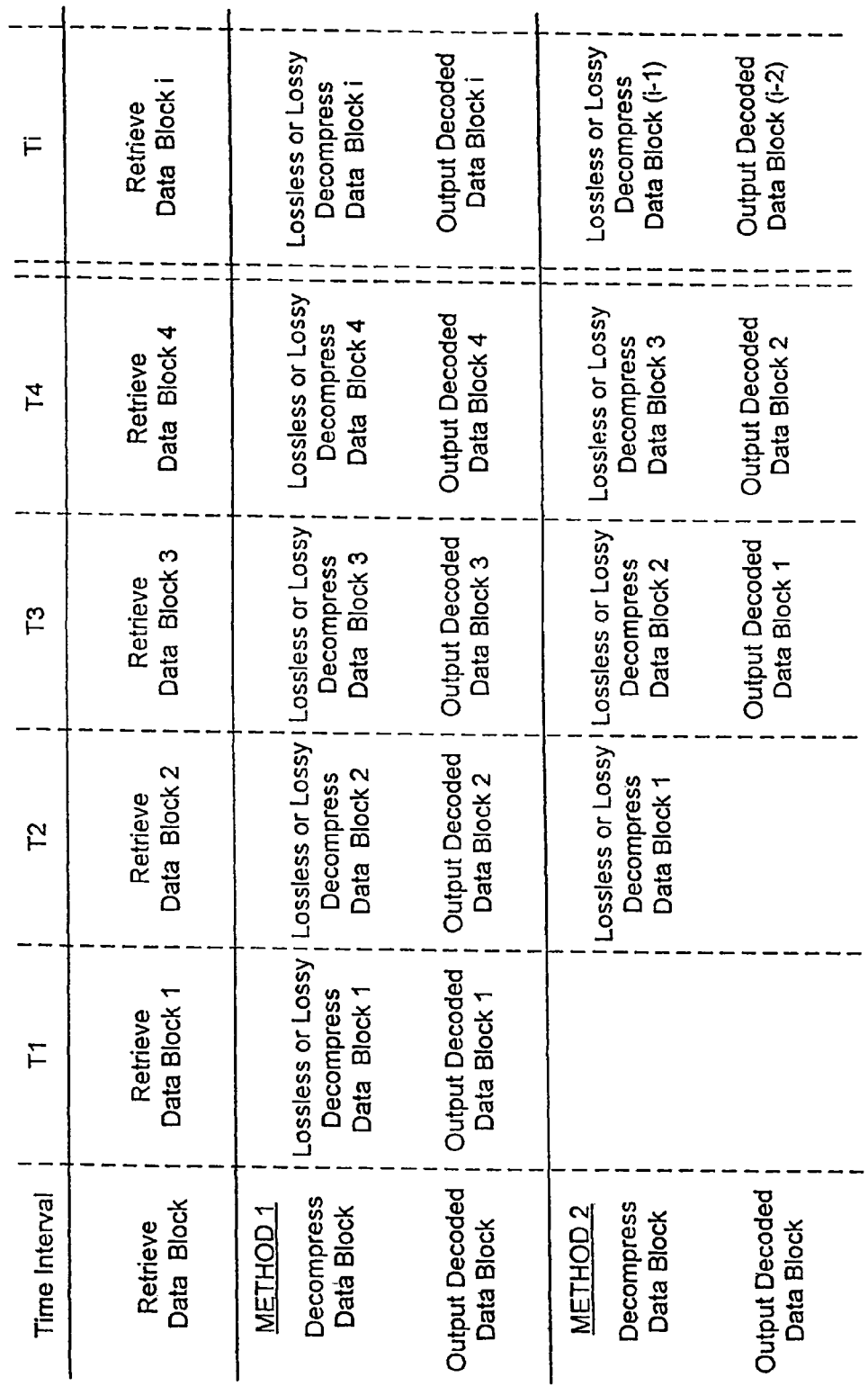
FIGS. 5a and 5b are timing diagrams of methods for accelerated data retrieval according to the present invention.
Figure 5B:
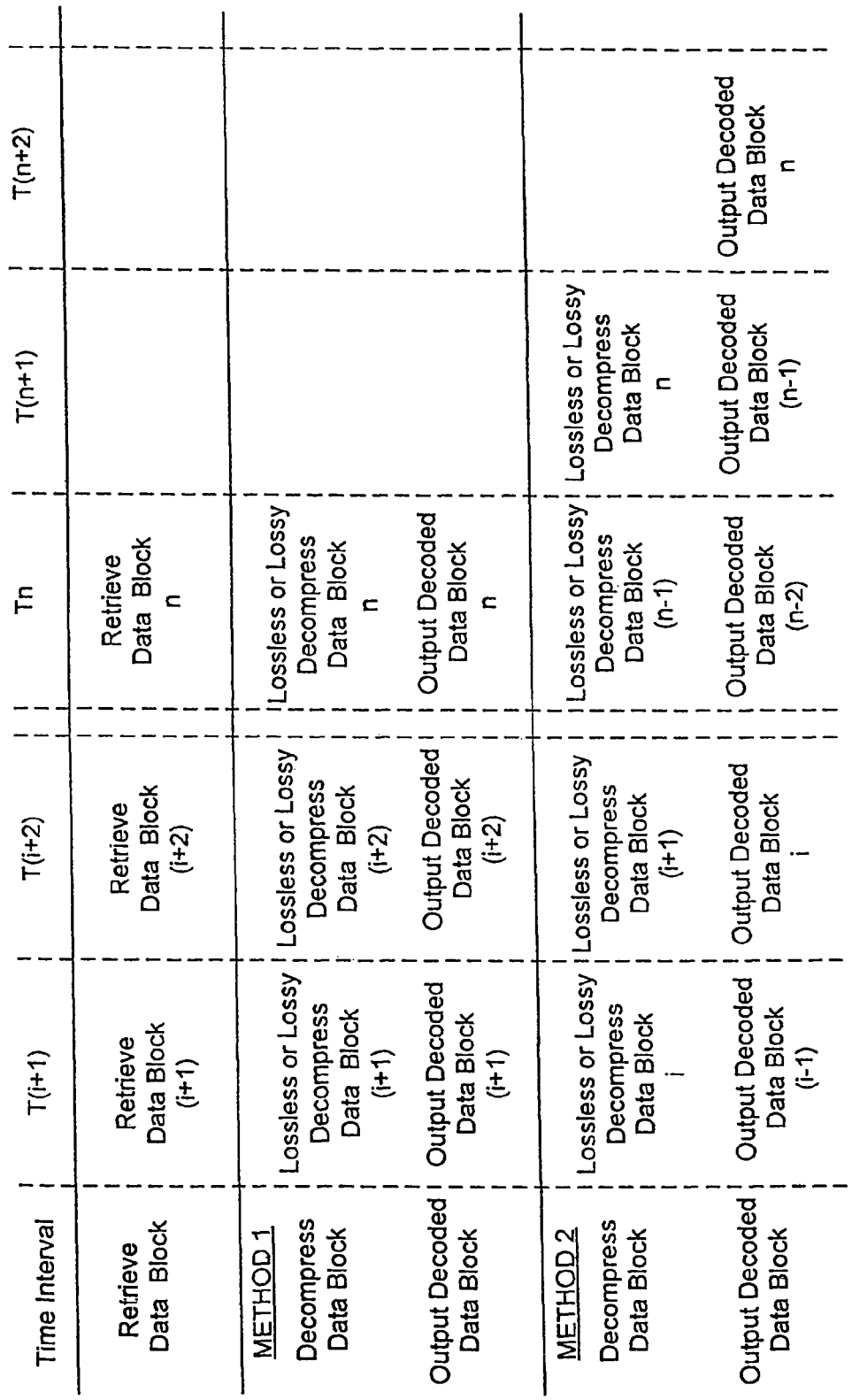

Referring now to FIGS. 5a and 5b, a timing diagram illustrates methods for accelerated data retrieval utilizing data decompression in accordance the present invention shown. Successive time intervals of equal duration are represented as T1 through T(n+2). Data block 1 is retrieved or otherwise accepted as input from one or more compressed data blocks retrieved from a data storage device. As shown, data block 2 through data block n are retrieved during time intervals T2 through Tn, respectively. For the purposes of discussion, FIGS. 5a and 5b demonstrate one embodiment of the data retrieval accelerator utilizing a stream of n data blocks. Once again, the retrieved data stream is comprised of one or more data blocks that may range in size from individual bits through complete files or collections of multiple files. Additionally, the retrieved data block size may be fixed or variable.

In accordance with Method 1, lossless or lossy decompression of data block 1 and subsequent outputting of the decoded data block 1 occurs within time interval T1. Similarly, decompression and outputting of each successive data block occurs within the time intervals they are retrieved. In particular, data block 2 through data block n are decompressed and decoded data block 2 through decoded data block n are output during time intervals T2 . . . Tn, respectively. It is to be understood that Method 1 relies on data decompression and decoding techniques that process compressed data as a contiguous stream (i.e., not block oriented). It is well known within the current art that certain data decompression techniques including, but not limited to, dictionary compression, run length encoding, null suppression and arithmetic compression are capable of decoding data when received. Method 1 possesses the advantage of introducing a minimum delay in the time from retrieval of compressed data to output of decoded data blocks.

Referring again to FIGS. 5a and 5b, Method 2 involves lossless or lossy decompression and output of data utilizing pipelined data processing. For Method 2, successive time intervals of equal duration are represented as T1 through T(n+2). Data block 1 through data block n are retrieved or otherwise accepted as input from a data storage device during time intervals T1 through Tn, respectively. Decompression of data block 1 occurs during time interval T2 and the decoded data block 1 is output during time interval T3. Similarly, decompression of each successive data block occurs within the next time interval after the data block is retrieved and the outputting of the decoded data block occurs during the next time interval after completion of data decompression.

The pipelining of Method 2, utilizes successive single time interval delays for data decompression and data output. Within the current invention, it is permissible to have increased pipelining to facilitate additional data retrieval or data decompression processing delays. For example, data decompression processing for a single input data block may utilize more than one time interval. Accommodating more than one time interval for data compression requires additional data decompressors to process successive compressed data blocks, e.g., data decompression processing of a single data block through three successive time intervals requires three data decompressors, each processing a successive input data block. Due to the principle of causality, decoded data blocks are only output after decompression decoding.

As before, Method 2 provides for block oriented processing of the retrieved data blocks. Within the current art, block oriented data decompression techniques provide the opportunity to utilize both lossless and lossy data compression encoders that increase data compression ratios. The disadvantage of method 2 is increased delay from retrieval of compressed data block to output of decompressed data. As previously discussed for data storage acceleration, depending on the size of retrieved data blocks, the rate that they are retrieved, the time required for data decompression processing, the data decompression ratio achieved, the bandwidth of the data output, and the intended application, the delay may or may not be significant.

Figure 6A:
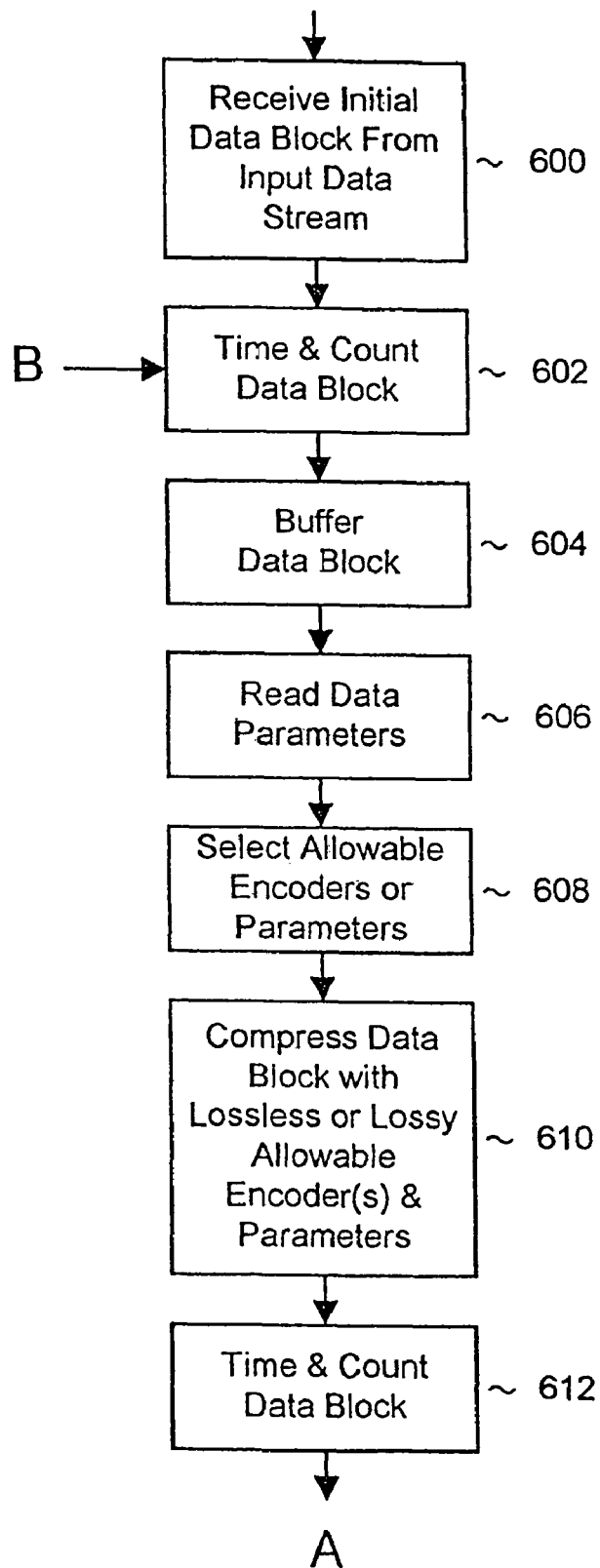
FIGS. 6a and 6b comprise a flow diagram of a method for accelerated data storage in accordance with a further aspect of the present invention.
Figure 6B:
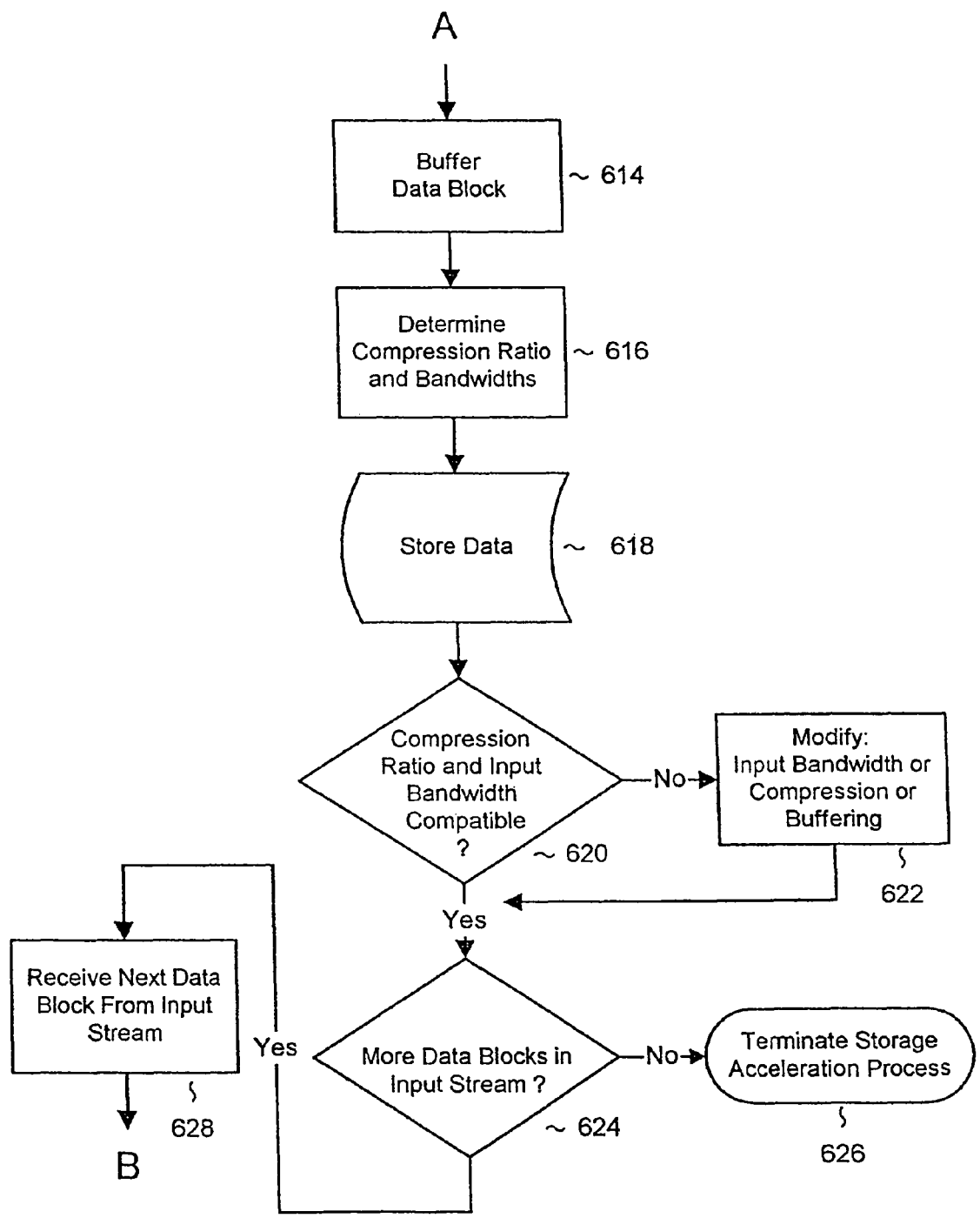

Referring now to FIGS. 6a and 6b, a flow diagram illustrates a method for accelerated data storage according to a further aspect of the present invention. With this method, the lossless or lossy data compression rate of the storage accelerator 10 is not required to be equal to or greater than the ratio of the input data rate to the data storage access rate. As previously stated above, data compression is performed on a per data block basis. Accordingly, the initial input data block in the input data stream is received (step 600) and then timed and counted (step 602). Timing and counting enables determination of the bandwidth of the input data stream. The input data block is then buffered (step 604).

Optionally, certain data parameters may be read (step 606) to determine whether the data may be compressed utilizing lossless or lossy techniques. If lossy techniques may be employed, additional parameters may also be included to indicate the amount of information loss that is permissible. Allowable encoders and associated parameters are then selected from the pool of available encoders (step 608). By way of example, in one embodiment, header information associated with a given data block or a series of data blocks may contain a binary flag that could be set to either logic "1" or logic "0" to indicate that the given data block or series of data blocks may be encoded using lossless or lossy data compression, respectively. In another embodiment, a multi-valued encoding parameter may be employed where all values true, for example a 16-bit value of FFFF (hexadecimal), signifies lossless encoding and where each value in the range from FFFE to 0000 denotes the amount of residual information content required. In a further embodiment, a list of encoding techniques may be added wherein each encoding techniques in the list is indexed and selected via using the above information content values. In yet a further embodiment, the values for the information content may possess different meanings dependent on system context. For example, an incoming video data stream may have an information value of 7FFF. This value may invoke a lossy encoder that scans a system parameter table which indicates video display or printer display resolution. With this information, the encoding algorithm can set the allowed information loss for the encoding process. It is to be understood that this technique may be applied to all forms of peripheral input and output devices.

The data is then compressed by the data storage accelerator 10 (step 610). During and after the encoding of the input data block, the encoded data block is then timed and counted (step 612), thus enabling determination of the compression ratio and compression bandwidth. The compressed, timed and counted data block is then buffered (step 614). The compression ratio and bandwidths of the input data stream and the encoder are then determined (step 616). The compressed data block is then stored in the data storage device 45 (step 618). Checks or other forms of testing are applied to ensure that the data bandwidths of the input data stream, data compressor, and data storage device are compatible (step 620). If the bandwidths are not compatible, then one or more system parameters may be modified to make the bandwidths compatible (step 622). For instance, the input bandwidth may be adjusted by either not accepting input data requests, lowering the duty cycle of input data requests, or by signaling one or more of the data sources that transmit the input data stream to request or mandate a lower data rate. In addition, the data compression ratio of the data storage accelerator 10 may be adjusted by applying a different type of encoding process such as employing lossless or lossy encoding, utilizing a single encoder, multiple parallel or sequential encoders, or any combination thereof to decrease encoding time, increase data compression ratio, or both. Furthermore, additional temporary buffering of either the input data stream or the compressed data stream (or both) may be utilized.

By way of example, assuming the input data rate is 90 MB/sec and the data storage accelerator 10 provides a compression ration of 3:1, then the output of the data storage accelerator 10 would be 30 MB/sec. If the maximum data storage rate of the data storage device 45 is 20 MB/sec (which is less than the data rate output from the data storage accelerator 10), data congestion and backup would occur at the output of the data storage accelerator 10. This problem may be solved by adjusting any one of the system parameters as discussed above, e.g., by adjusting the compression ratio to provide a data output rate from the data storage accelerator 10 to be equal to the data storage rate of the data storage device 45.

On the other hand, if the bandwidths are compatible (or made compatible by adjusting one or more of the system parameters), then a check or other form of test is performed to determine if there are additional data blocks available in the input stream (step 624). If no more data blocks are available, the storage acceleration process is terminated (step 626). If more data blocks are available in the input data stream, the next data block is received (step 628) and the process repeats beginning with timing and counting of the input data block (step 602).

Figure 7A:
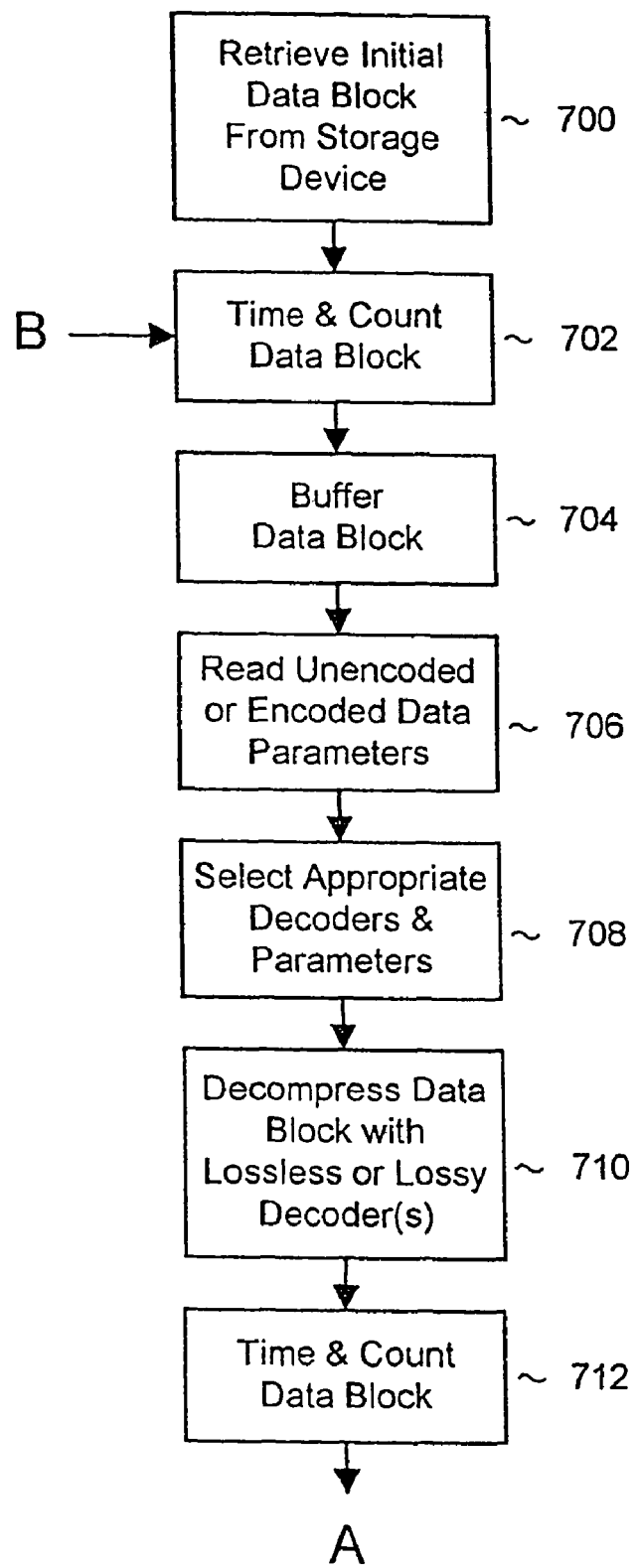
FIGS. 7a and 7b comprise a flow diagram of a method for accelerated data retrieval in accordance with a further aspect of the present invention.
Figure 7B:
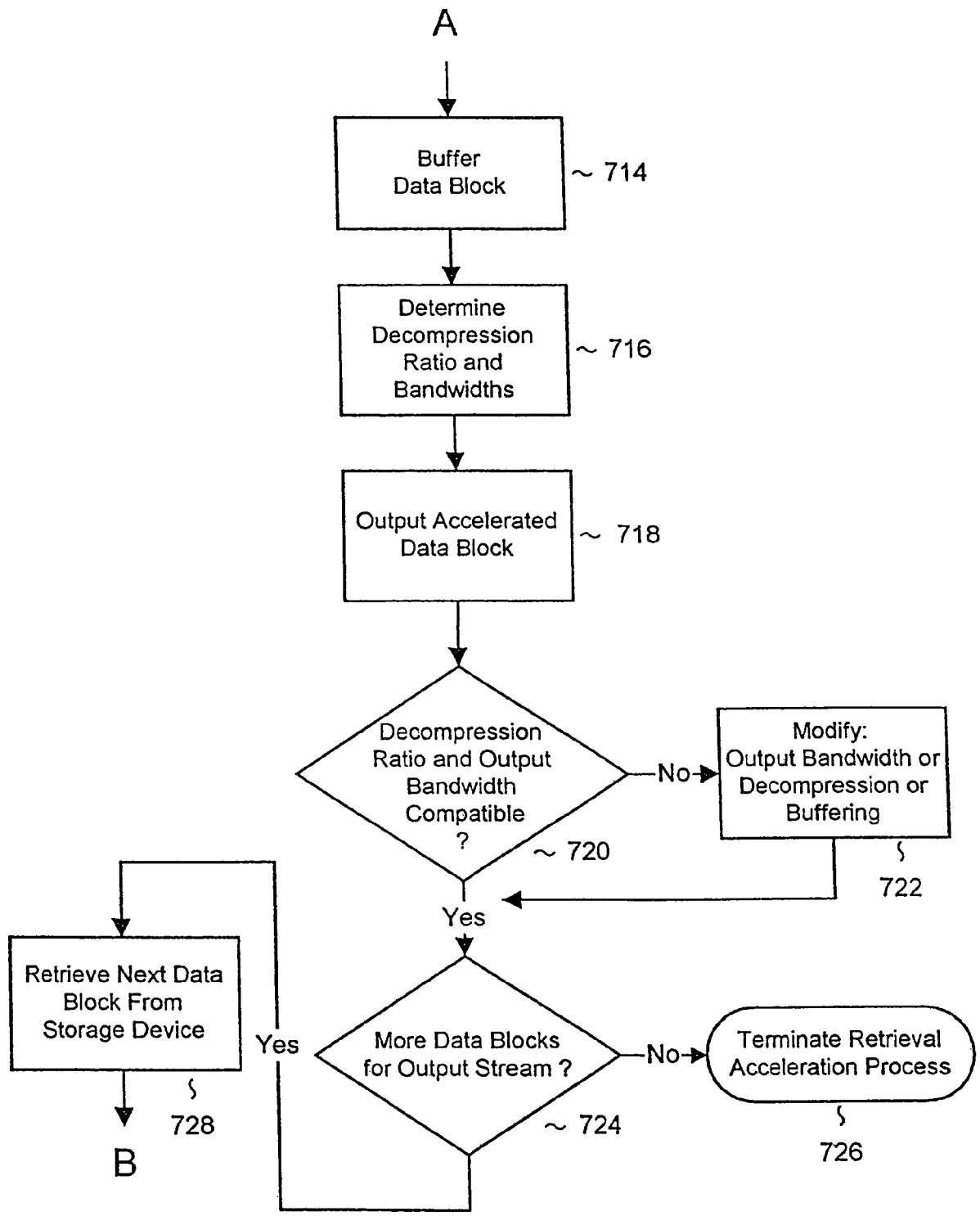

Referring now to FIGS. 7a and 7b, a flow diagram illustrates a method for accelerated data retrieval according to one aspect of the present invention. With this method, the data decompression ratio is not required to be less than or equal to the ratio of the data retrieval access rate to the maximum output data rate. As previously stated above, data decompression is performed on a per data block basis. Accordingly, the initial input data block is retrieved from the storage device (step 700) and is timed and counted (step 702). Timing and counting enables determination of the bandwidth of data retrieval. The retrieved data block is then buffered (step 704). Optionally, encoded or encoded data parameters may be read (step 706) to select the allowable lossless or lossy decoders and associated data parameters (step 708) using, for example, the techniques discussed above for the encoding process (e.g., steps 606 and 608, FIG. 6a).

Encoded data is then decompressed by the data retrieval accelerator 80 (step 710). During and after the decoding of the input data block, the decoded data block is then timed and counted (step 712), thus enabling determination of the decompression ratio and decompression bandwidth. The decompressed, timed and counted data block is then buffered (step 714). The decompression ratio and bandwidths of the retrieved data and the decoder are then determined (step 716). The decompressed data block is then output (step 718). Checks or other forms of testing are applied to ensure that the data bandwidths of the retrieved data, data decompressor, and data output are compatible (step 720). If the bandwidths are not compatible, then one or more system parameters may be modified to make the bandwidths compatible (step 722). For instance, the data retrieval bandwidth may be adjusted either not accepting (continuously) data blocks retrieved from the data storage device or lowering the duty cycle of data blocks retrieved from the data storage device. In addition, one or more of the output data devices that receive the output data stream may be signaled or otherwise requested to accept a higher data rate. Moreover, a different type of decoding process may be applied to adjust the data decompression rate by applying, for example, lossless or lossy decoders, different decoding parameters, a single decoder, multiple parallel or sequential decoders, or any combination thereof. Also, additional temporary buffering of either the retrieved or output data or both may be utilized.

By way of example, assuming the data storage device 45 has a data retrieval rate of 20 MB/sec and the data retrieval accelerator 80 provides a 1:4 decompression ratio, then the output of the data retrieval accelerator 80 would be 80 MB/sec. If the maximum output data transmission rate that can be accepted from the data retrieval accelerator 80 is 60 MB/sec (which is lower than the data output data rate of 80 MB/sec of the data retrieval accelerator 80), data congestion and backup would occur at the output of the data retrieval accelerator 80. This problem may be solved by adjusting any one of the system parameters as discussed above, e.g., by adjusting the decompression ratio to provide a data output rate from the data storage accelerator 80 to be equal to the maximum accepted output data transmission rate.

On the other hand, if the bandwidths are compatible (or made compatible by adjusting one or more system parameters), then a check or other form of test is performed to see if there are additional data blocks available from the data storage device (step 724). If no more data blocks are available for output, the retrieval acceleration process is terminated (step 726). If more data blocks are available to be retrieved from the data storage device, the next data block is retrieved (step 728) and the process repeats beginning with timing and counting of the retrieved data block (return to step 702).

It is to be understood that any conventional compression/decompression system and method (which comply with the above mentioned constraints) may be employed in the data storage accelerator 10 and data retrieval accelerator 80 for providing accelerated data storage and retrieval in accordance with the present invention. Preferably, the present invention employs the data compression/decompression techniques disclosed in U.S. Ser. No. 09/210,491 entitled "Content Independent Data Compression Method and System," filed on Dec. 11, 1998, which is commonly assigned and which is fully incorporated herein by reference. It is to be appreciated that the compression and decompression systems and methods disclosed in U.S. Ser. No. 09/210,491 are suitable for compressing and decompressing data at rates which provide accelerated data storage and retrieval.

Figure 8:
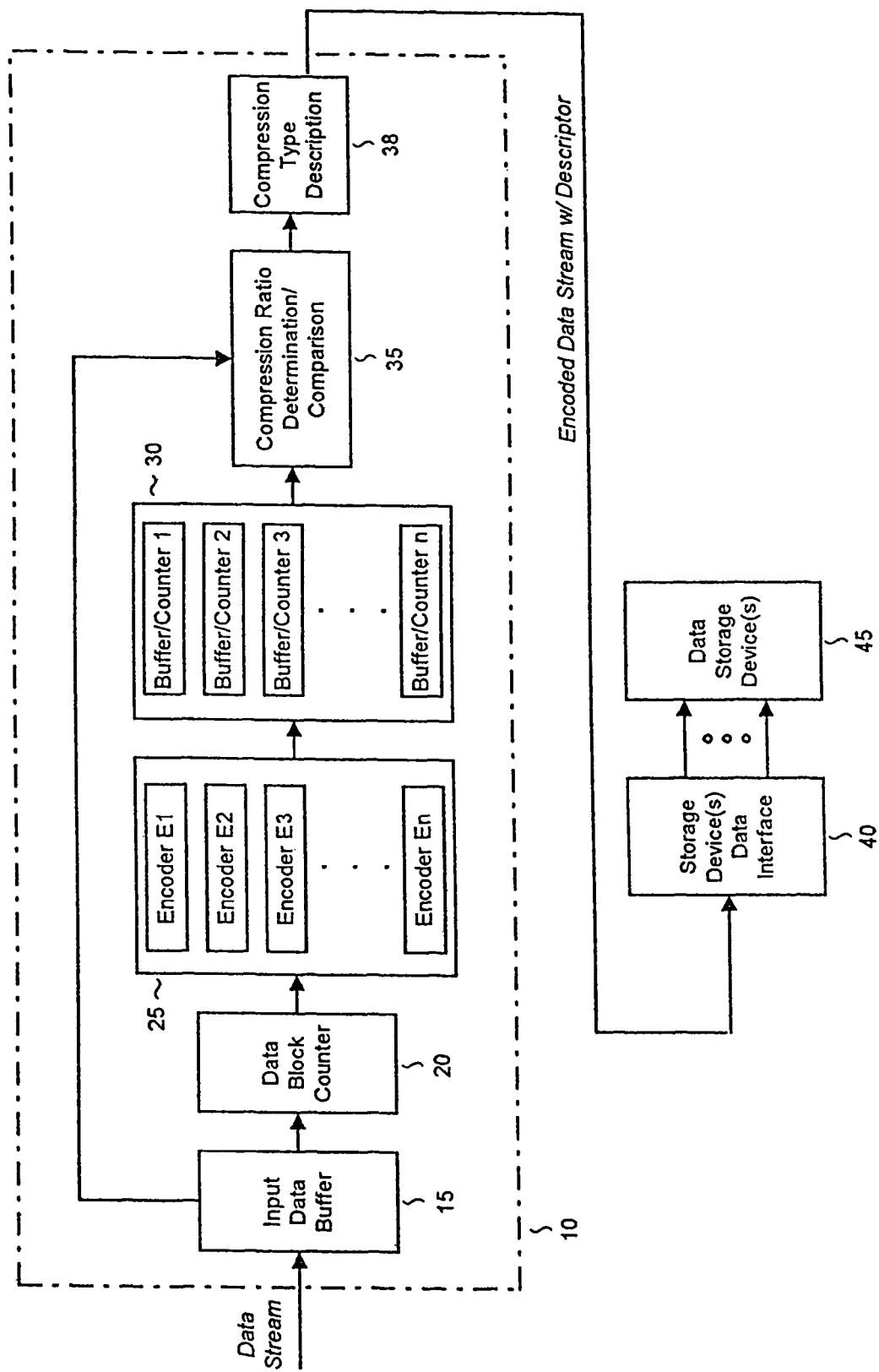
FIG. 8 is a detailed block diagram of a system for accelerated data storage according to a preferred embodiment of the present invention.

Referring now to FIG. 8, a detailed block diagram illustrates a preferred system for accelerated data storage which employs a compression system as disclosed in the above-incorporated U.S. Ser. No. 09/210,491. In this embodiment, the data storage accelerator 10 accepts data blocks from an input data stream and stores the input data block in an input buffer or cache 15. It is to be understood that the system processes the input data stream in data blocks that may range in size from individual bits through complete files or collections of multiple files. Additionally, the input data block size may be fixed or variable. A counter 20 counts or otherwise enumerates the size of input data block in any convenient units including bits, bytes, words, double words. It should be noted that the input buffer 15 and counter 20 are not required elements of the present invention. The input data buffer 15 may be provided for buffering the input data stream in order to output an uncompressed data stream in the event that, as discussed in further detail below, every encoder fails to achieve a level of compression that exceeds an a priori specified minimum compression ratio threshold.

Data compression is performed by an encoder module 25 which may comprise a set of encoders E1, E2, E3 . . . En. The encoder set E1, E2, E3 . . . En may include any number "n" (where n may=1) of those lossless encoding techniques currently well known within the art such as run length, Huffman, Lempel-Ziv Dictionary Compression, arithmetic coding, data compaction, and data null suppression. It is to be understood that the encoding techniques are selected based upon their ability to effectively encode different types of input data. It is to be appreciated that a full complement of encoders are preferably selected to provide a broad coverage of existing and future data types.

The encoder module 25 successively receives as input each of the buffered input data blocks (or unbuffered input data blocks from the counter module 20). Data compression is performed by the encoder module 25 wherein each of the encoders E1 . . . En processes a given input data block and outputs a corresponding set of encoded data blocks. It is to be appreciated that the system affords a user the option to enable/disable any one or more of the encoders E1 . . . En prior to operation. As is understood by those skilled in the art, such feature allows the user to tailor the operation of the data compression system for specific applications. It is to be further appreciated that the encoding process may be performed either in parallel or sequentially. In particular, the encoders E1 through En of encoder module 25 may operate in parallel (i.e., simultaneously processing a given input data block by utilizing task multiplexing on a single central processor, via dedicated hardware, by executing on a plurality of processor or dedicated hardware systems, or any combination thereof). In addition, encoders E1 through En may operate sequentially on a given unbuffered or buffered input data block. This process is intended to eliminate the complexity and additional processing overhead associated with multiplexing concurrent encoding techniques on a single central processor and/or dedicated hardware, set of central processors and/or dedicated hardware, or any achievable combination. It is to be further appreciated that encoders of the identical type may be applied in parallel to enhance encoding speed. For instance, encoder E1 may comprise two parallel Huffman encoders for parallel processing of an input data block.

A buffer/counter module 30 is operatively connected to the encoder module 25 for buffering and counting the size of each of the encoded data blocks output from encoder module 25. Specifically, the buffer/counter 30 comprises a plurality of buffer/counters BC1, BC2, BC3 . . . BCn, each operatively associated with a corresponding one of the encoders E1 . . . En. A compression ratio module 35, operatively connected to the output buffer/counter 30, determines the compression ratio obtained for each of the enabled encoders E1 . . . En by taking the ratio of the size of the input data block to the size of the output data block stored in the corresponding buffer/counters BC1 . . . BCn. In addition, the compression ratio module 35 compares each compression ratio with an a priori-specified compression ratio threshold limit to determine if at least one of the encoded data blocks output from the enabled encoders E1 . . . En achieves a compression that exceeds an a priori-specified threshold. As is understood by those skilled in the art, the threshold limit may be specified as any value inclusive of data expansion, no data compression or expansion, or any arbitrarily desired compression limit. A description module 38, operatively coupled to the compression ratio module 35, appends a corresponding compression type descriptor to each encoded data block which is selected for output so as to indicate the type of compression format of the encoded data block. A data compression type descriptor is defined as any recognizable data token or descriptor that indicates which data encoding technique has been applied to the data. It is to be understood that, since encoders of the identical type may be applied in parallel to enhance encoding speed (as discussed above), the data compression type descriptor identifies the corresponding encoding technique applied to the encoded data block, not necessarily the specific encoder. The encoded data block having the greatest compression ratio along with its corresponding data compression type descriptor is then output for subsequent data processing, storage, or transmittal. If there are no encoded data blocks having a compression ratio that exceeds the compression ratio threshold limit, then the original unencoded input data block is selected for output and a null data compression type descriptor is appended thereto. A null data compression type descriptor is defined as any recognizable data token or descriptor that indicates no data encoding has been applied to the input data block. Accordingly, the unencoded input data block with its corresponding null data compression type descriptor is then output for subsequent data processing, storage, or transmittal.

The data storage acceleration device 10 is connected to a data storage device interface 40. The function of the data storage interface 40 is to facilitate the formatting and transfer of data to one or more data storage devices 45. The data storage interface may be any of the data interfaces known to those skilled in the art such as SCSI (Small Computer Systems Interface), Fibre Channel, "Firewire", IEEE P1394, SSA (Serial Storage Architecture), IDE (Integrated Disk Electronics), and ATA/ATAPI interfaces. It should be noted that the storage device data interface 40 is not required for implementing the present invention. As before, the data storage device 45 may be any form of memory device including all forms of sequential, pseudo-random, and random access storage devices. The data storage device 45 may be volatile or non-volatile in nature, or any combination thereof. Storage devices as known within the current art include all forms of random access memory (RAM), magnetic and optical tape, magnetic and optical disks, along with various other forms of solid-state mass storage devices (e.g., ATA/ATAPI IDE disk). Thus it should be noted that the current invention applies to all forms and manners of memory devices including, but not limited to, storage devices utilizing magnetic, optical, and chemical techniques, or any combination thereof.

Again, it is to be understood that the embodiment of the data storage accelerator 10 of FIG. 8 is exemplary of a preferred compression system which may be implemented in the present invention, and that other compression systems and methods known to those skilled in the art may be employed for providing accelerated data storage in accordance with the teachings herein. Indeed, in another embodiment of the compression system disclosed in the above-incorporated U.S. Ser. No. 09/210,491, a timer is included to measure the time elapsed during the encoding process against an a priori-specified time limit. When the time limit expires, only the data output from those encoders (in the encoder module 25) that have completed the present encoding cycle are compared to determine the encoded data with the highest compression ratio. The time limit ensures that the real-time or pseudo real-time nature of the data encoding is preserved. In addition, the results from each encoder in the encoder module 25 may be buffered to allow additional encoders to be sequentially applied to the output of the previous encoder, yielding a more optimal lossless data compression ratio. Such techniques are discussed in greater detail in the above-incorporated U.S. Ser. No. 09/210,491.

Figure 9:
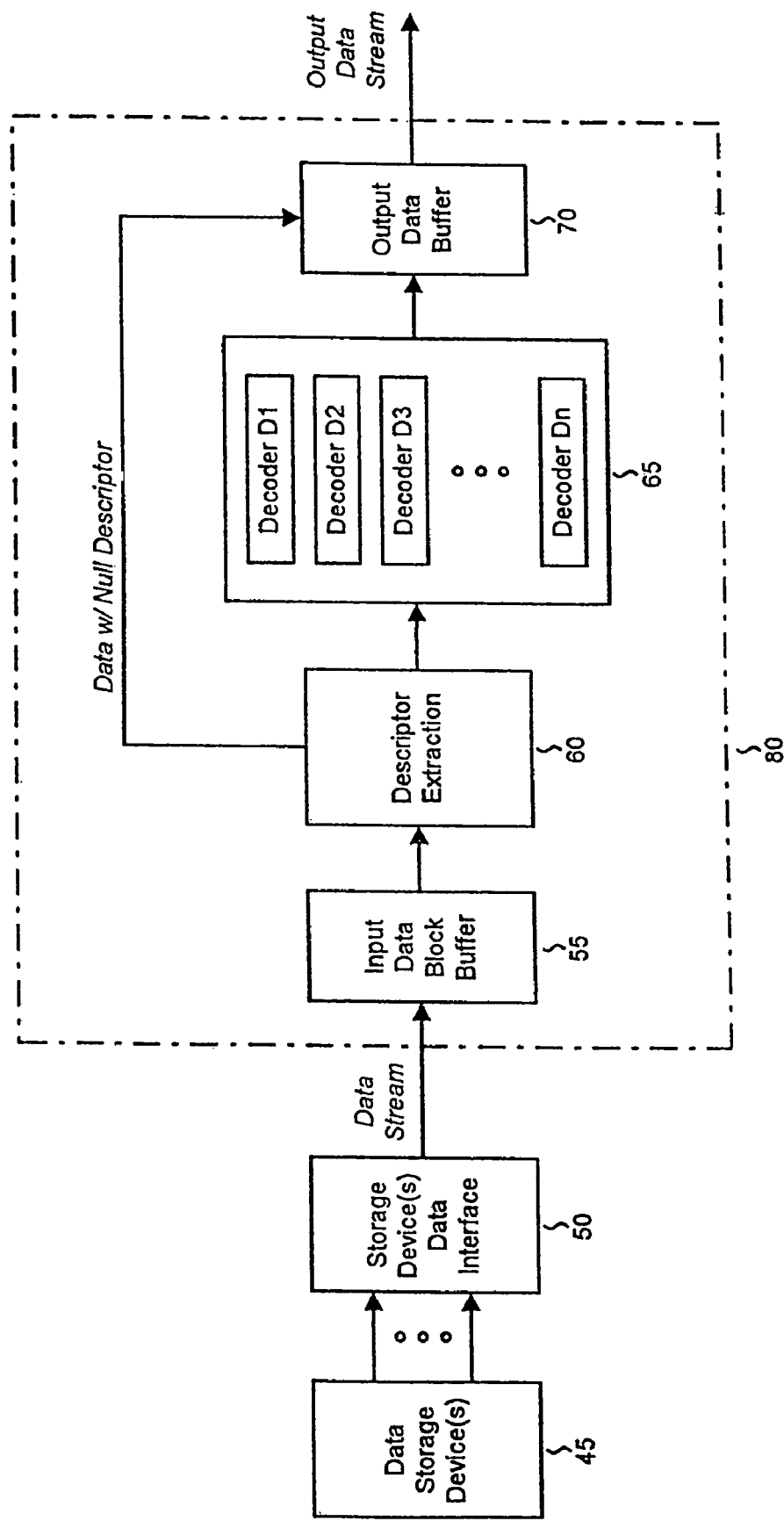
FIG. 9 is a detailed block diagram of a system for accelerated data retrieval according to a preferred embodiment of the present invention.

Referring now to FIG. 9, a detailed block diagram illustrates a preferred system for accelerated data retrieval employing a decompression system as disclosed in the above-incorporated U.S. Ser. No. 09/210,491. In this embodiment, the data retrieval accelerator 80 retrieves or otherwise accepts data blocks from one or more data storage devices 45 and inputs the data via a data storage interface 50. It is to be understood that the system processes the input data stream in data blocks that may range in size from individual bits through complete files or collections of multiple files. Additionally, the input data block size may be fixed or variable. As stated above, the memory storage device 45 may be volatile or non-volatile in nature, or any combination thereof. Storage devices as known within the current art include all forms of random access memory, magnetic and optical tape, magnetic and optical disks, along with various other forms of solid-state mass storage devices. Thus it should be noted that the current invention applies to all forms and manners of memory devices including storage devices utilizing magnetic, optical, and chemical techniques, or any combination thereof. The data storage device interface 50 converts the input data from the storage device format to a format useful for data decompression.

The storage device data interface 50 is operatively connected to the data retrieval accelerator 80 which is utilized for decoding the stored (compressed) data, thus providing accelerated retrieval of stored data. In this embodiment, the data retrieval accelerator 80 comprises an input buffer 55 which receives as input an uncompressed or compressed data stream comprising one or more data blocks. The data blocks may range in size from individual bits through complete files or collections of multiple files. Additionally, the data block size may be fixed or variable. The input data buffer 55 is preferably included (not required) to provide storage of input data for various hardware implementations. A descriptor extraction module 60 receives the buffered (or unbuffered) input data block and then parses, lexically, syntactically, or otherwise analyzes the input data block using methods known by those skilled in the art to extract the data compression type descriptor associated with the data block. The data compression type descriptor may possess values corresponding to null (no encoding applied), a single applied encoding technique, or multiple encoding techniques applied in a specific or random order (in accordance with the data compression system embodiments and methods discussed above).

A decoder module 65 includes one or more decoders D1 . . . Dn for decoding the input data block using a decoder, set of decoders, or a sequential set of decoders corresponding to the extracted compression type descriptor. The decoders D1 . . . Dn may include those lossless encoding techniques currently well known within the art, including: run length, Huffman, Lempel-Ziv Dictionary Compression, arithmetic coding, data compaction, and data null suppression. Decoding techniques are selected based upon their ability to effectively decode the various different types of encoded input data generated by the data compression systems described above or originating from any other desired source.

As with the data compression systems discussed in U.S. application Ser. No. 09/210,491, the decoder module 65 may include multiple decoders of the same type applied in parallel so as to reduce the data decoding time. The data retrieval accelerator 80 also includes an output data buffer or cache 70 for buffering the decoded data block output from the decoder module 65. The output buffer 70 then provides data to the output data stream. It is to be appreciated by those skilled in the art that the data retrieval accelerator 80 may also include an input data counter and output data counter operatively coupled to the input and output, respectively, of the decoder module 65. In this manner, the compressed and corresponding decompressed data block may be counted to ensure that sufficient decompression is obtained for the input data block.

Again, it is to be understood that the embodiment of the data retrieval accelerator 80 of FIG. 9 is exemplary of a preferred decompression system and method which may be implemented in the present invention, and that other data decompression systems and methods known to those skilled in the art may be employed for providing accelerated data retrieval in accordance with the teachings herein.

Figure 10:
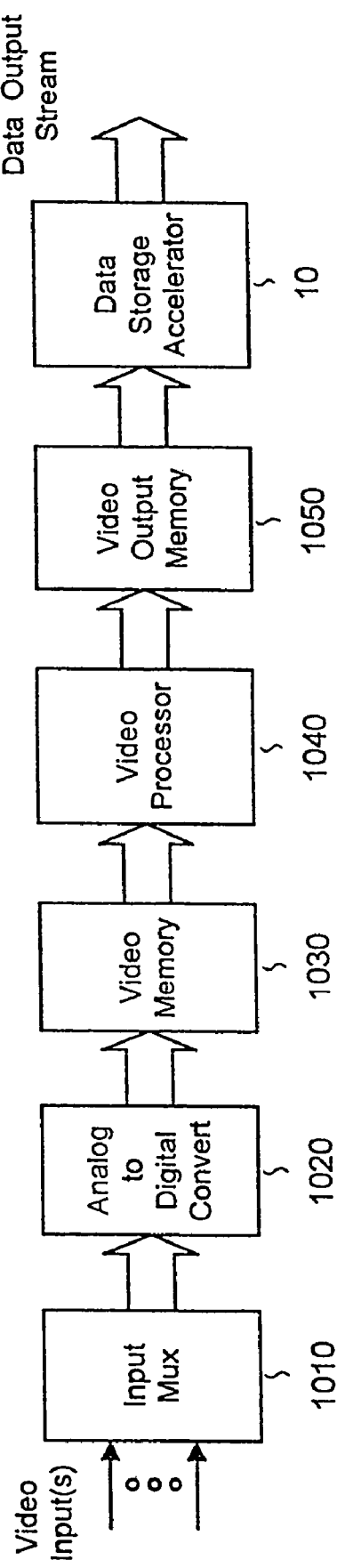
FIG. 10 is a block diagram of a system for accelerated video storage according to one embodiment of the present invention.

In accordance with another aspect of the present invention, the data storage and retrieval accelerator system and method may be employed in for increasing the storage rate of video data. In particular, referring now to FIG. 10, a block diagram illustrates a system for providing accelerated video data storage in accordance with one embodiment of the present invention. The video data storage acceleration system accepts as input one or more video data streams that are analog, digital, or any combination thereof in nature. The input multiplexer 1010 selects the initial video data stream for data compression and acceleration. The input multiplexer 1010 is operatively connected to an A/D converter 1020 which converts analog video inputs to digital format of desired resolution. The A/D converter 1020 may also include functions to strip video data synchronization to perform other data formatting functions. It should be noted that the analog-to-digital conversion process is not required for digital video inputs. The A/D converter 1020 is operatively connected a video memory 1030 that is, in turn, operatively connected to a video processor 1040. The video processor 1040 performs manipulation of the digital video data in accordance with any user desired processing functions. The video processor 1040 is operatively coupled to a video output memory 1050, that is operatively connected to a data storage accelerator 10 which compresses the video data to provide accelerated video data to the output data stream for subsequent data processing, storage, or transmittal of the video data. This video data acceleration process is repeated for all data blocks in the input data stream. If more video data blocks are available in the input data stream, the video multiplexer selects the next block of video for accelerated processing. Again, it is to be understood that the data storage accelerator 10 may employ any lossless or lossy data compression system which is capable of compressing data at a rate suitable for providing accelerated video data storage in accordance with the teachings herein.

Figure 11:
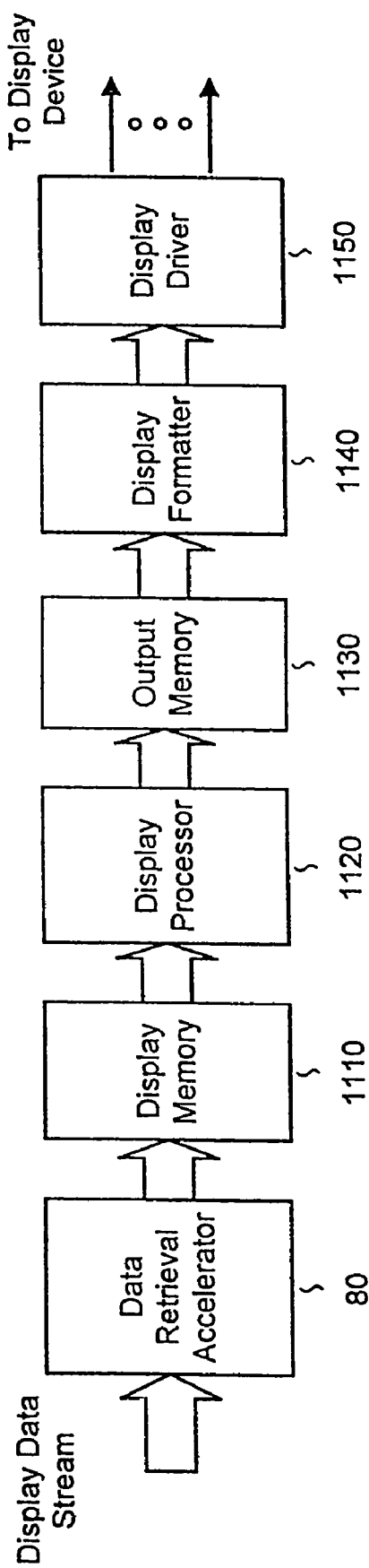
FIG. 11 is a block diagram of a system for accelerated retrieval of video data according to one embodiment of the present invention.

In accordance with another aspect of the present invention, the accelerated data storage and retrieval system may be employed in a display controller to reduce the time required to send display data to a display controller or processor. In particular, referring now to FIG. 11, a block diagram illustrates a display accelerator system in accordance with one embodiment of the present invention. The video display accelerator accepts as input one or more digital display data blocks from an input display data stream. It is to be understood that the system processes the input data stream in data blocks that may range in size from individual bits through complete files or collections of multiple files. Additionally, the input video data block size may be fixed or variable. The input data blocks are processed by a data retrieval accelerator 80 which employs lossless or lossy data decompression system in accordance with the teachings herein. Upon completion of data decompression, the decompressed data block is then output to a display memory 1110 that provides data to a display processor 1120. The display processor 1120 performs any user desired processing function. It is well known within the current art that display data is often provided in one or more symbolic formats such as Open Graphics Language (Open GL) or another display or image language. The display processor 1120 is operatively connected an output memory buffer 1130. The output memory 1130 supplies data to a display formatter 1140 that converts the data to a format compatible with the output display device or devices. Data from the display formatter 1140 is provided to the display driver 1150 that outputs data in appropriate format and drive signal levels to one or more display devices. It should be noted that the display memory 1110, display processor 1120, output memory 1130, display formatter 1140, and display driver 1150 are not required elements of the present invention.

Figure 12:
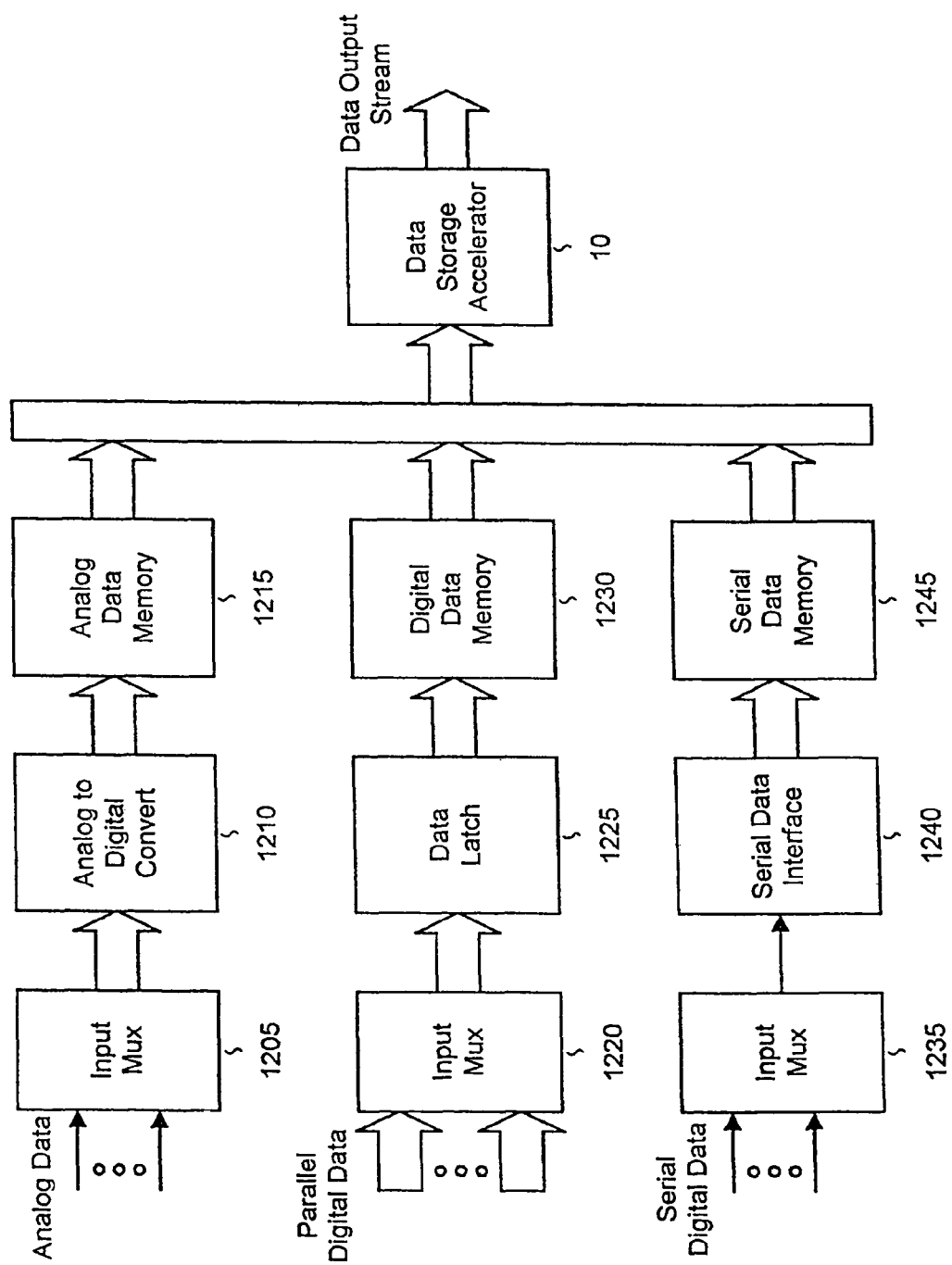
FIG. 12 is a block diagram of an input/output controller system for accelerated storage of analog, digital, and serial data according to one embodiment of the present invention.

In accordance with yet another aspect of the present invention, the data storage and retrieval accelerator system and method may be employed in an I/O controller to reduce the time for storing, retrieving or transmitting parallel data streams. In particular, referring now to FIG. 12, a block diagram illustrates a system for accelerated data storage of analog, digital, and serial data in accordance with one embodiment of the present invention. The data storage accelerator 10 is capable of accepting one or more simultaneous analog, parallel digital, and serial data inputs. An analog input multiplexer 1205 selects the initial analog data for data compression and acceleration. The analog input multiplexer 1205 is operatively connected to an A/D converter 1210 that converts the analog input signal to digital data of the desired resolution. The digitized data output of the A/D converter 1210 is stored in an analog data memory buffer 1215 for subsequent data storage acceleration. Similarly, a parallel digital data input multiplexer 1220 selects the initial parallel digital data for data compression and acceleration. The parallel digital data input multiplexer 1220 is operatively connected to an input data latch 1225 that holds the input parallel digital data. The parallel digital data is then stored in digital data memory buffer 1245 for subsequent data storage acceleration. In addition, a serial digital data input multiplexer 1235 selects the initial serial digital data for data compression and acceleration. The serial digital data input multiplexer 1235 is operatively connected to a serial data interface 1240 that converts the serial data stream to a format useful for data acceleration. The formatted serial digital data is then stored in serial data memory buffer 1245 for subsequent data acceleration. The analog data memory 1215, parallel digital data memory 1230, and serial data memory 1245 are operatively connected to the data storage accelerator device 10. Data is selected from each data memory subsystem based upon a user defined algorithm or other selection criteria. It should be noted that the analog input multiplexer 1205, A/D converter 1210, analog data memory 1215, parallel data input multiplexer 1220, data latch 1225, digital data memory 1230, serial data input multiplexer 1235, serial data interface 1240, serial data memory 1245, and counter 20 are not required elements of the present invention. As stated above, the data storage accelerator 10 employs any of the data compression methods disclosed in the above-incorporated U.S. Ser. No. 09/210,491, or any conventional lossless or lossy data compression method suitable for compressing data at a rate necessary for obtaining accelerated data storage. The data storage accelerator supplies accelerated data to the output data stream for subsequent data processing, storage, or transmittal.

Figure 13:
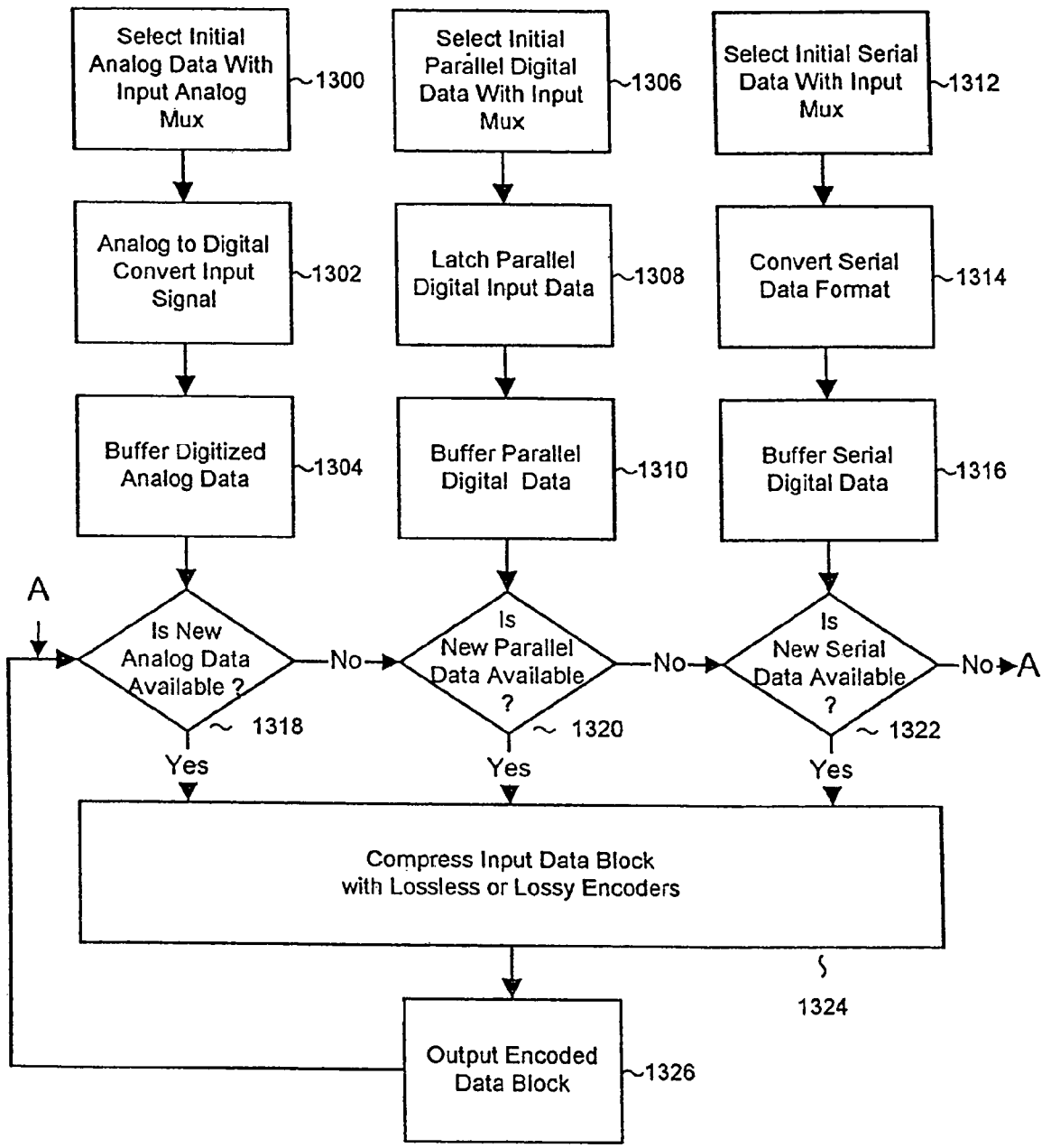
FIG. 13 is a flow diagram of a method for accelerated storage of analog, digital, and serial data according to one aspect of the present invention.

Referring now to FIG. 13, a flow diagram illustrates a method for accelerated data storage of analog, digital, and serial data according to one aspect of the present invention. The analog input multiplexer selects the initial analog data for data compression and acceleration (step 1300). The analog input multiplexer provides analog data to the A/D converter that converts the analog input signal to digital data of the desired resolution (step 1302). The digitized data output of the A/D converter is then buffered in the analog data memory buffer (step 1304) for subsequent data acceleration. Similarly, the parallel digital data multiplexer selects the initial parallel digital data for data compression and acceleration (step 1306). The parallel digital data multiplexer provides data to the input data latch that then holds the input parallel digital data (step 1308). The parallel digital data is then stored in digital data memory buffer for subsequent data acceleration (step 1310). The serial digital data input multiplexer selects the initial serial digital data for lossless or lossy data compression and acceleration (step 1312). The serial digital data input multiplexer provides serial data to the serial data interface that converts the serial data stream to a format useful for data acceleration (step 1314). The formatted serial digital data is then stored in the serial data memory buffer for subsequent data acceleration (step 1316). A test or other check is performed to see if new analog data is available (step 1318). If no new analog data is available a second check is performed to see if new parallel data is available (step 1320). If no new parallel data is available, a third test is performed to see if new serial data is available (step 1322). If no new serial data is available (step 1322) the test sequence repeats with the test for new analog data (step 1318). If new analog data block is available (step 1318), or if new parallel data block is available (step 1320), or if new serial data block is available (step 1322), the input data block is compressed by the data storage accelerator (step 1324) utilizing any lossless or lossy compression method suitable for providing accelerated data storage in accordance with the teachings herein. After data compression is complete, the compressed data block is then output subsequent accelerated data processing, storage, or transmittal (step 1326). After outputting data the process repeats beginning with a test for new analog data (return to step 1318).

Figure 14:
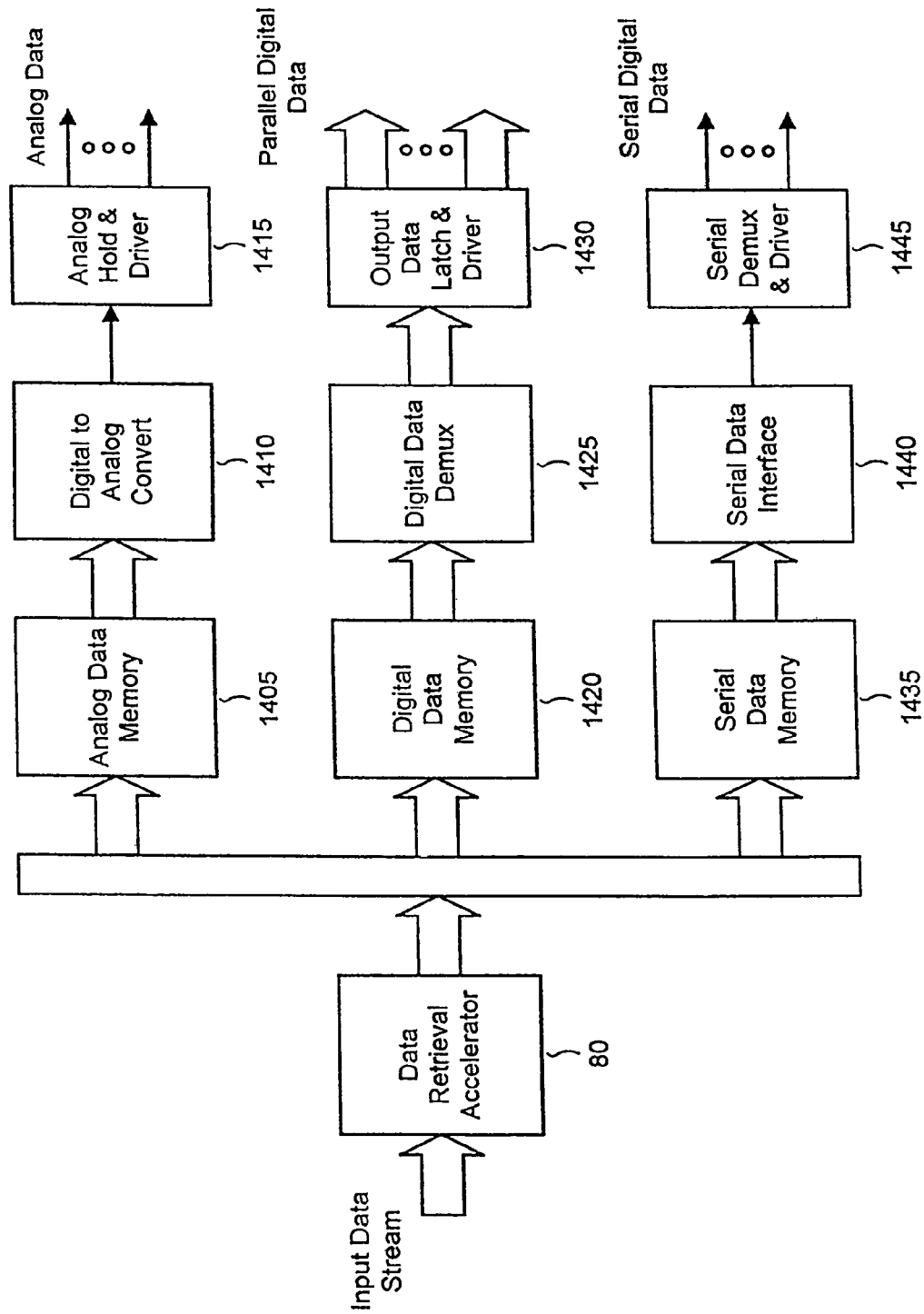
FIG. 14 is a block diagram of an input/output system for accelerated retrieval of analog, digital, and serial data according to one embodiment of the present invention.

Referring now to FIG. 14, a block diagram illustrates a system for accelerated retrieval of analog, digital, and serial data in accordance with one embodiment of the present invention. A data retrieval accelerator 80 receives data from an input data stream. It is to be understood that the system processes the input data stream in data blocks that may range in size from individual bits through complete files or collections of multiple files. Additionally, the input data block size may be fixed or variable. The data retrieval accelerator 80 decompresses the input data utilizing any of the lossless or lossy decompression methods suitable for providing accelerated data retrieval in accordance with the teachings herein. The data retrieval accelerator 80 is operatively connected to analog data memory 1405, digital data memory 1420, and serial data memory 1435. Dependent upon the type of input data block, the decoded data block is stored in the appropriate analog 1405, digital 1420, or serial 1435 data memory.

The analog data memory 1405 is operatively connected to a D/A converter 1410 that converts the decompressed digital data block into an analog signal. The D/A converter 1410 is further operatively connected to an analog hold and output driver 1415. The analog hold and output driver 1415 demultiplexes the analog signal output from the D/A converter 1410, samples and holds the analog data, and buffers the output analog data.

In a similar manner, the digital data memory 1420 is operatively connected to a digital data demultiplexer 1425 that routes the decompressed parallel digital data to the output data latch and driver 1430. The output latch and driver 1430 holds the digital data and buffers the parallel digital output.

Likewise, the serial data memory 1435 is operatively connected to a serial data interface 1440 that converts the decompressed data block to an output serial data stream. The serial data interface 1440 is further operatively connected to the serial demultiplexer and driver 1445 that routes the serial digital data to the appropriate output and buffers the serial data output.

Figure 15A:
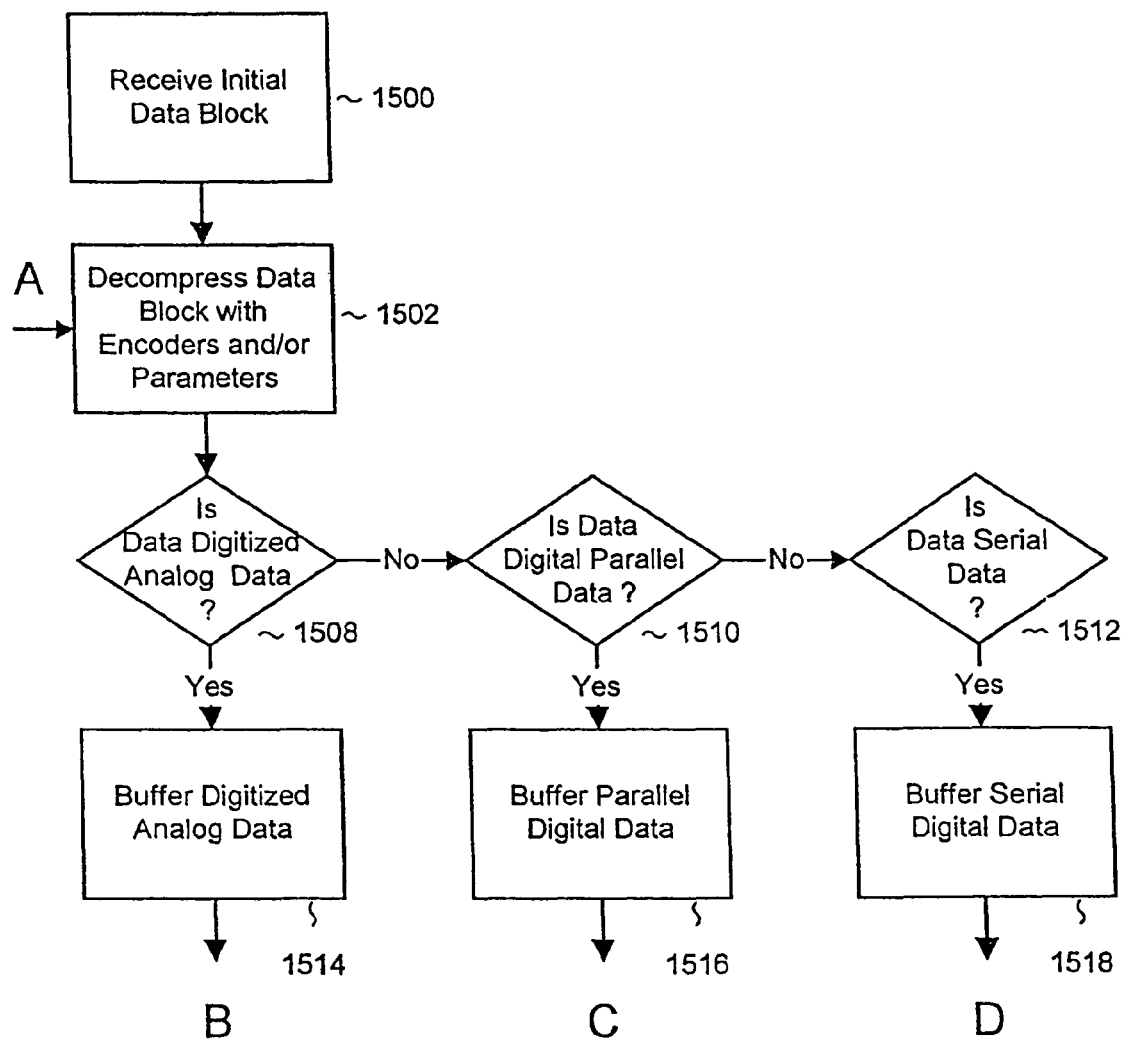
FIGS. 15a and 15b comprise a flow diagram of method for accelerated retrieval of analog, digital, and serial data according to one aspect of the present invention.
Figure 15B:
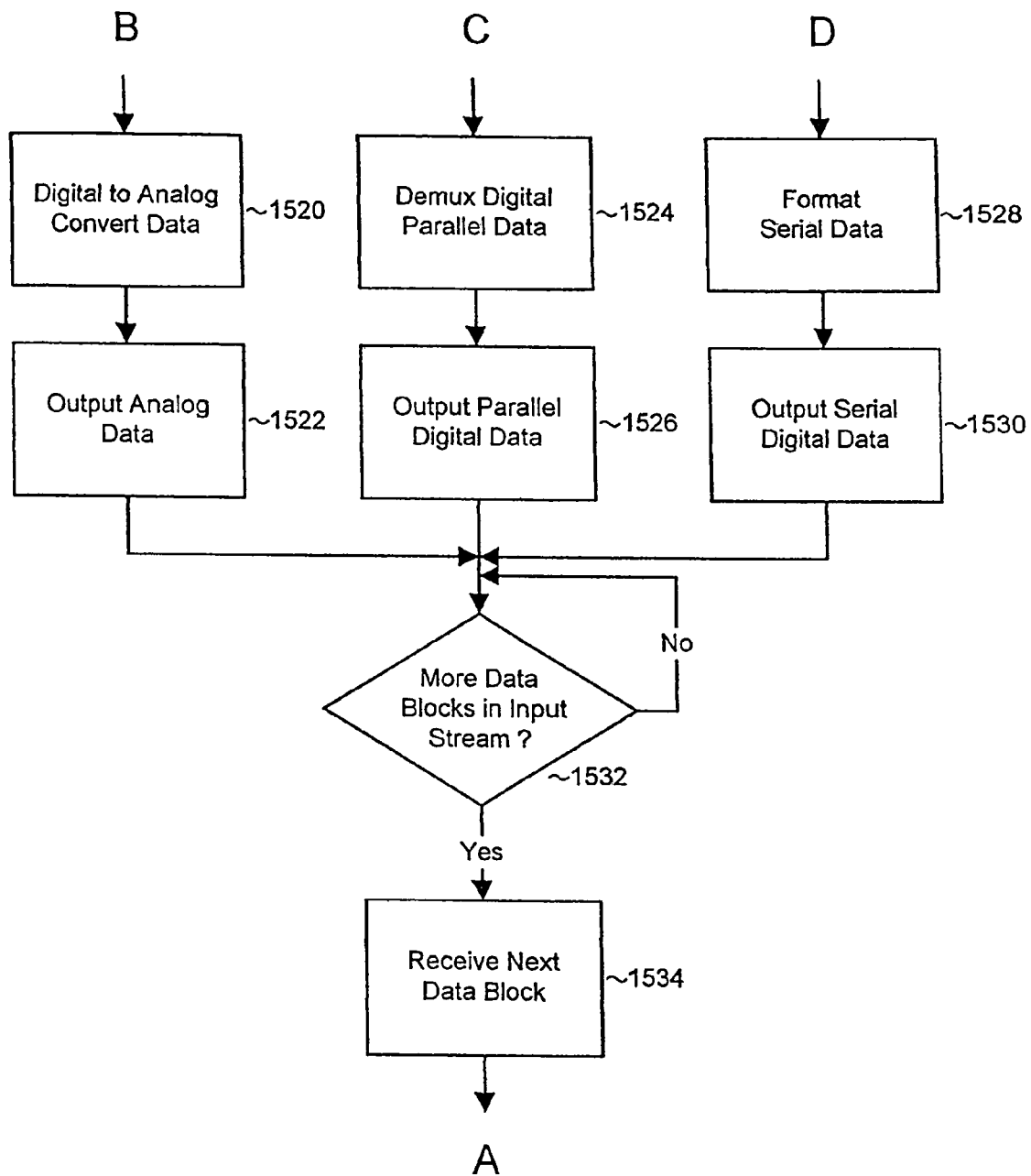

Referring now to FIGS. 15a and 15b, a flow diagram illustrates a method for accelerated retrieval of analog, digital, and serial data according to one aspect of the present invention. An initial data block is received (step 1500) and then decompressed by the data storage retrieval accelerator (step 1502) utilizing lossless or lossy data decompression (as discussed above, for example, with reference to FIGS. 7a and 7b). Upon completion of data decompression, a test or other check is performed to see if the data block is digitized analog data (step 1508). If the data block is not digitized analog data, a second check is performed to see if the data block is parallel digital data (step 1510). If the data block is not parallel digital data, a third test is performed to see if the data block serial data (step 1512). The result of at least one of the three tests will be affirmative.

If the data block is comprised of digitized analog data, the decoded data block is buffered in an "analog" digital data memory (step 1514). The decoded data block is then converted to an analog signal by a D/A converter (step 1520). The analog signal is then output (step 1522).

If the data block is comprised of parallel digital data, the decoded data block is buffered in a "parallel" digital data memory (step 1516). The decoded data block is then demultiplexed (step 1524) and routed to the appropriate output data latch and driver. The output latch and driver then holds the digital data and buffers the parallel digital output (step 1526).

If the data block is comprised of serial data, the decoded data block is buffered in "serial" digital data memory (step 1518). The decoded data is then formatted to a serial data format (step 1528). The serial data is then demultiplexed, routed to the appropriate output, and output to a buffer (step 1530).

Upon output of analog data (step 1522), parallel digital data (step 1526), or serial digital data (step 1530), a test or other form of check is performed for more data blocks in the input stream (step 1532). If no more data blocks are available, the test repeats (return to step 1532). If a data block is available, the next data block is received (step 1534) and the process repeats beginning with step 1502.

Although illustrative embodiments have been described herein with reference to the accompanying drawings, it is to be understood that the present invention is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A method comprising:
  receiving a data stream, having a plurality of data blocks, the data stream in a received form;
  selecting, for a data block in the plurality of data blocks, an encoder from a plurality of encoders based, at least in part, on a data parameter associated with the data stream, the data parameter indicating an amount of information loss permissible for the data stream;
  compressing using the selected encoder to provide a compressed data block for a compressed data stream, wherein said compressed data stream includes data compression type descriptors indicative of the type of compression utilized for each one of said plurality of data blocks that was compressed; and
  transmitting said compressed data stream over an output having an output bandwidth, wherein the combined length of time required for performing said compressing of said plurality of received data blocks and said transmitting said compressed data stream over said output is less than a length of time required for transmitting said received data stream, in uncompressed form, over said output.

2. The method of claim 1, wherein the selecting the compression technique comprises selecting a lossy compression technique based on the data parameter, and
  wherein the compressing comprises applying the lossy compression technique to determine the compressed data block, an amount of information loss between the compressed data block and the data block in received form not exceeding the amount of information loss indicated by the data parameter.

3. The method of claim 1, wherein the data parameter indicates that no information loss is permissible for the data stream and wherein the selecting the compression technique comprises selecting a lossless compression technique.

4. The method of claim 1, wherein at least one of said data compression type descriptors is indicative of compressing utilizing parallel encoders.

5. The method of claim 1, wherein at least one of said data compression type descriptors is indicative of compressing utilizing identical parallel encoders.

6. The method of claim 1, wherein at least one of said data compression type descriptors is indicative of compressing utilizing sequential encoders.

7. The method of claim 1, wherein at least one of said data compression type descriptors is indicative of using a plurality of encoders.

8. The method of claim 1, wherein at least one of said data compression type descriptors is indicative of using a single encoder.

9. The method of claim 1, further comprising;
  determining a compression ratio threshold based, at least in part on, the output bandwidth, and
  wherein the selecting the encoder further comprises selecting an encoder able to compress the data block such that (i) a compression ratio of the compressed data block relative to the data block in received form exceeds the compression ratio threshold and (ii) an amount of information loss between the data block in received form and the compressed data block does not exceed the permissible amount of information indicated by the data parameter.

10. A method comprising:
  receiving a data stream, having a plurality of data blocks, the data stream in a received form;
  selecting, for a data block in the plurality of data blocks, an encoder from a plurality of encoders based, at least in part, on a data parameter associated with the data stream, the data parameter indicating an amount of information loss permissible for the data stream;
  compressing using the selected encoder to provide a compressed data block for a compressed data stream, wherein said compressed data stream includes data compression type descriptors indicative of the type of compression utilized for each respective one of said plurality of data blocks that was compressed; and
  transmitting said compressed data stream over an output having a an output bandwidth,
  wherein the combined length of time required for performing said compressing said plurality of data blocks and said transmitting said compressed data stream over said output is less than a length of time required for transmitting said received data stream, in uncompressed form, over said output; and
  decompressing said data stream using a decoder selected based on said data compression type descriptors.

11. The method of claim 10, wherein the selecting the compression technique comprises selecting a lossy compression technique based on the data parameter, and
wherein the compressing comprises applying the lossy compression technique to determine the compressed data block, an amount of information loss between the compressed data block and the data block in received form not exceeding the amount of information loss indicated by the data parameter.

12. The method of claim 10, wherein the data parameter indicates that no information loss is permissible for the data stream and wherein the selecting the compression technique comprises selecting a lossless compression technique.

13. The method of claim 10, wherein at least one of said data compression type descriptors is indicative of compressing utilizing parallel encoders.

14. The method of claim 10, wherein at least one of said data compression type descriptors is indicative of compressing utilizing identical parallel encoders.

15. The method of claim 10, wherein at least one of said data compression type descriptors is indicative of compressing utilizing sequential encoders.

16. The method of claim 10, determining a compression ratio threshold based, at least in part on, the output bandwidth, and wherein the selecting the encoder further comprises selecting an encoder able to compress the data block such that (i) a compression ratio of the compressed data block relative to the data block in received form exceeds the compression ratio threshold and (ii) an amount of information loss between the data block in received form and the compressed data block exceeds the permissible amount of information indicated by the data parameter.

17. A computer-implemented method for accelerating data transmittal on an output to a data storage device, the output associated with an output transmission rate, comprising:
receiving a data stream comprising a plurality of data blocks, the data stream in a received form;
receiving a data parameter associated with the data stream that indicates an amount of information loss permissible for the data stream;
selecting, for a data block in the plurality of data blocks, a compression technique from a plurality of compression techniques based, at least in part, on the data parameter;
compressing the data block using the compression technique to determine a compressed data block; and
transmitting, on the output to the data storage device, the compressed data block in a compressed data stream to the data storage device, the compressing and the transmitting together occurring more quickly than a length of time to transmit the data block on the output in the received form.

18. The method of claim 17, wherein the selecting the compression technique comprises selecting a lossy compression technique based on the data parameter, and
wherein the compressing comprises applying the lossy compression technique to determine the compressed data block, an amount of information loss between the compressed data block and the data block in received form not exceeding the amount of information loss indicated by the data parameter.

19. The method of claim 18, wherein the data stream comprises video data and wherein the data parameter indicates a display resolution of a device to display the video, and
wherein the compressing comprises applying the lossy compression technique to remove video data in excess of the display resolution.

20. The method of claim 19, wherein the selecting the lossy compression technique based on the data parameter comprises:
looking up the data parameter in a table to determine the display resolution of the device to display the video; and
selecting the compression technique based on the display resolution.

21. The method of claim 18, wherein the data stream comprises audio data.

22. The method of claim 17, wherein the receiving the data parameter comprises receiving the data parameter in a header of the data stream.

23. The method of claim 17, further comprising determining a data type of the data block, and
wherein the selecting the compression technique comprises selecting the compression technique based, at least in part, on the data type.

24. The method of claim 17, wherein the selecting the compression technique comprises selecting the compression technique based, at least in part, on the output transmission rate.

25. The method of claim 24, further comprising:
determining a compression ratio threshold based, at least in part on, the output transmission rate, and
wherein selecting the compression technique further comprises selecting a compression technique able to compress the data block such that (i) a compression ratio of the compressed data block relative to the data block in received form exceeds the compression ratio threshold and (ii) an amount of information loss between the data block in received form and the compressed data block does not exceed the permissible amount of information indicated by the data parameter.

26. The method of claim 25, wherein the plurality of data blocks includes an additional data block, further comprising:
determining whether any compression techniques in the plurality of compression techniques meets a criteria, the criteria requiring that a compression technique be able to compress the additional data such that (i) a compression ratio of the compressed additional data block relative to the additional data block in received form exceeds the compression ratio threshold and (ii) an amount of information loss between the additional data block in received form and the compressed additional data block does not exceed the permissible amount of information indicated by the data parameter; and
when no compression technique in the plurality of compression techniques is determined to meet the criteria, reducing an input transmission rate of the data stream such that at least one of the compression techniques in the plurality of compression techniques meets the criteria.

27. The method of claim 26, wherein the reducing the input transmission rate comprises reducing a rate at which one or more blocks of the data stream are requested.

28. The method of claim 25, further comprising:
storing the plurality of data blocks in an input data buffer; and
counting a size of the plurality of input data blocks stored in the input data buffer,
wherein the determining the compression ratio threshold comprises determining the compression ratio threshold based, at least in part, on the counted size and the output transmission rate.

29. The method of claim 25, further comprising:
adjusting the compression ratio threshold according to a change in the output transmission rate.

30. The method of claim 17, further comprising:
prior to the transmitting the compressed data block in a compressed data stream, temporarily storing the compressed block with the compressed data stream on an output buffer.

31. The method of claim 17, wherein the compressing comprises providing program instructions stored in memory to a processor, the program instructions specifying execution of the compression technique.

32. A program storage device readable by a central processing unit, tangibly embodying a program of instructions executable by the central processing unit to perform method steps for accelerating data transmittal on an output to a data storage device, the output associated with an output transmission rate, said method steps comprising:
receiving a data stream comprising a plurality of data blocks, the data stream in a received form;
receiving a data parameter that indicates an amount of information loss permissible for the data stream;
selecting a compression technique for a data block from a plurality of compression techniques based, at least in part, on the data parameter;
compressing the data block using the compression technique to determine a compressed data block; and
outputting for transmission, on the output to the data storage device, the compressed data block in a compressed data stream to the data storage device, the compressing and the transmission together occurring more quickly than a length of time to transmit the data block on the output in the received form.

33. The program storage device of claim 32, wherein the selecting the compression technique comprises selecting a lossy compression technique based on the data parameter, and
wherein the compressing comprises applying the lossy compression technique to determine the compressed data block, an amount of information loss between the compressed data block and the data block in received form not exceeding the amount of information loss indicated by the data parameter.

34. The program storage device of claim 33, wherein the data stream comprises video data and wherein the data parameter indicates a display resolution of a device to display the video, and
wherein the compressing comprises applying the lossy compression technique to remove video data in excess of the display resolution.

35. The program storage device of claim 32, wherein the selecting the lossy compression technique based on the data parameter comprises:
looking up the data parameter in a table to determine the display resolution of the device to display the video; and
selecting the compression technique based on the display resolution.

36. The program storage device of claim 33, wherein the data stream comprises audio data.

37. The program storage device of claim 32, wherein the receiving the data parameter comprises receiving the data parameter in a header of the data stream.

38. The program storage device of claim 32, said method steps further comprising determining a data type of the data block, and
wherein the selecting the compression technique comprises selecting the compression technique based, at least in part, on the data type.

39. The program storage device of claim 32, wherein the selecting the compression technique comprises selecting the compression technique based, at least in part, on the output transmission rate.

40. The program storage device of claim 39, said method steps further comprising:
determining a compression ratio threshold as a ratio based, at least in part, on the output transmission rate, and
wherein selecting the compression technique further comprises selecting a compression technique able to compress the data block such that (i) a compression ratio of the compressed data block relative to the data block in received form exceeds the compression ratio threshold and (ii) an amount of information loss between the data block in received form and the compressed data block does not exceed the permissible amount of information indicated by the data parameter.

41. The program storage device of claim 40, wherein the plurality of data blocks includes an additional data block, said method steps further comprising:
determining whether any compression techniques in the plurality of compression techniques meets a criteria, the criteria requiring that a compression technique be able to compress the additional data such that (i) a compression ratio of the compressed additional data block relative to the additional data block in received form exceeds the compression ratio threshold and (ii) an amount of information loss between the additional data block in received form and the compressed additional data block does not exceed the permissible amount of information indicated by the data parameter; and
when no compression technique in the plurality of compression techniques is determined to meet the criteria, reducing an input transmission rate of the data stream such that at least one of the compression techniques in the plurality of compression techniques meets the criteria.

42. The program storage device of claim 41, wherein the reducing the input transmission rate comprises reducing a rate at which one or more blocks of the data stream are requested.

43. The program storage device of claim 42, said method further comprising:
storing the plurality of data blocks in an input data buffer; and
counting a size of the plurality of input data blocks stored in the input data buffer,
wherein the determining the compression ratio threshold comprises determining the compression ratio threshold based, at least in part, on the counted size and the output transmission rate.

44. The program storage device of claim 42, said method further comprising:
adjusting the compression ratio threshold according to a change in the output transmission rate.

45. A computer program product, comprising at least one non-transitory storage device readable by a computer, the at least one non-transitory computer readable storage device having embodied thereon computer readable program code for accelerating data transmittal, the computer readable program code comprising:
a first computer readable program code for causing the computer to receive a data stream comprising a plurality of data blocks, the data stream in a received form;

a second computer readable program code for causing the computer to receive a data parameter that indicates an amount of information loss permissible for the data stream;

a third computer readable program code for causing the computer to select a compression technique for a data block from a plurality of compression techniques based, at least in part, on the data parameter;

a fourth computer readable program code for causing the computer to compress the data block using the compression technique to determine a compressed data block; and a fifth computer readable program code for causing the computer to transmit, on the output to the data storage device, the compressed data block in a compressed data stream to the data storage device, the compressing and the transmitting together occurring more quickly than a length of time to transmit the data block on the output in the received form.

46. A device for accelerating data transmittal on an output to a data storage device, the output associated with an output transmission rate, comprising:

an input buffer capable of receiving a data stream comprising a plurality of data blocks, the data stream in a received form and temporarily storing the plurality of data blocks;

a data accelerator capable of:
  (i) receiving a data parameter that indicates an amount of information loss permissible for the data stream;
  (ii) selecting, for a data block, a compression technique from a plurality of compression techniques based, at least in part, on the data parameter;
  (iii) compressing the data block using the compression technique to determine a compressed data block; and
  (iv) transmitting, on the output to the data storage device, the compressed data block in a compressed data stream to the data storage device, the compressing and the transmitting together occurring more quickly than a length of time to transmit the data block on the output in the received form.

\* \* \* \* \*